US006919256B2

(12) United States Patent
Inoue et al.

(10) Patent No.: US 6,919,256 B2

(45) Date of Patent: Jul. 19, 2005

(54) METHOD OF MANUFACTURING SEMICONDUCTOR DEVICE HAVING MIM CAPACITOR

(75) Inventors: Kouta Inoue, Tokyo (JP); Tatsuo Kasaoka, Tokyo (JP); Hiroki Shinkawata, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/661,615

(22) Filed: Sep. 15, 2003

(65) Prior Publication Data

US 2004/0147084 A1 Jul. 29, 2004

(30) Foreign Application Priority Data

Jan. 24, 2003 (JP) ....................................... 2003-015918

(51) Int. Cl.[7] ................................................ H01L 21/20

(52) U.S. Cl. ........................ 438/387; 438/386; 438/396

(58) Field of Search ................................ 438/381, 386, 438/387, 393, 396

(56) References Cited

U.S. PATENT DOCUMENTS 5,834,357 A 11/1998 Kang
6,174,781 B1 * 1/2001 Dai et al. .................. 438/396
6,320,244 B1 * 11/2001 Alers et al. ................ 257/534

FOREIGN PATENT DOCUMENTS

| | | |
|---|---|---|
| JP | 8-167702 | 6/1996 |
| JP | 2000-101047 | 4/2000 |
| JP | 2001-144266 | 5/2001 |

* cited by examiner

*Primary Examiner*—Michael Lebentritt
*Assistant Examiner*—Scott B. Geyer
(74) *Attorney, Agent, or Firm*—Oblon, Spivak, McClelland, Maier & Neustadt, P.C.

(57) ABSTRACT

A first metal film, a first interlayer insulating film, a second metal film, and a second interlayer insulating film are deposited in this order over a silicon nitride film. An opening penetrating the first and second interlayer insulating films and the first and second metal films is created, whereby a contact metal, to hold a to-be-formed lower electrode thereon, is exposed. A metal film is provided to cover the second interlayer insulating film. The opening is filled with the metal film. A main part and the uppermost fin (namely, the fin farthest from a substrate) of a lower electrode, are formed by the same process.

2 Claims, 98 Drawing Sheets

F I G . 1
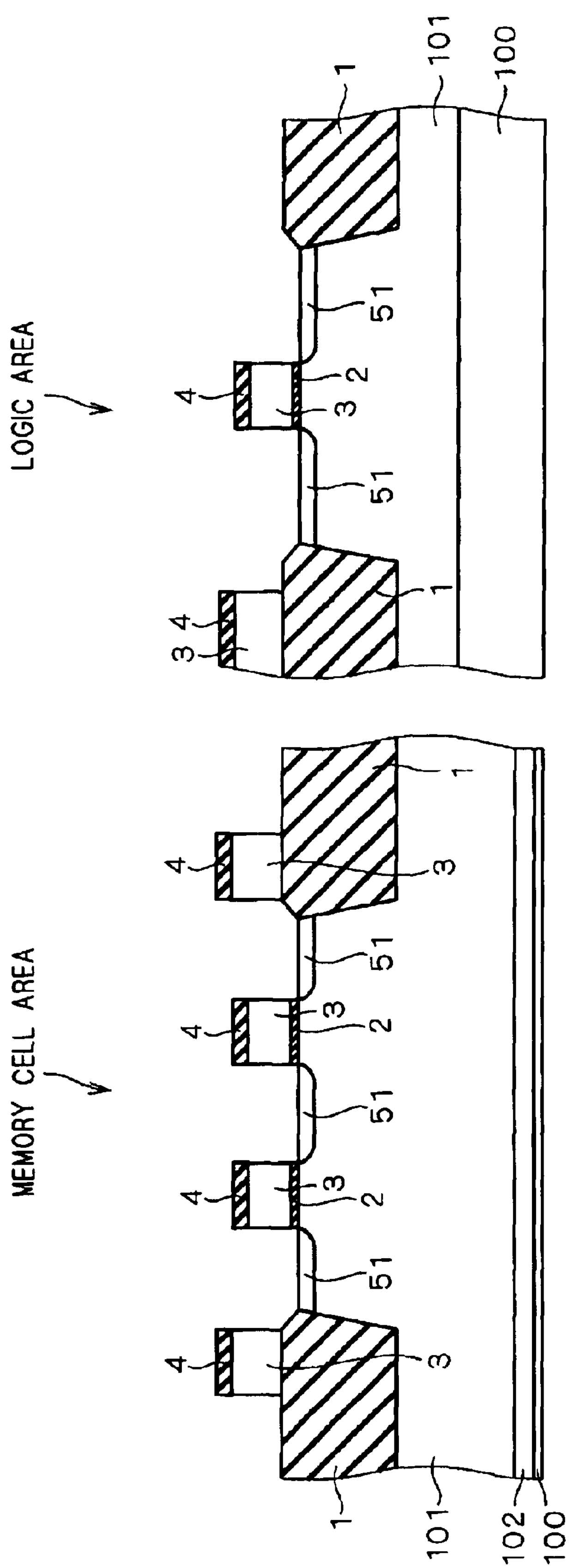

F I G . 3
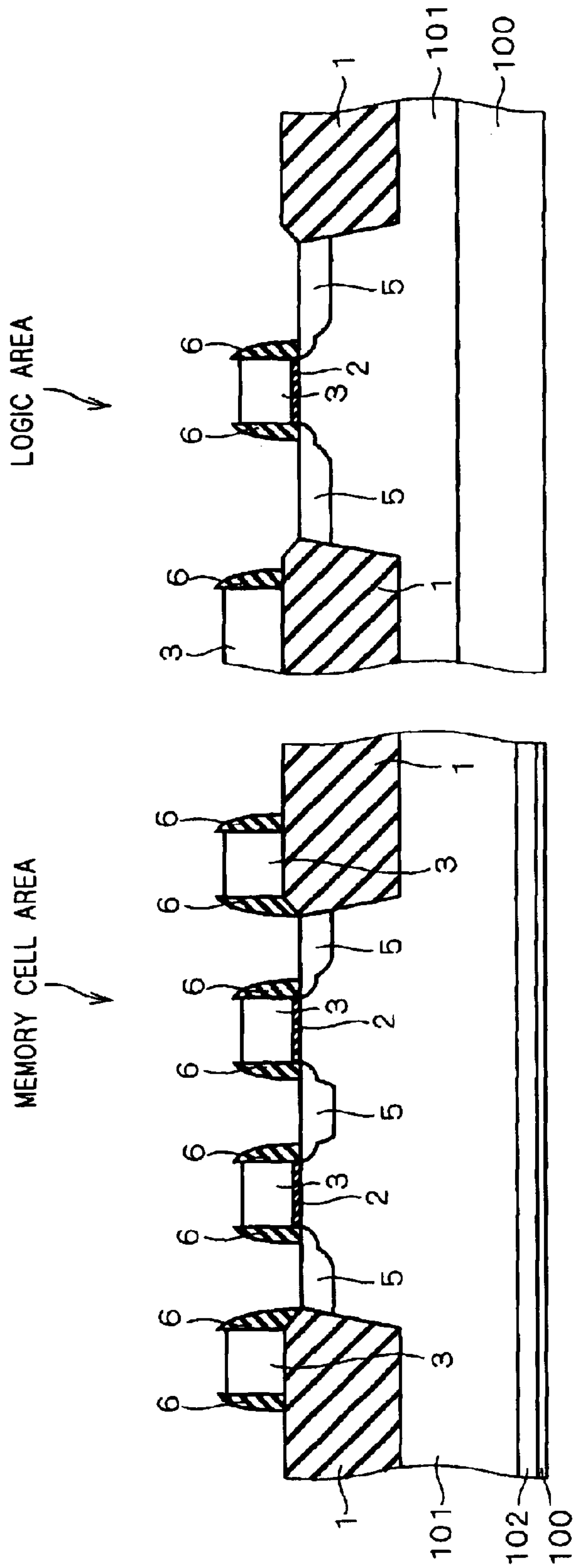

F I G . 4
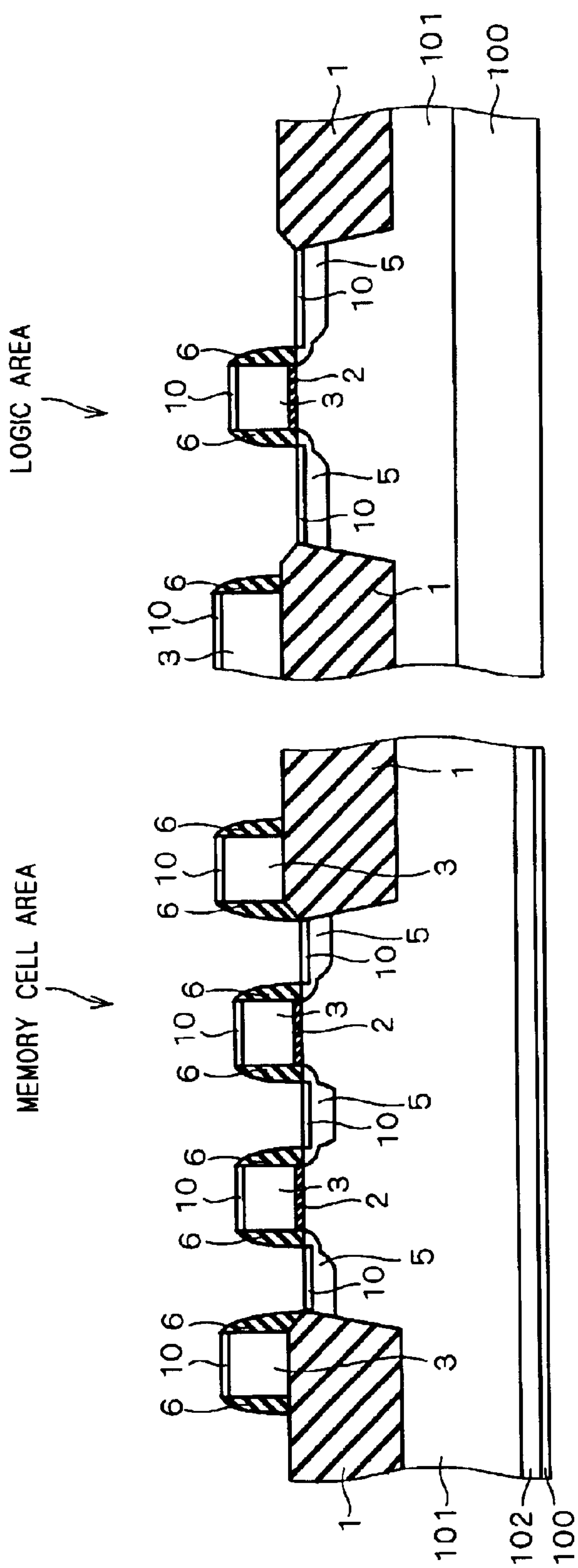

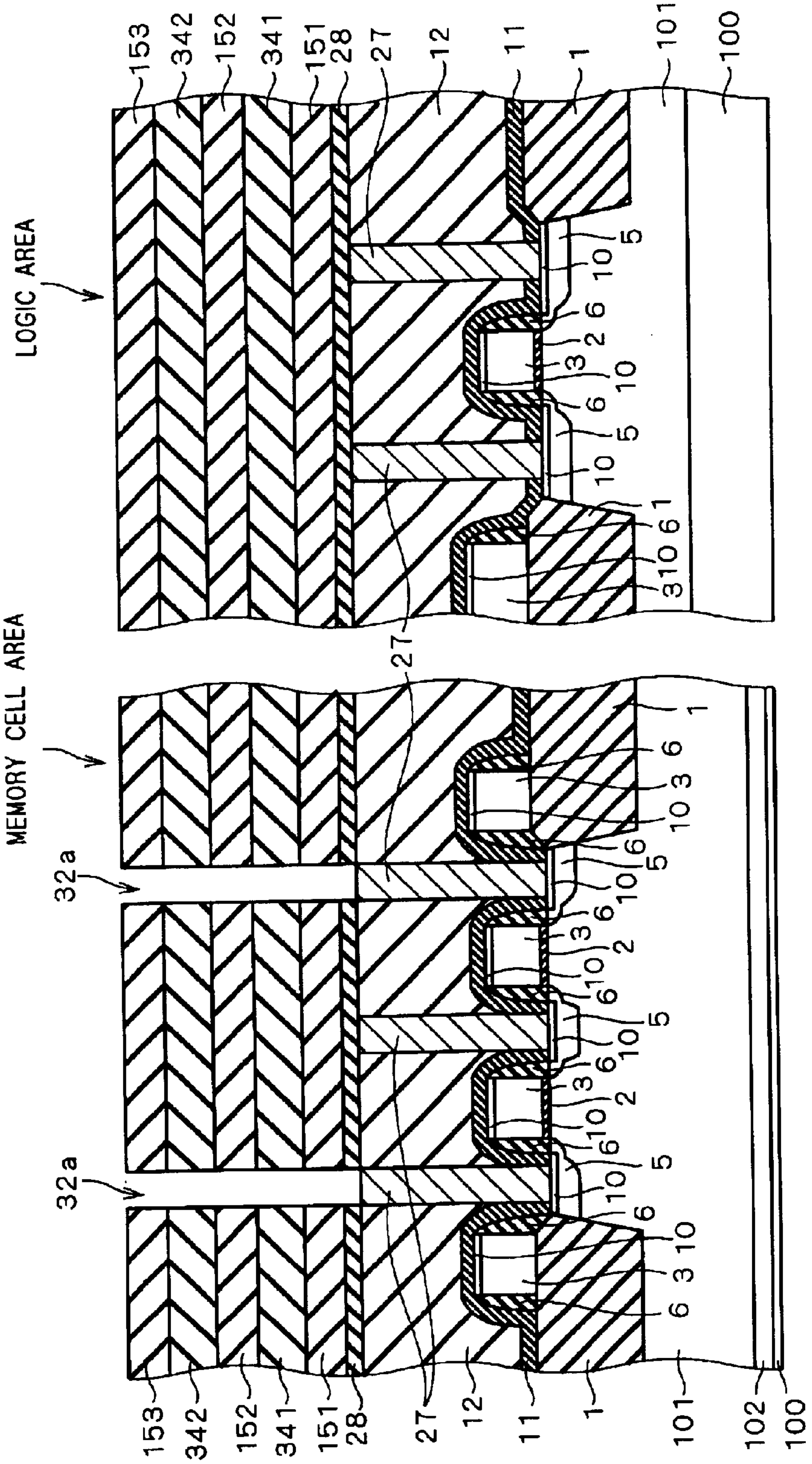
F I G . 1 5

F I G . 2 2
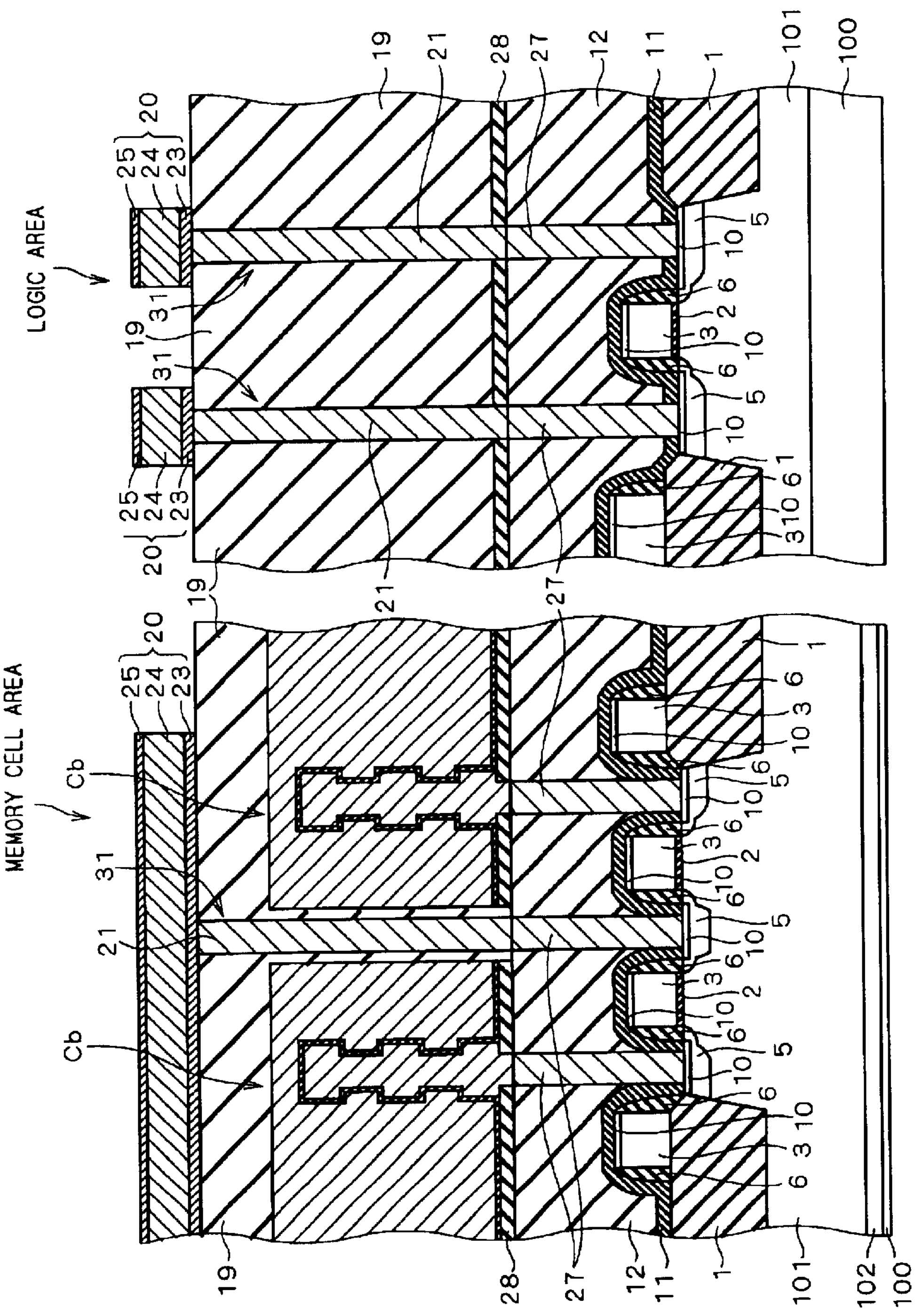

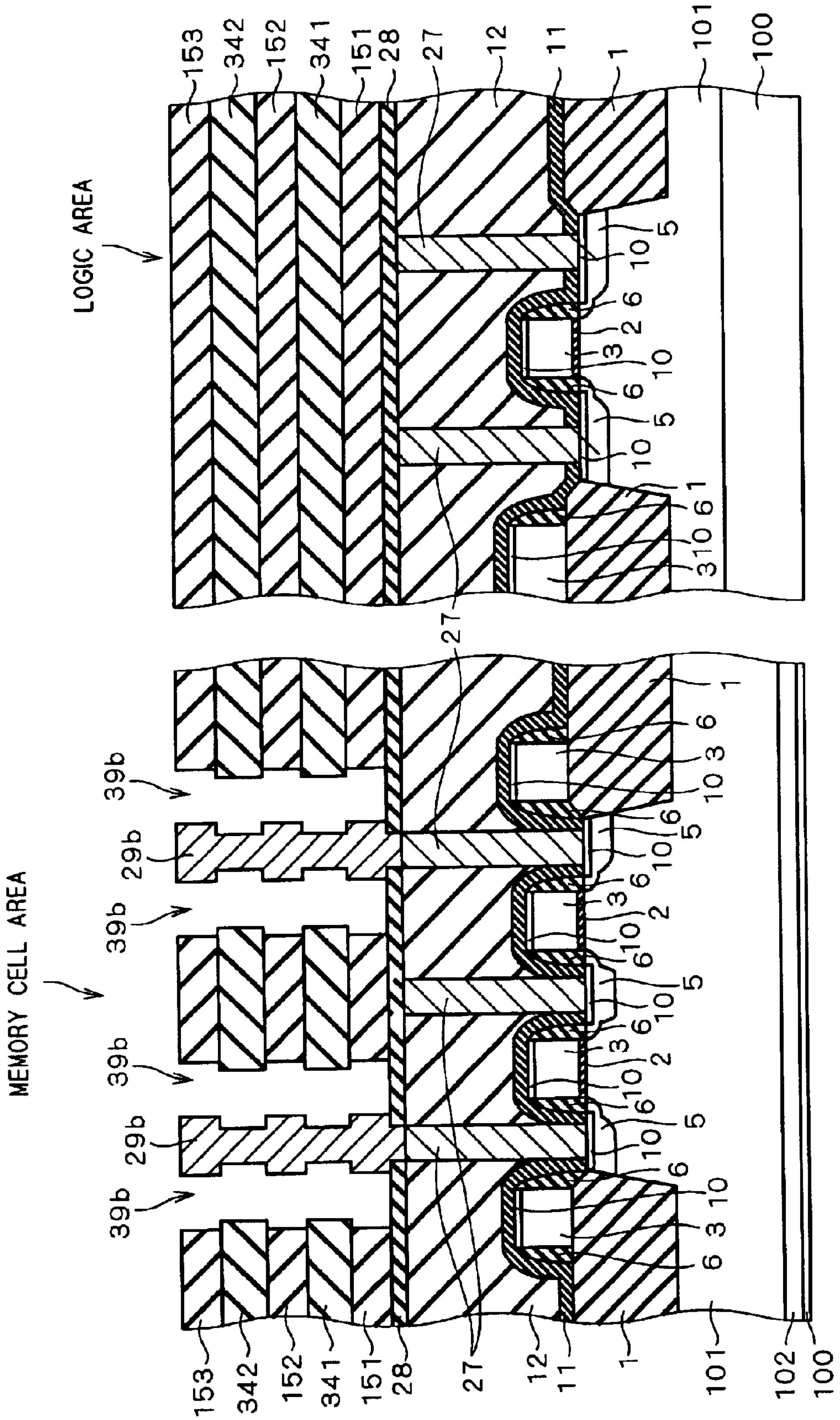
F I G . 2 4

F I G . 4 1
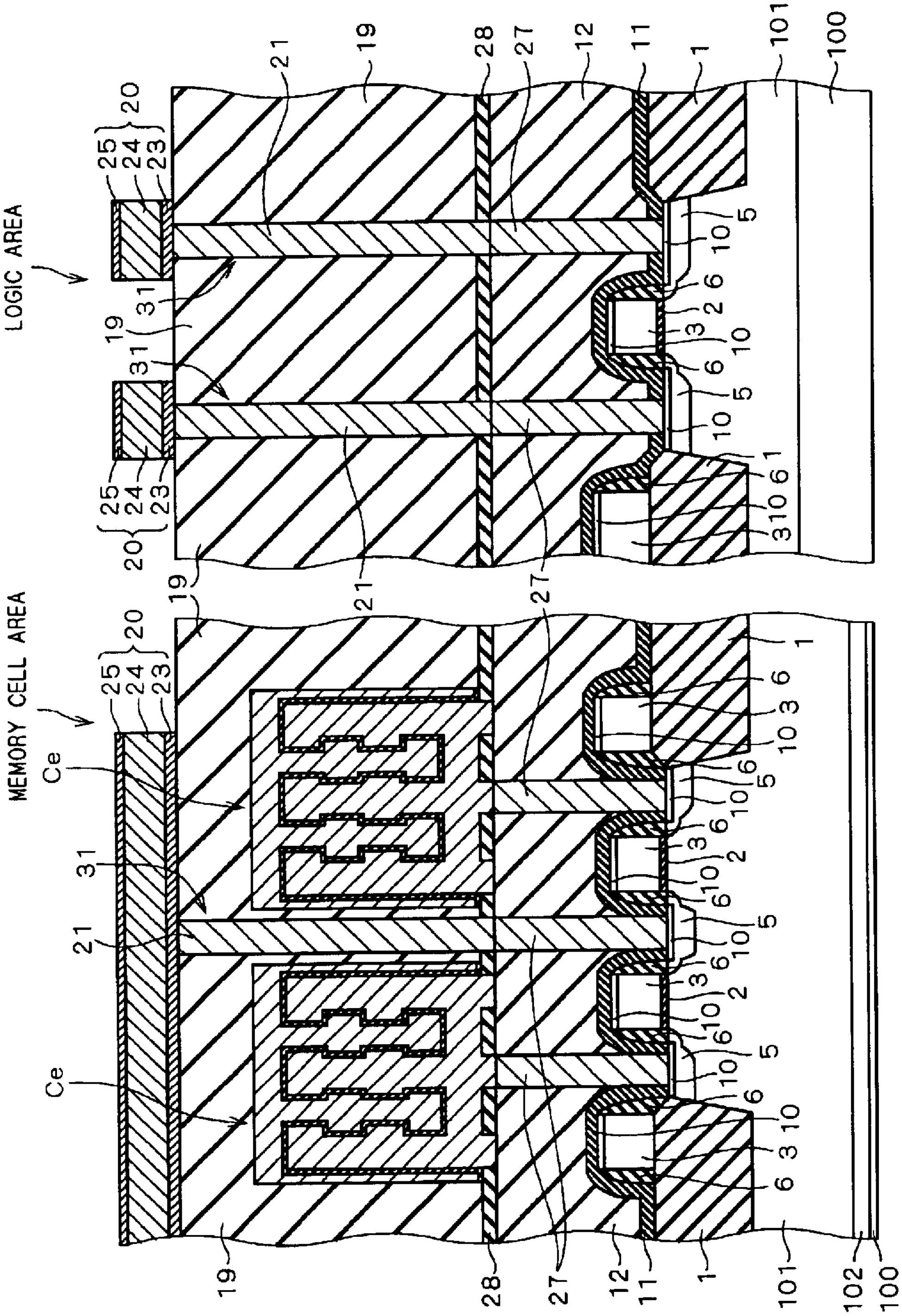

F I G . 4 7
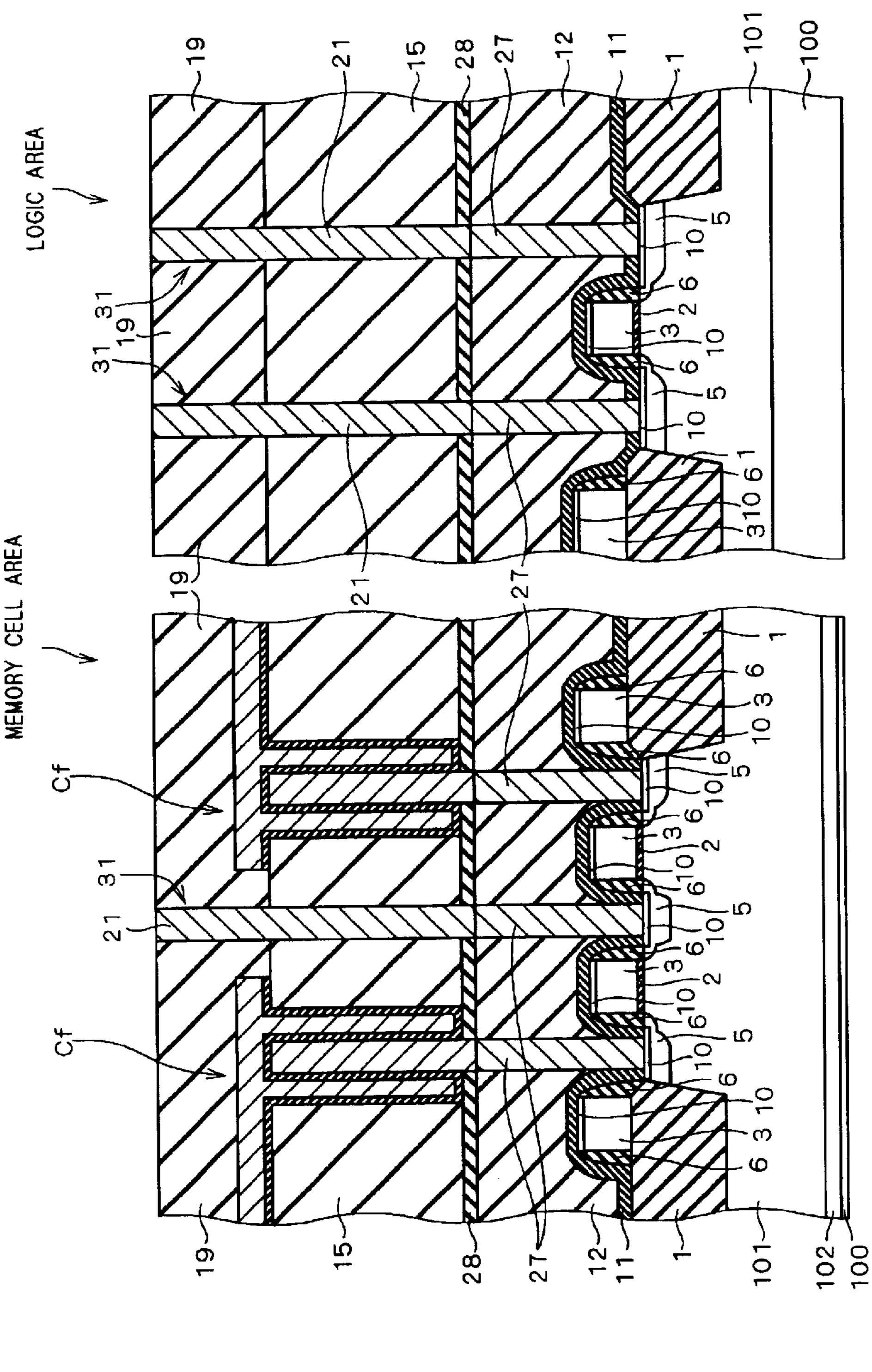

F I G . 6 1
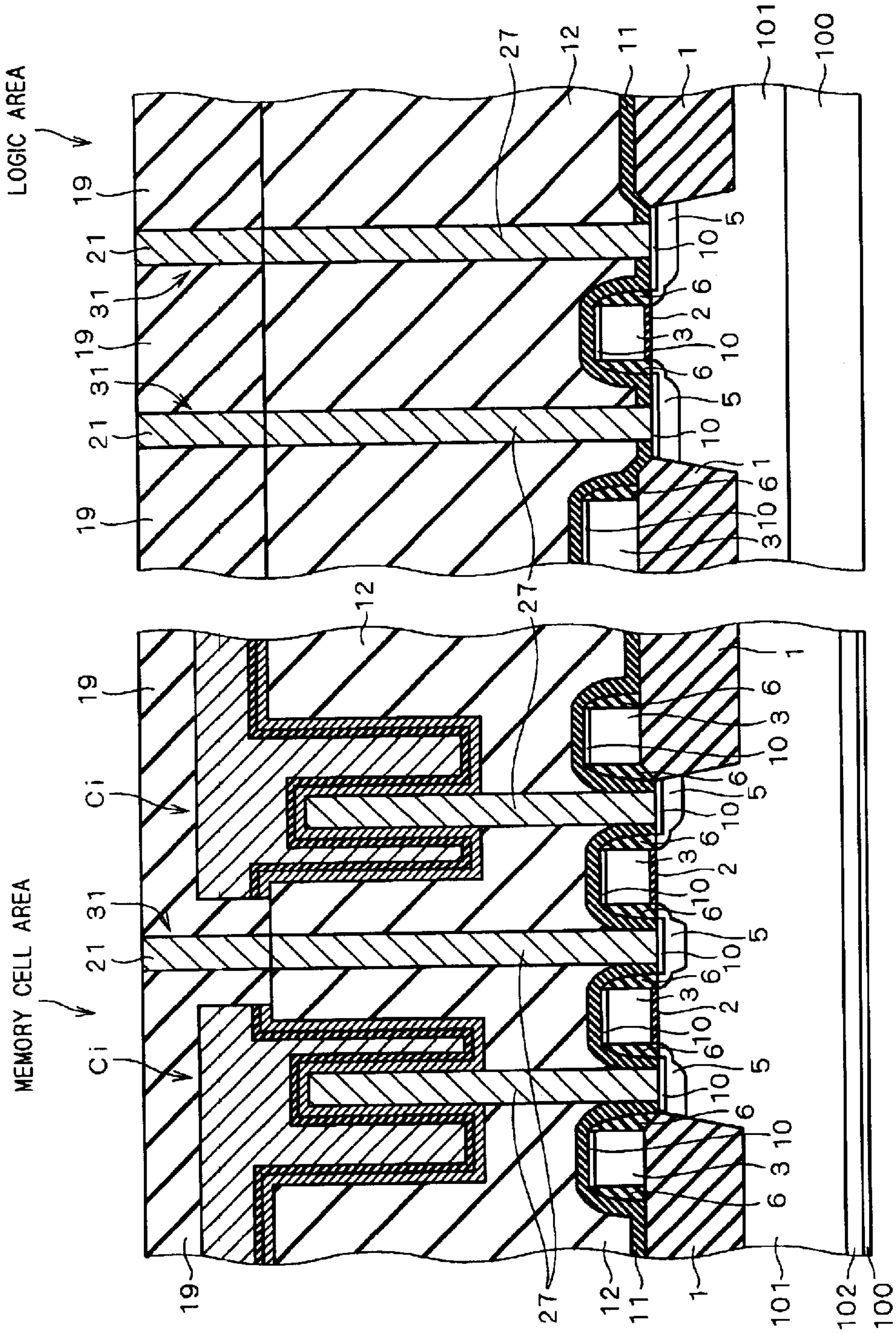

F I G . 6 6
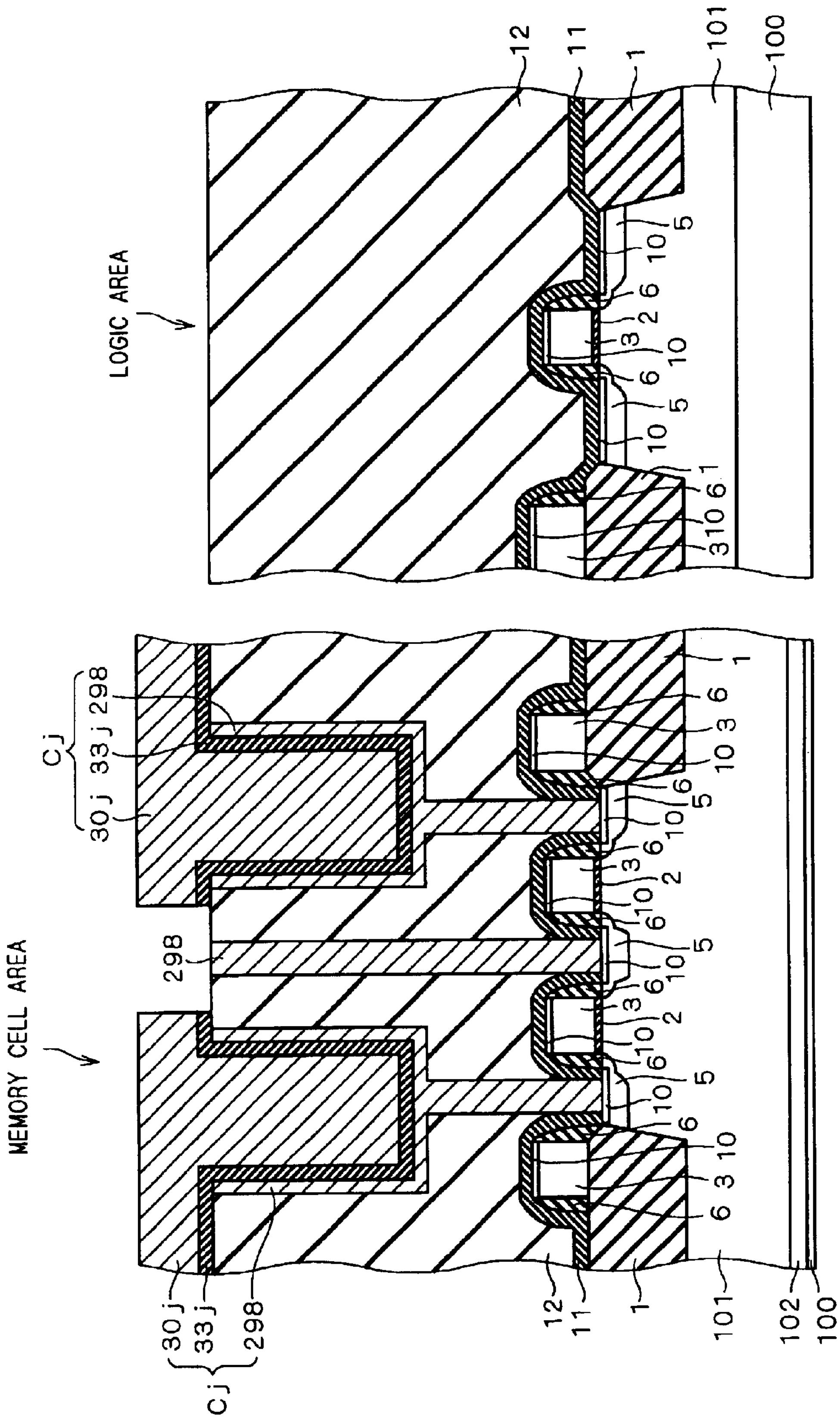

F I G . 7 0
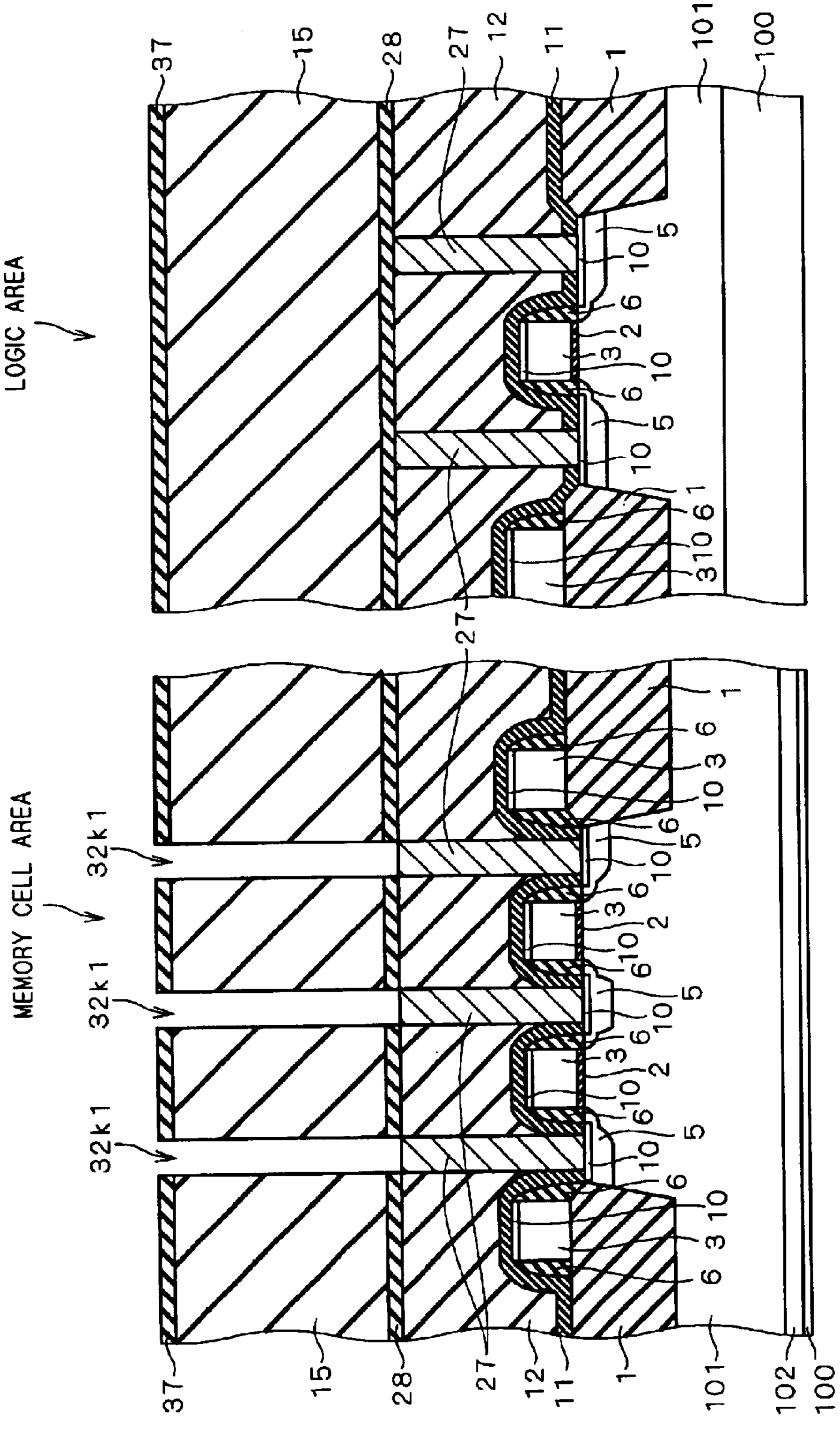

F I G . 7 4
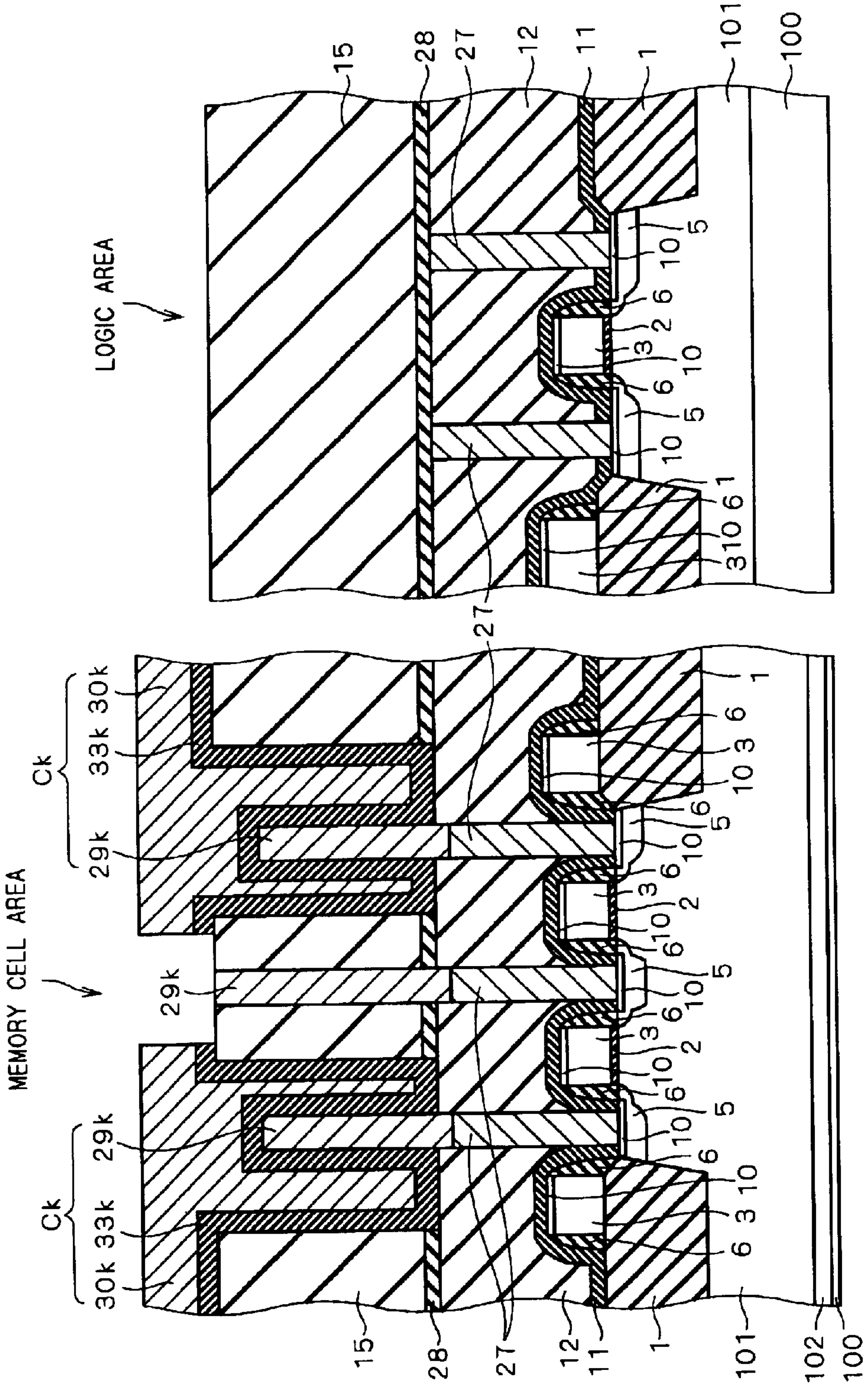

F I G . 7 5
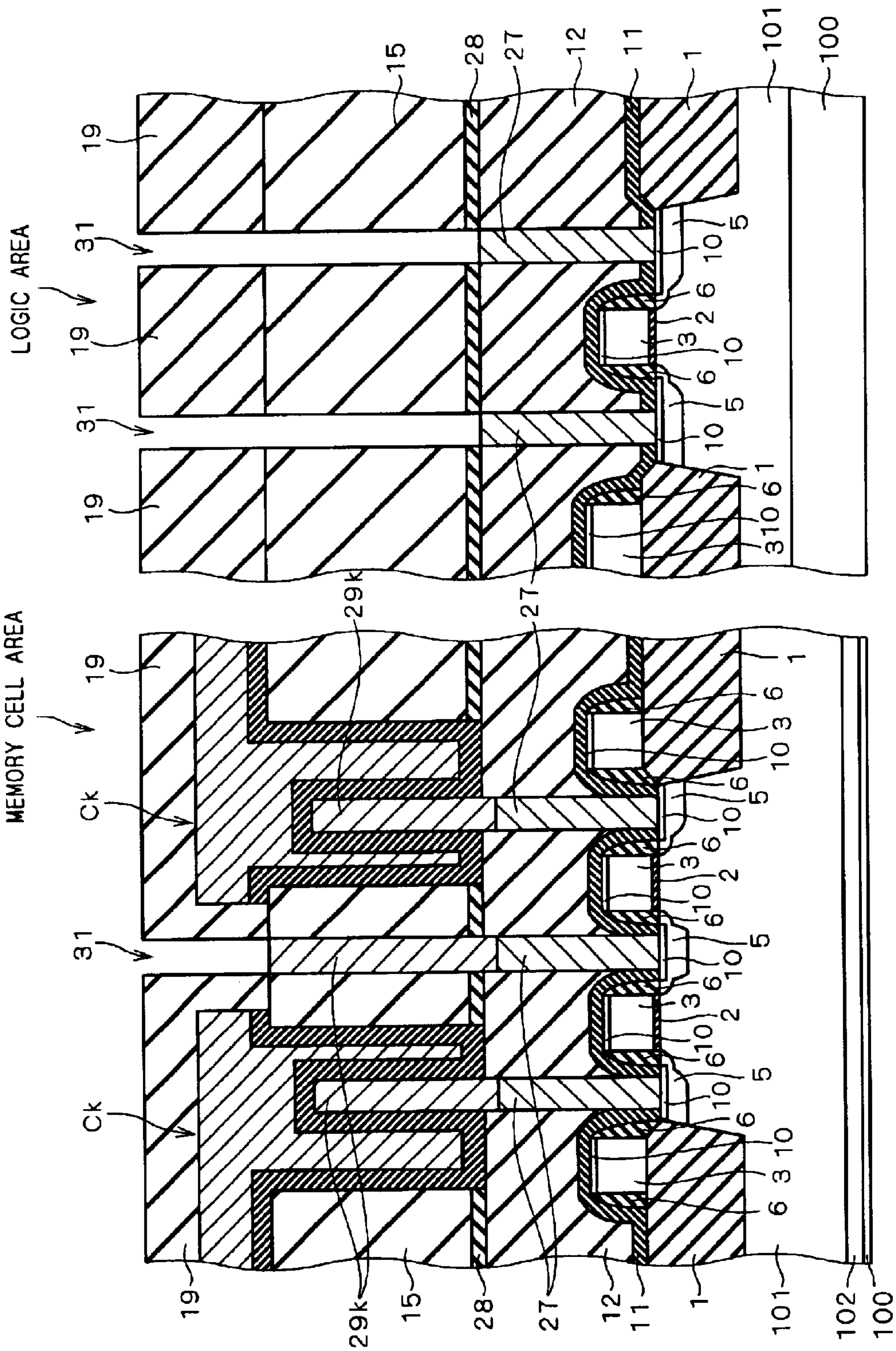

F I G . 7 6
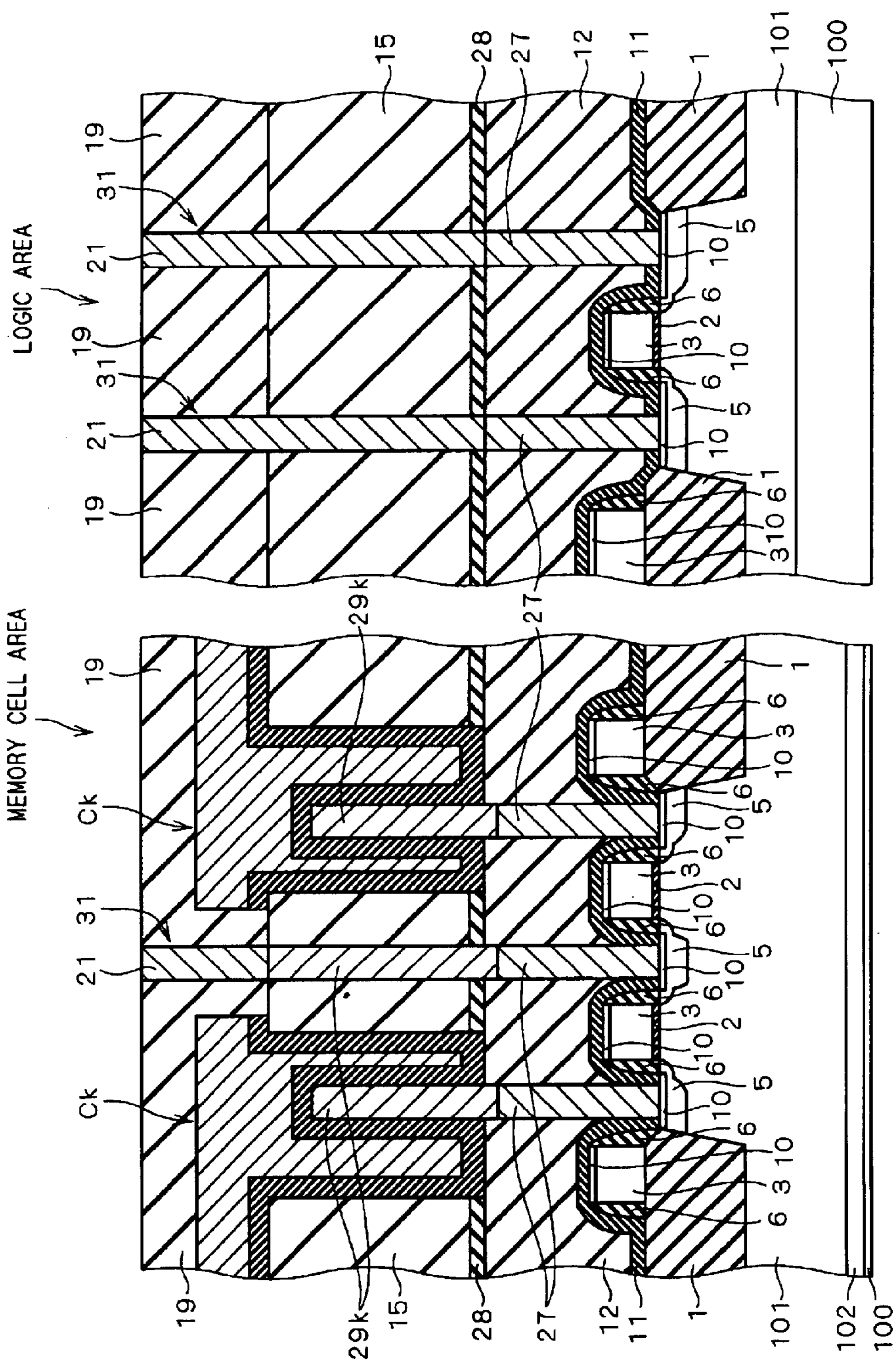

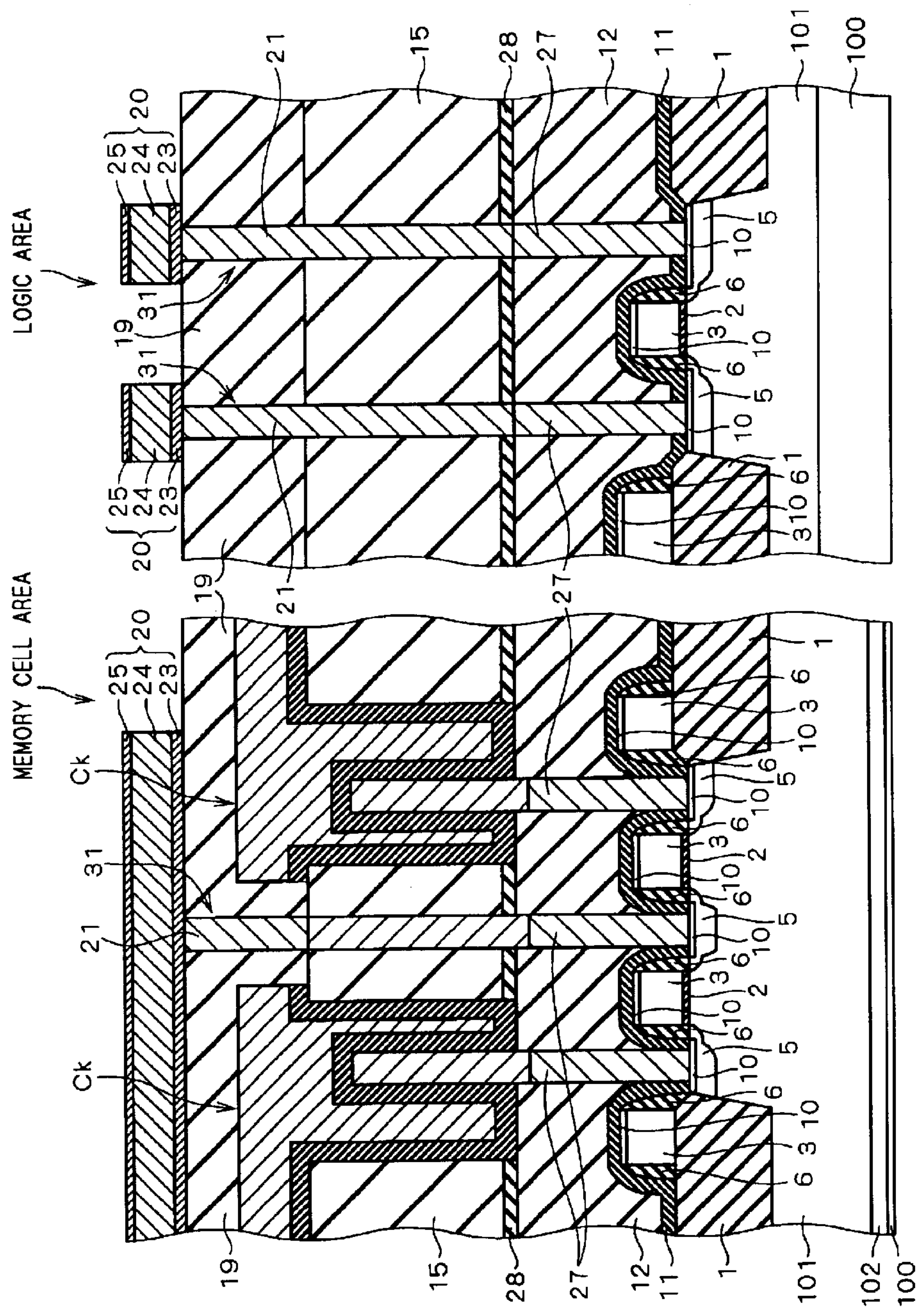
F I G . 7 7

F I G . 8 3
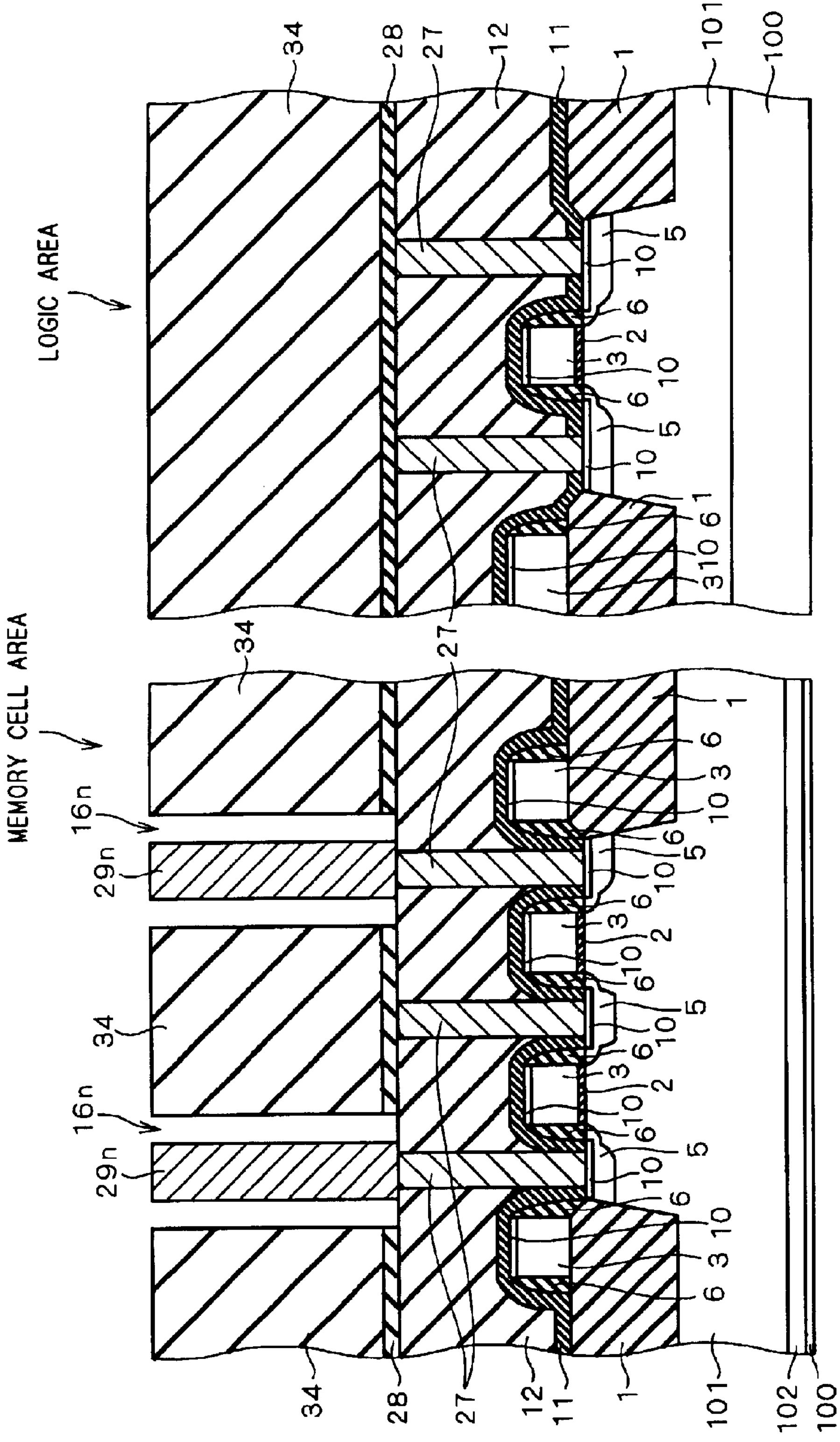

F I G . 8 4
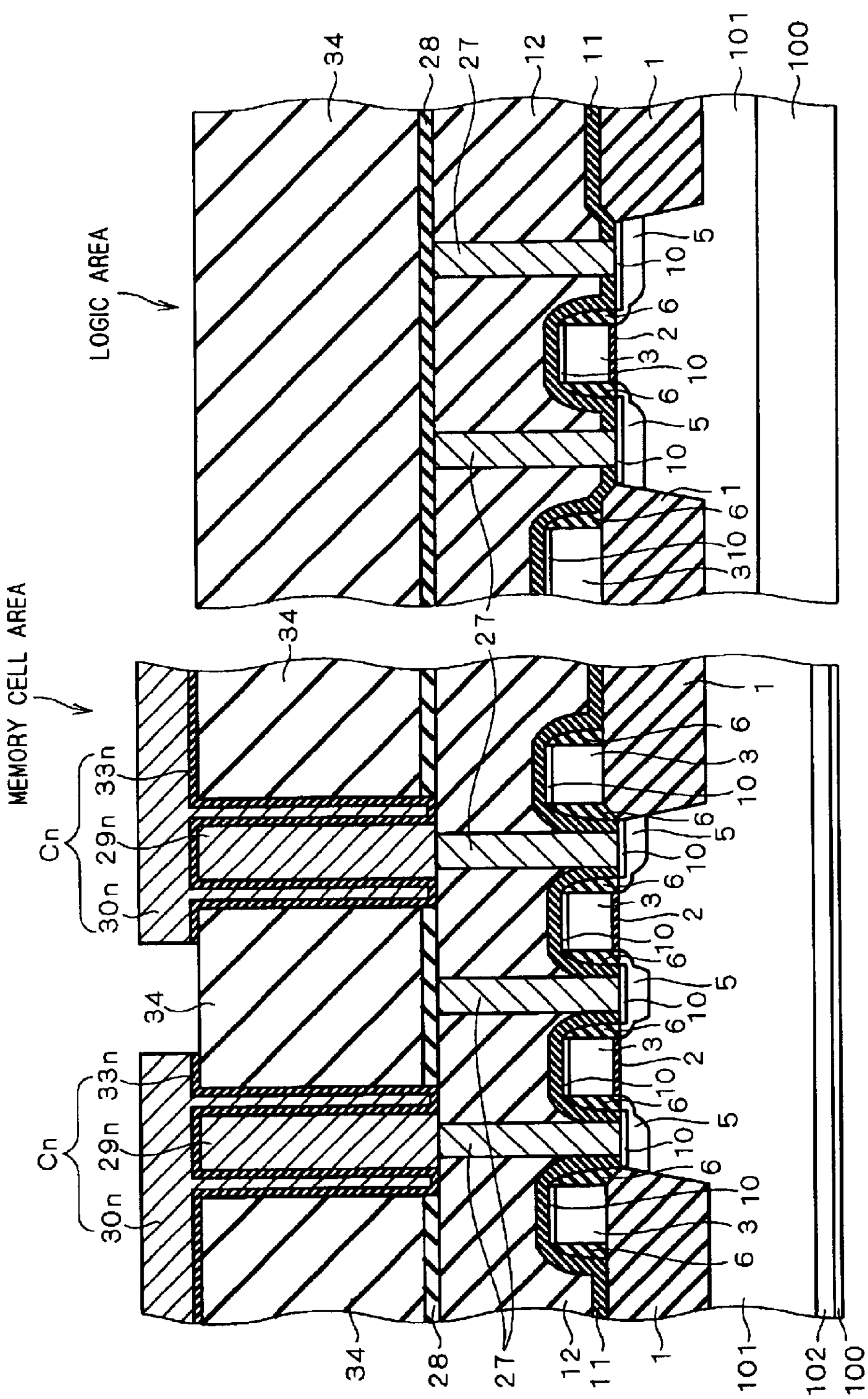

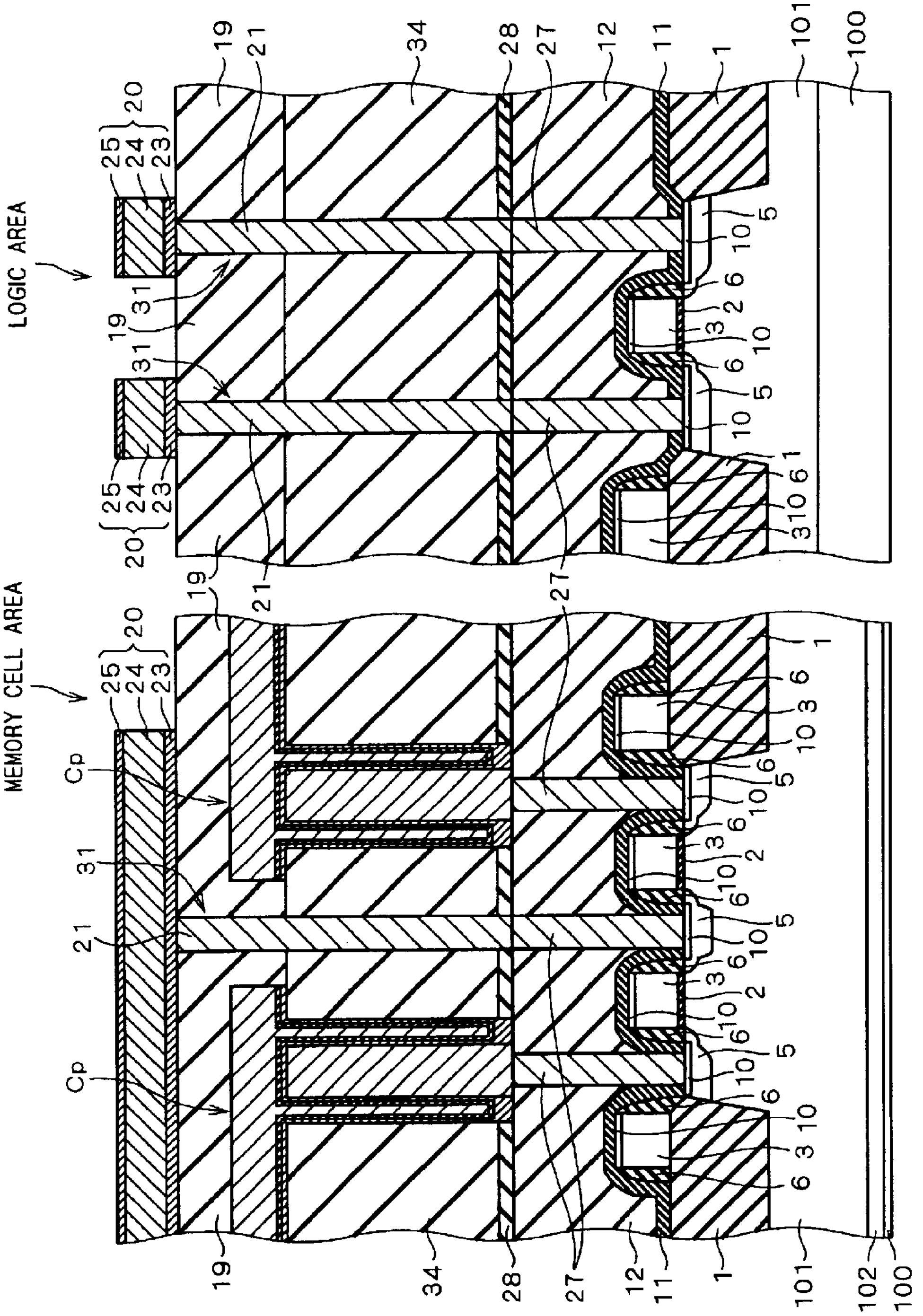
F I G . 9 1

F I G . 9 6
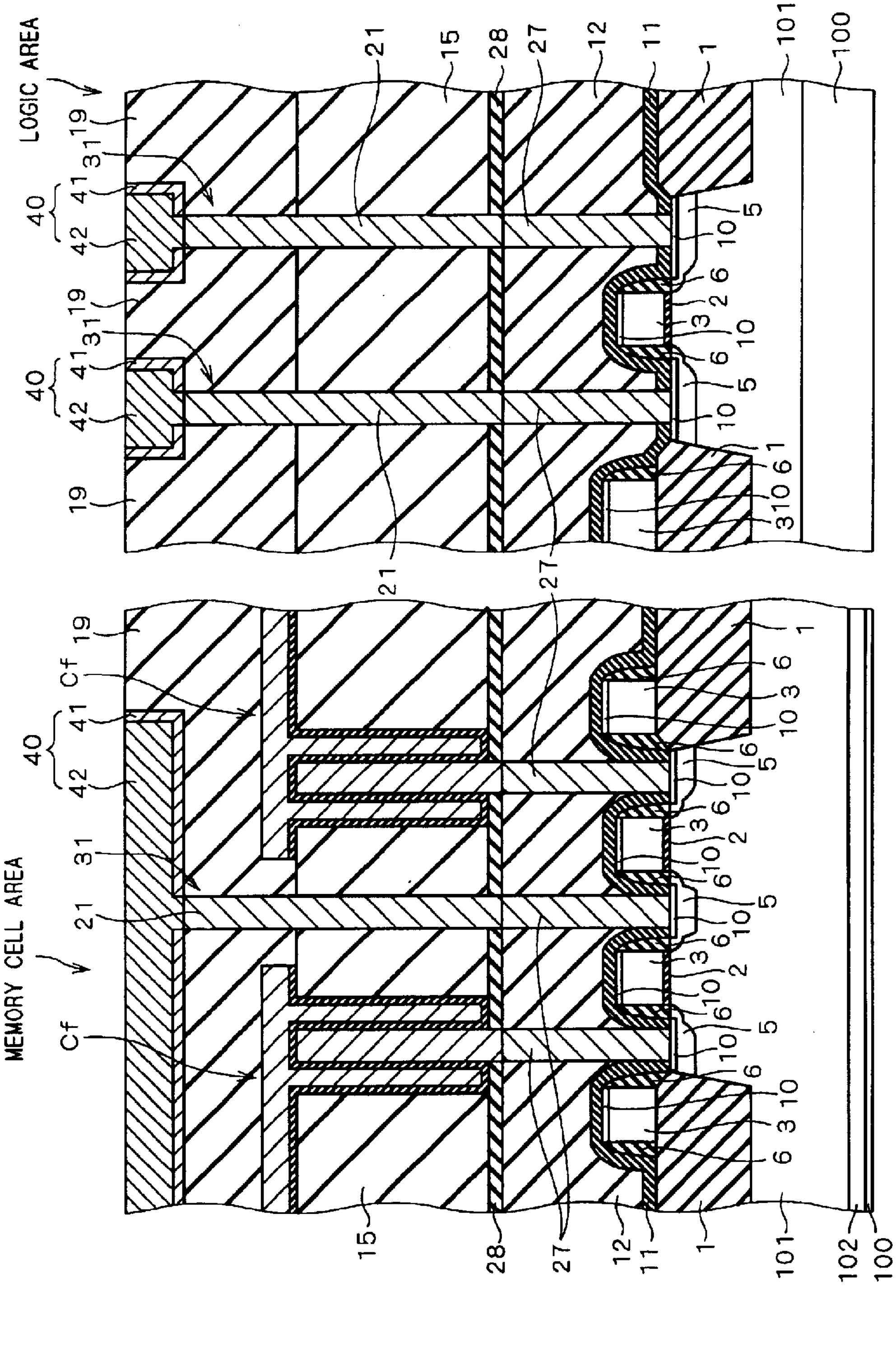

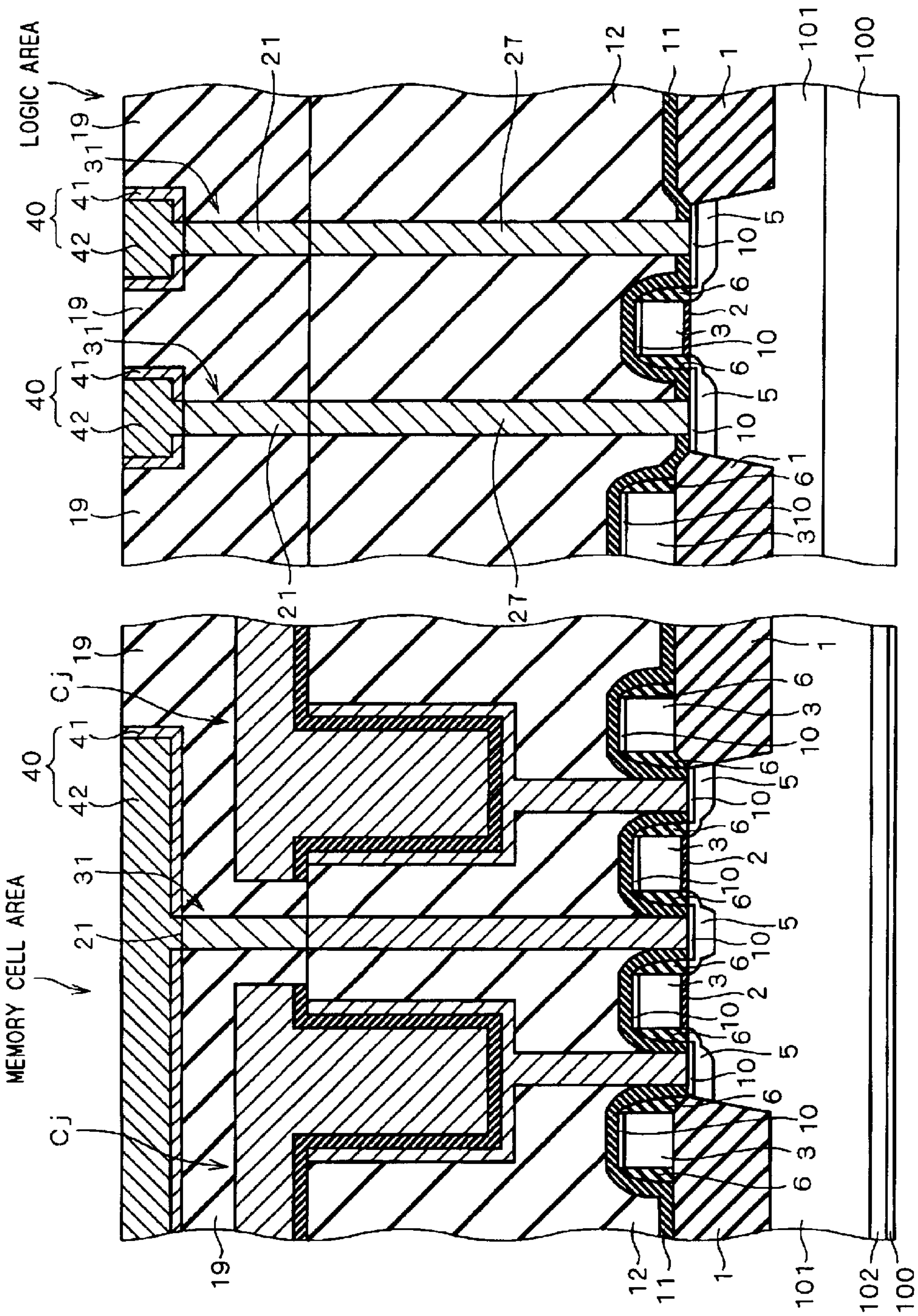
F I G . 98

METHOD OF MANUFACTURING SEMICONDUCTOR DEVICE HAVING MIM CAPACITOR

BACKGROUND OF THE INVENTION

1. Field of the Invention

The present invention relates to an MIM (metal-insulator-metal) capacitor used in a semiconductor device.

2. Description of the Background Art

An MIM capacitor has conventionally been used in a semiconductor device. The MIM capacitor includes a metal upper electrode, a metal lower electrode, and a dielectric held therebetween. The lower electrode is arranged closer than the upper electrode to a substrate for holding a semiconductor device.

In an exemplary capacitor disclosed in Japanese Patent Application Laid-Open No. 2001-144266, a ruthenium film forms a lower electrode which protrudes toward an upper electrode. In another exemplary capacitor disclosed in Japanese Patent Application Laid-Open Nos. 8-167702 (1996) and 2000-101047, a lower electrode protruding toward an upper electrode has a fin on the side surface thereof.

In an MIM capacitor, a metal film such as a ruthenium film is used to form a lower electrode, causing difficulty in processing thereof.

SUMMARY OF THE INVENTION

It is one object of the present invention to provide a technique for easily forming a lower electrode. It is another object of the present invention to easily form a capacitor dielectric film and an upper electrode.

The present invention is intended for a method of manufacturing a semiconductor device for forming an MIM capacitor over a substrate. The MIM capacitor includes a metal upper electrode, a metal lower electrode, and a dielectric film held between the upper electrode and the lower electrode. According to a first method of the present invention, the lower electrode has an extending main part, and a plurality of fins laterally extending relative to the main part. At least one of the plurality of fins farthest from the substrate, and the main part, are formed by the same process.

The process of forming the lower electrode can be simplified.

A second method of the present invention includes the following steps (a) through (e). In the step (a), a second insulating film is provided on a first insulating film. In the step (b), a first opening penetrating the first insulating film and the second insulating film is created. In the step (c), a metal film is provided to fill the first opening. In the step (d), the first opening is widened to create a second opening. In the step (e), a dielectric film and a second metal film are deposited in the second opening, to be stacked in this order relative to the first metal film.

The first metal film operative to serve as a lower electrode, the second metal film operative to serve as an upper electrode, and the dielectric film constitutes a capacitor. In the formation of the lower electrode, the first and second insulating films are not required to be removed, while removed for forming the capacitor. As a result, it is allowed to easily perform the subsequent step with high precision, such as patterning for forming the dielectric film and the upper electrode.

A third method of the present invention includes the following steps (a) and (b). In the step (a), a first opening and a second opening wider than the first opening are created in an insulating film. The first opening penetrates the insulating film. The second opening has a bottom in the insulating film. In the step (b), a first metal film, a dielectric film, and a second metal film are deposited, to be stacked in this order in the first and second openings. The second metal film is operative to serve as an upper electrode. At least the first metal film in the second opening is operative to serve as a lower electrode.

The first metal film provided in the first opening is operative to serve as a contact plug for making contact of the lower electrode with another constituent. It is allowed accordingly to form the contact plug and the lower electrode by the same process.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 1 through 14 are sectional views illustrating a method of manufacturing a semiconductor device according to a first preferred embodiment of the present invention, following the order of manufacturing steps;

FIGS. 15 through 22 are sectional views illustrating a method of manufacturing a semiconductor device according to a second preferred embodiment of the present invention, following the order of manufacturing steps;

FIGS. 23 through 28 are sectional views illustrating a method of manufacturing a semiconductor device according to a third preferred embodiment of the present invention, following the order of manufacturing steps;

FIGS. 33 through 41 are sectional views illustrating a method of manufacturing a semiconductor device according to a fifth preferred embodiment of the present invention, following the order of manufacturing steps;

FIGS. 42 through 48 are sectional views illustrating a method of manufacturing a semiconductor device according to a sixth preferred embodiment of the present invention, following the order of manufacturing steps;

FIGS. 59 through 62 are sectional views illustrating a method of manufacturing a semiconductor device according to a ninth preferred embodiment of the present invention, following the order of manufacturing steps;

FIGS. 63 through 69 are sectional views illustrating a method of manufacturing a semiconductor device according to a tenth preferred embodiment of the present invention, following the order of manufacturing steps;

FIGS. 70 through 77 are sectional views illustrating a method of manufacturing a semiconductor device according to an eleventh preferred embodiment of the present invention, following the order of manufacturing steps;

FIGS. 82 through 87 are sectional views illustrating a method of manufacturing a semiconductor device according to a thirteenth preferred embodiment of the present invention, following the order of manufacturing steps;

FIGS. 88 through 91 are sectional views illustrating a method of manufacturing a semiconductor device according to a fourteenth preferred embodiment of the present invention, following the order of manufacturing steps; and FIGS. 92 through 98 are sectional views each illustrating a modification of the present invention.

DESCRIPTION OF THE PREFERRED EMBODIMENTS

First Preferred Embodiment

Figure 2:
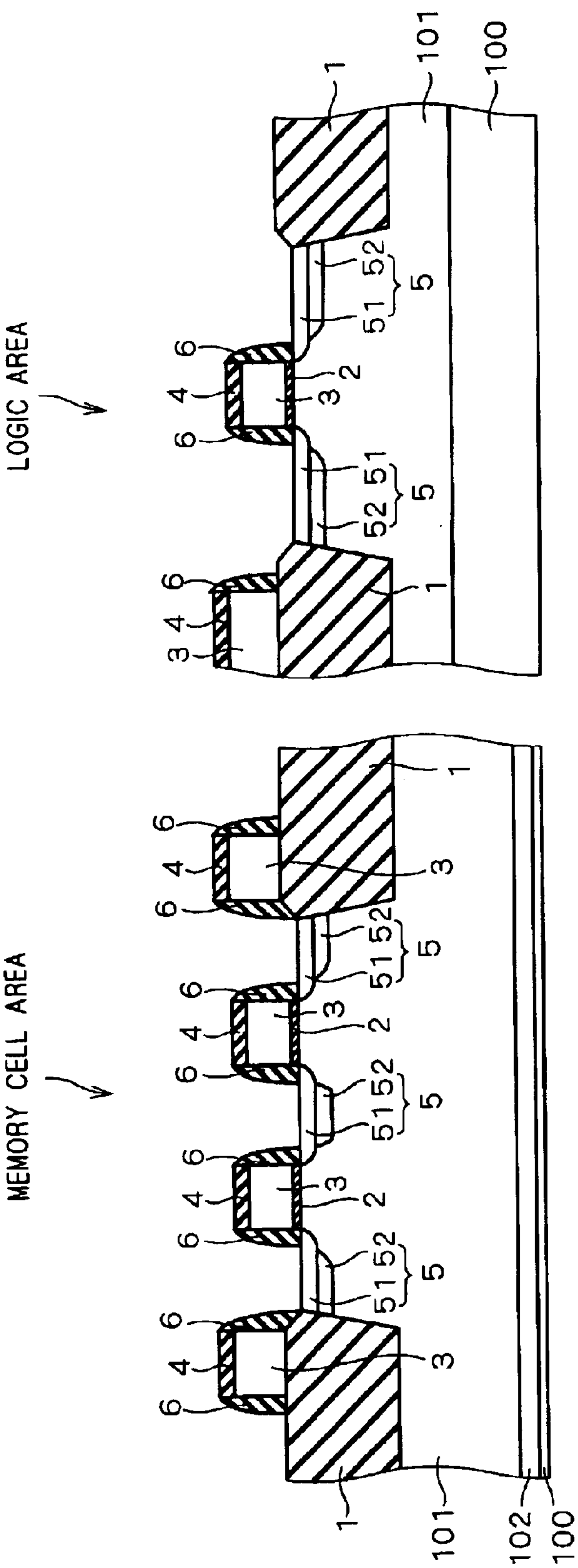

FIGS. 1 through 14 are sectional views illustrating a method of manufacturing a semiconductor device according to the first preferred embodiment of the present invention, following the order of manufacturing steps. On the left side of each figure with respect to a break line, a memory cell area is shown. On the right side thereof, a non-memory area is shown which includes a semiconductor element (such as a transistor) other than that for constituting the memory cell area. For illustrative purposes, a logic area will be described as the non-memory area.

The memory cell area and the logic area are defined in the same semiconductor substrate 100. As an example, the semiconductor substrate 100 may be an n-type silicon substrate. Isolation oxide films 1 are selectively provided in the surface of the semiconductor substrate 100. Impurities are introduced for well formation and channel region formation. For simplification, a channel region is not shown in the figures. Resulting from this impurity introduction, p-type wells 101 are defined in the memory cell are and the logic area. Accordingly, the isolation oxide films 1 are selectively defined in the surfaces of the wells 101. In the memory cell area, an n-type well 102 is further provided under the well 101.

Next, an insulating film, polycrystalline silicon, and a silicon oxide film (such as a TEOS (tetra ethyl ortho silicate) film) are sequentially stacked, among which the silicon oxide film is patterned into a shape of a gate electrode, to be referred to as silicon oxide films 4. Using the silicon oxide films 4 as a mask, etching is thereafter performed. As a result, the insulating film and the polycrystalline silicon are shaped into gate insulating films 2 and gate electrodes 3, respectively. Using the resultant silicon oxide films 4, the gate electrodes 3 and the gate insulating films 2 as a mask, n-type impurities are introduced, whereby first source/drain regions 51 are formed. Following the steps described so far, the structure shown in FIG. 1 is obtained. In FIG. 1, an NMOS transistor is formed in the logic area. Alternatively, a PMOS transistor may be formed therein. In this case, in the logic area, an n-type well is formed, and p-type impurities are introduced for formation of source/drain regions.

Thereafter, a silicon nitride film is entirely deposited from the upper side of the structure of FIG. 1, namely, from the side of the gate electrode 3 when viewed from the semiconductor substrate 100. The deposited silicon nitride film then undergoes anisotropic etching, to form sidewalls 6 on the side surfaces of the silicon oxide films 4, the gate electrodes 3, and the gate insulating films 2. Using the silicon oxide films 4, the gate electrodes 3, the gate insulating films 2, and the sidewalls 6 as a mask, n-type impurities are introduced, whereby second source/drain regions 52 are formed. Following the steps described so far, the structure shown in FIG. 2 is obtained. In order to control junction leakage current that might be generated in a silicide forming step to be performed later, the second source/drain regions 52 reach a greater depth toward the semiconductor substrate 100 as compared with the first source/drain regions 51. In the following, the first source/drain regions 51 and the second source/drain regions 52 will be collectively treated as "source/drain regions 5".

The next step is removal of the silicon oxide films 4 using hydrofluoric acid, for example, to reach the structure of FIG. 3. Subsequently, metal such as cobalt for forming silicide is entirely deposited from the upper side of the structure of FIG. 3, followed by thermal processing such as lamp annealing. As a result, low-resistance silicide films 10 are provided in the upper surfaces of the source/drain regions 5 and the gate electrodes 3. Cobalt remaining unreacted is removed, to reach the structure of FIG. 4.

Figure 5:
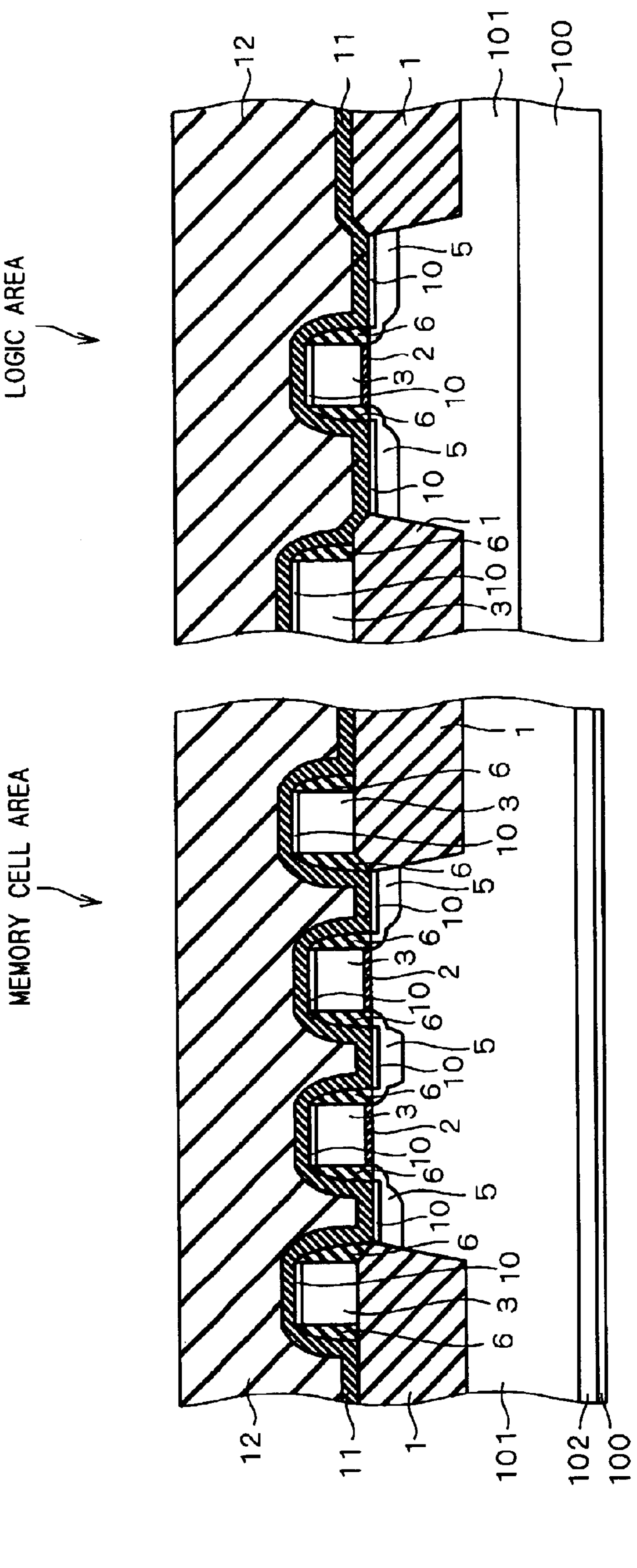

Subsequently, a silicon nitride film 11 is entirely deposited from the upper side of the structure of FIG. 4, followed by deposition of an interlayer insulating film 12 thereon. As an example, the interlayer insulating film 12 may be a BPTEOS (boro phospho tetra ethyl ortho silicate) film. The interlayer insulating film 12 undergoes thermal processing and CMP (chemical mechanical polishing), to planarize the surface thereof. Following the steps described so far, the structure shown in FIG. 5 is obtained.

Figure 6:
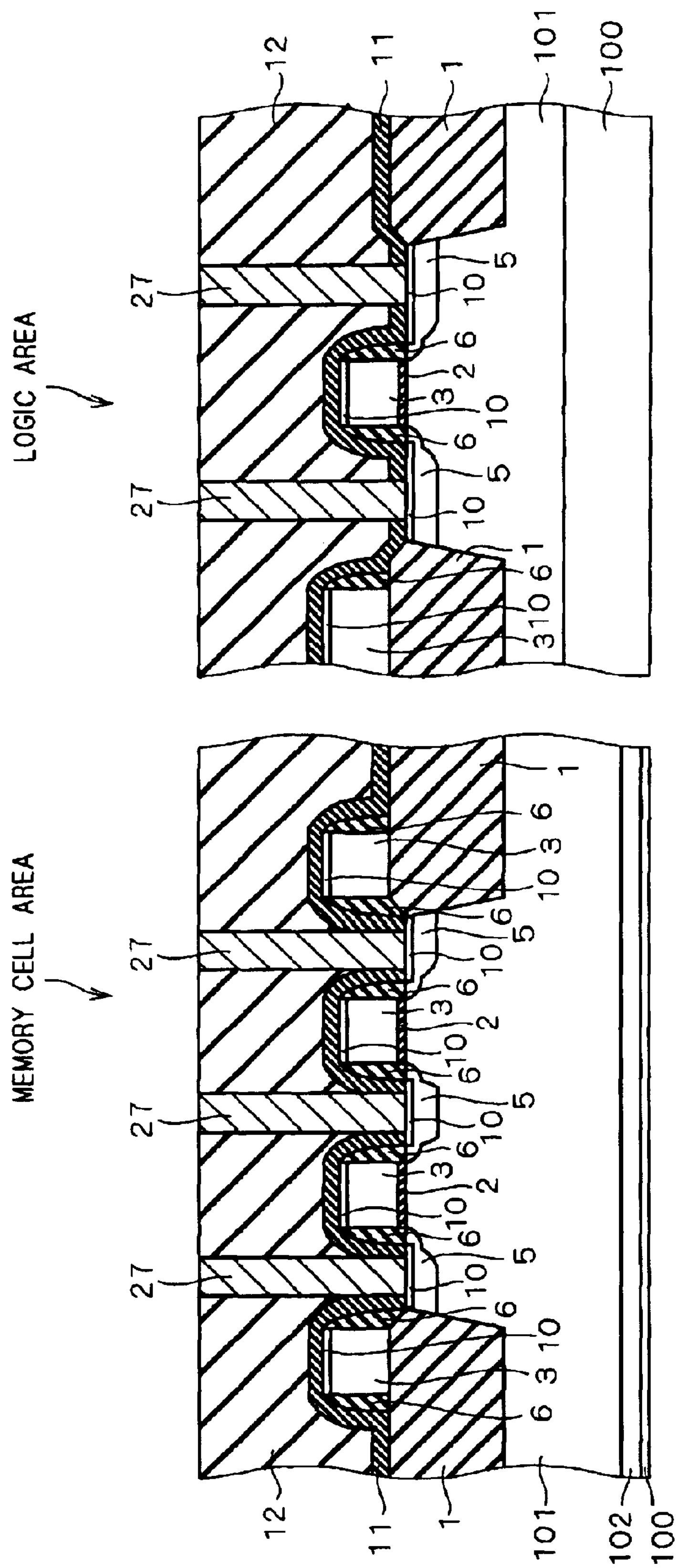

Openings are thereafter created in the interlayer insulating film 12 to expose the silicide films 10 in the source/drain regions 5. With regard to the formation of the opening, anisotropic etching is performed using the silicon nitride film 11 as a stopper. The silicon nitride film 11 thereby exposed is then subjected to further etching. These openings are filled with contact metals 27. With regard to the formation of the contact metal 27, an underlying layer as a barrier metal is provided on the inner wall and the bottom surface of the opening, and thereafter, the opening is filled with high melting point metal deposited therein through the underlying layer. Planarization is preferred so that the respective upper surfaces of the interlayer insulating film 12 and the contact metals 27 are arranged in the same plane. Following the steps described so far, the structure shown in FIG. 6 is obtained. As an example, the underlying layer may be a titanium nitride layer, and high melting point metal may be titanium or tungsten.

Anisotropic etching of the interlayer insulating film 12 does not employ self-aligned manner relative to the gate electrodes 3 and the sidewalls 6. In order to avoid short circuit between the contact metals 27 and the gate electrodes 3, the distance therebetween is preferably determined in consideration of alignment accuracy, dimensional variations among all constituents, and an insulating property of each constituent.

Figure 7:
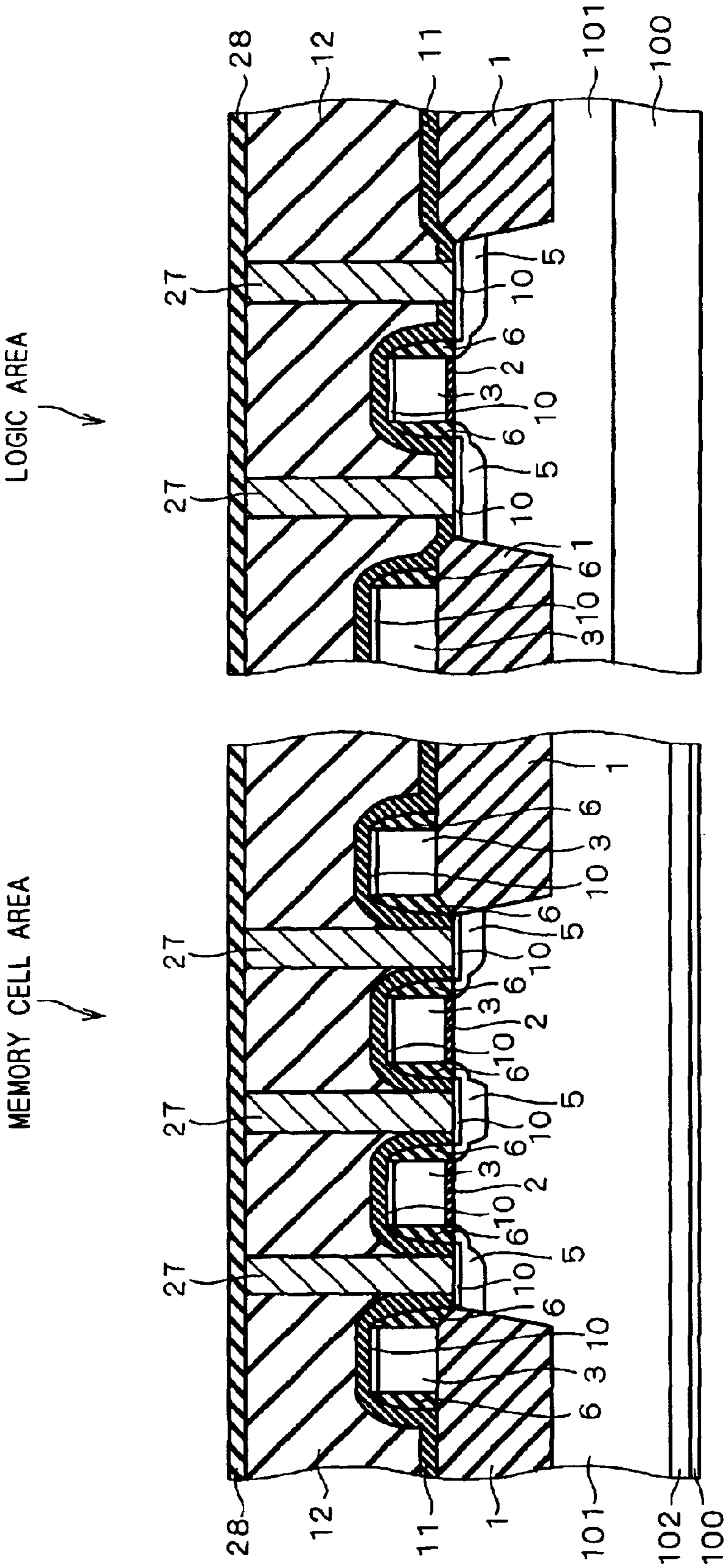
Figure 8:
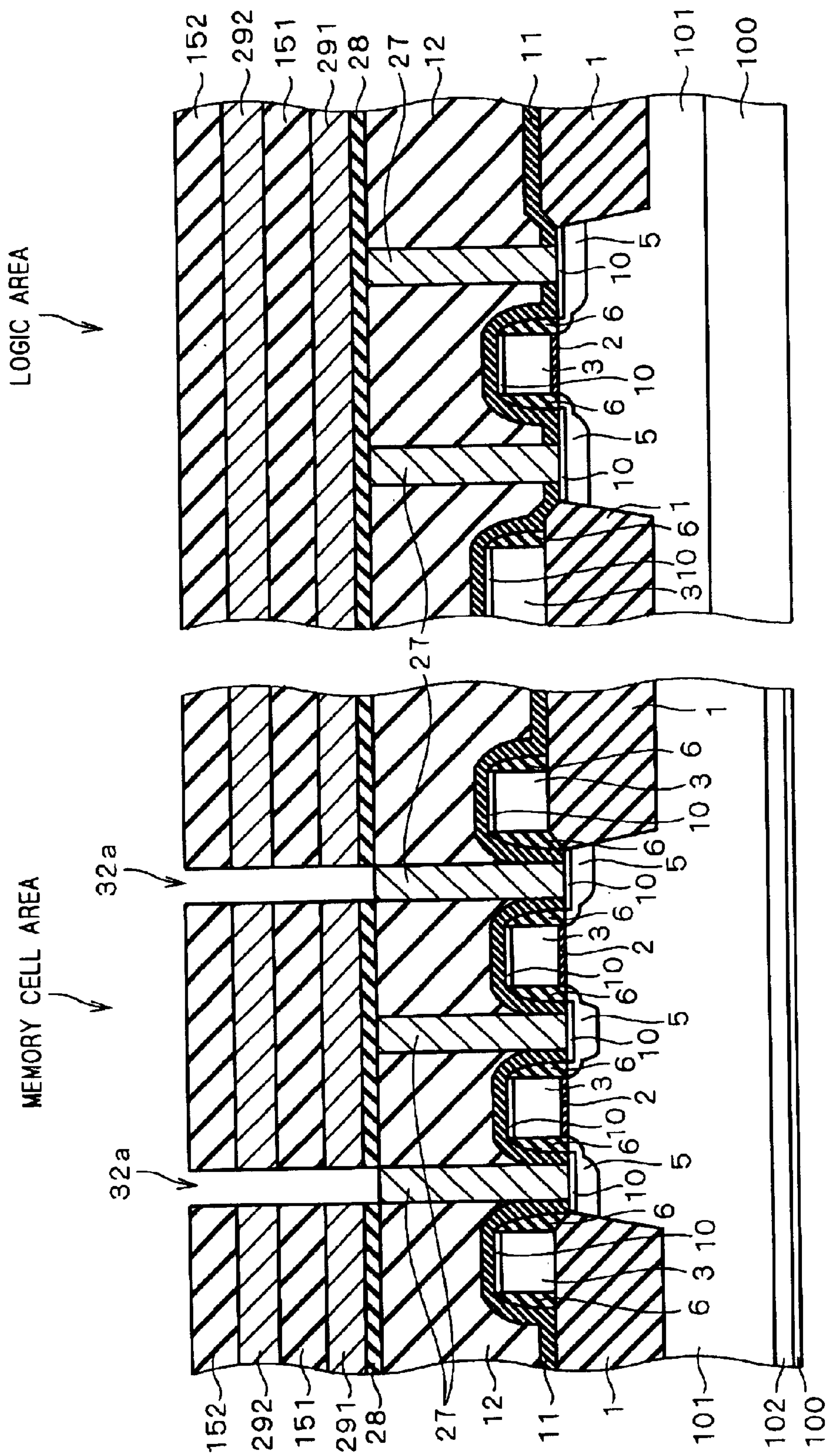

Next, a silicon nitride film 28 is entirely deposited from the upper side of the structure of FIG. 6, to reach the structure of FIG. 7. A metal film 291, an interlayer insulating film 151, a metal film 292, and an interlayer insulating film 152 are entirely deposited in this order from the upper side of the structure of FIG. 7. The metal films 291 and 292 both include high melting point metal such as ruthenium. The interlayer insulating films 151 and 152 include such a material allowing the interlayer insulating films 151 and 152 to be etched at a higher etching rate relative to the silicon nitride film 28, and to the metal films 291 and 292. For example, the interlayer insulating films 151 and 152 may be BPTEOS films. Thereafter, openings 32*a* penetrating the interlayer insulating films 151 and 152, and the metal films 291 and 292, are created, whereby the contact metal 27, to hold a to-be-formed lower electrode thereon, is exposed. Following the steps described so far, the structure shown in FIG. 8 is obtained.

As an exemplary way to create the opening 32*a*, anisotropic etching may be performed on the metal films 291 and 292, and the interlayer insulating films 151 and 152 using the silicon nitride film 28 as a stopper. The silicon nitride film 28 thereby exposed is then subjected to further etching. The opening 32*a* is directed to the formation of a lower electrode of a capacitor, and therefore, is not created in the logic area. In the exemplary view of FIG. 8, among three contact metals 27 shown in the memory cell area, two except the one in the middle are exposed by the openings 32*a*.

Figure 9:
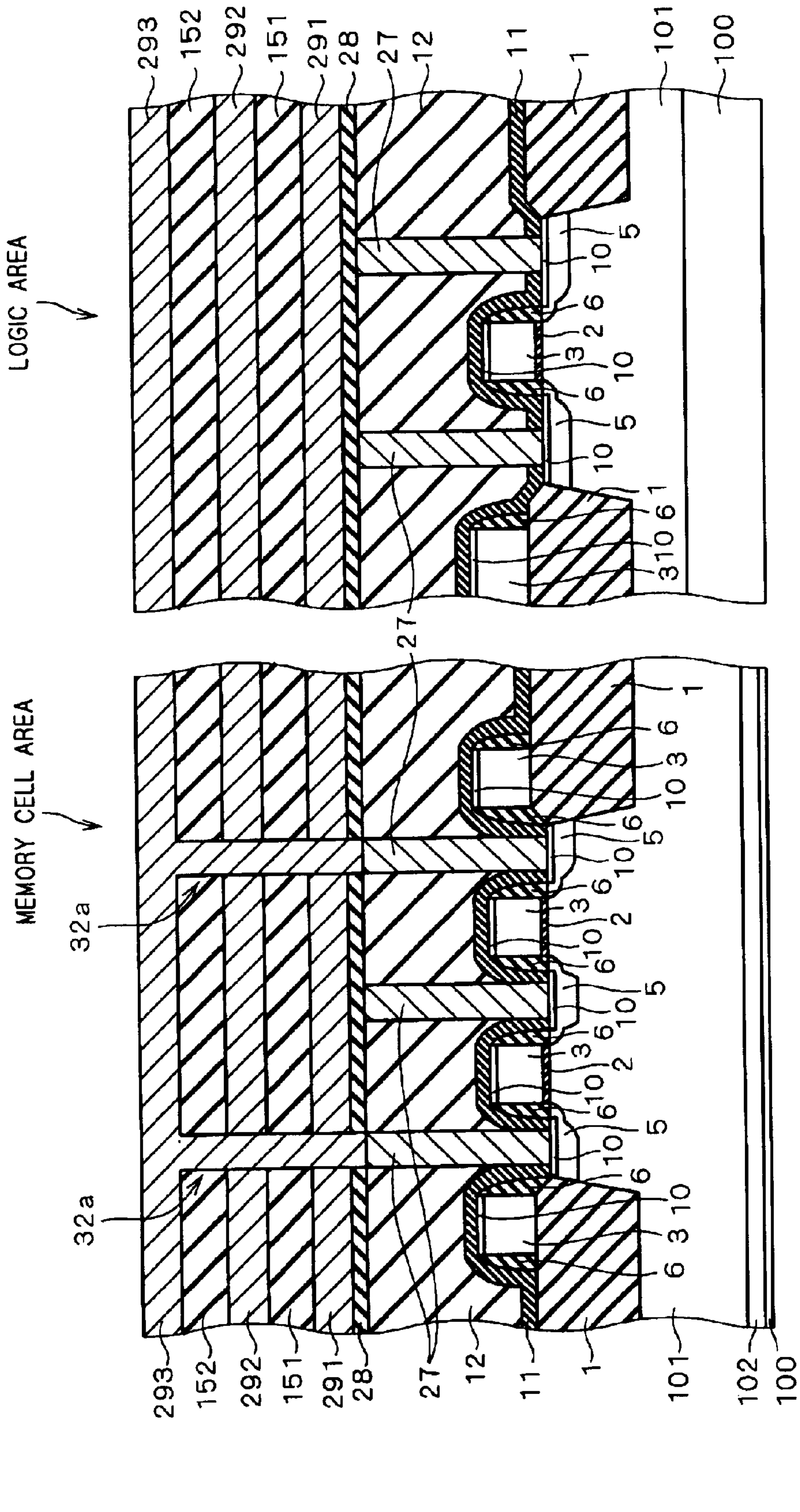
Figure 10:
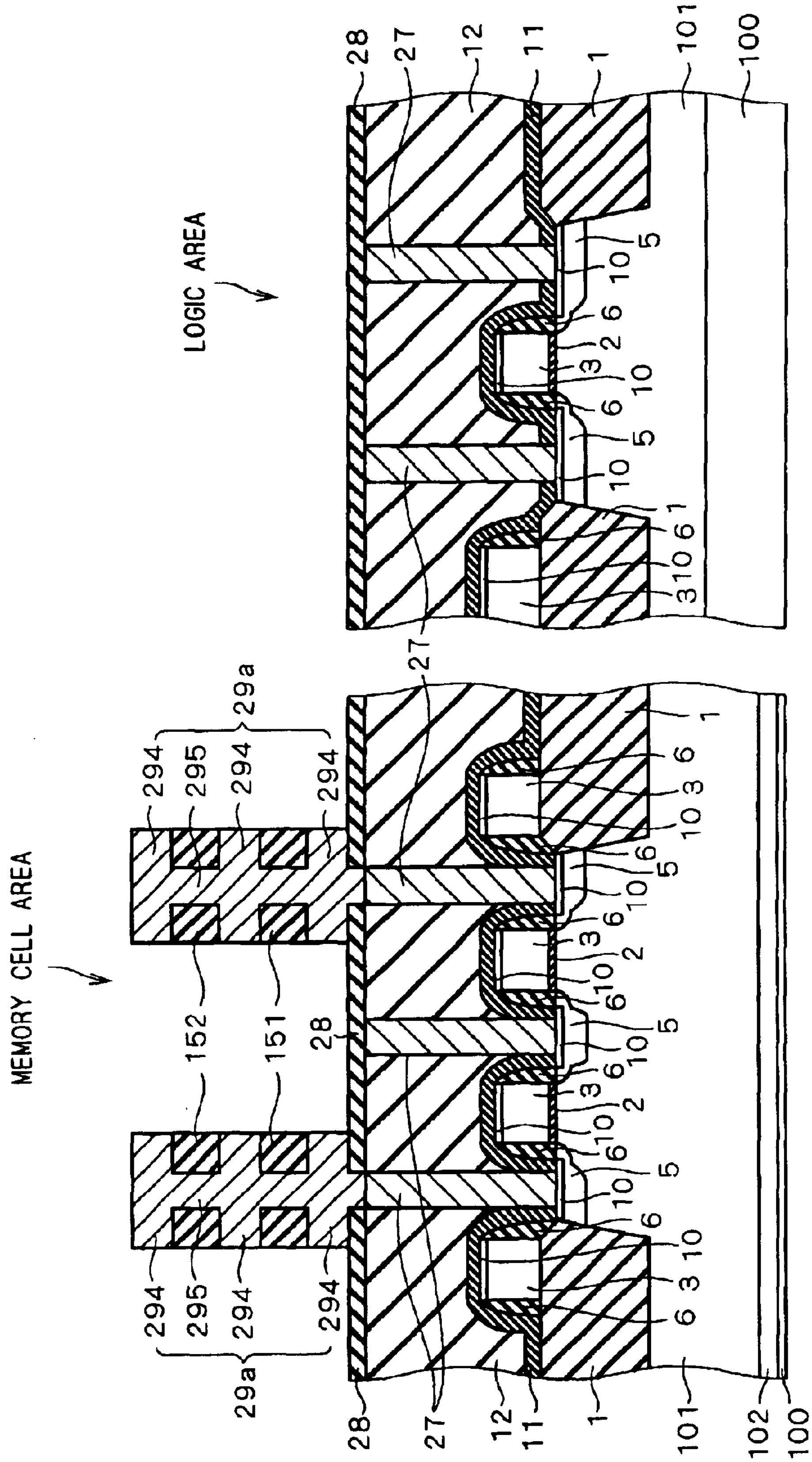

Subsequently, a metal film 293 is entirely deposited from the upper side of the structure of FIG. 8. While filling the openings 32*a*, the metal film 293 covers the interlayer insulating film 152 (FIG. 9). The next step is anisotropic etching, to remain the openings 32*a* and their surroundings. As a result, the structure of FIG. 10 is obtained, where lower electrodes 29*a* are formed. This anisotropic etching uses the silicon nitride film 28 as a stopper.

From a structural point of view, the lower electrodes 29*a* each have a main part 295 extending upwardly from the contact metal 27, and at least one fin 294 extending laterally relative to the main part 295. As an example, the main part 295 may be cylindrical. The fin 294 may have a ring-like shape, surrounding the main part 295. Three fins 294 arranged in the vertical direction, namely, in the extending direction of the main part 295, are illustratively shown in FIG. 10. Alternatively, more than three fins 294 may be provided by increasing the number of interlayer insulating films and metal films which together form alternate layers as described with reference to FIG. 8. A to-be-formed capacitor will grow in electrostatic capacity by the increase in the number of its fins.

The main part 295 and the uppermost one of the fins 294 (namely, the fin 294 farthest from the substrate 100) are formed from the metal film 293 by the same steps. The fin 294 under the uppermost one, and the lowermost fin 294, are respectively formed from the metal films 292 and 291. As the uppermost fin 294 and the main part 295 are formed by the same steps, the number of manufacturing steps can be reduced as compared with the case where the formation of the uppermost fin 294 and the main part 295 require respective steps.

The formation of the fins 294 does not require etchback, but instead, etching is performed on the deposited metal films 291, 292 and 293 using photolithography. In an MIM capacitor employing hard-to-process metal as the lower electrode 29*a*, it is thus allowed to easily form the lower electrode 29*a* with the fin 294.

Figure 11:
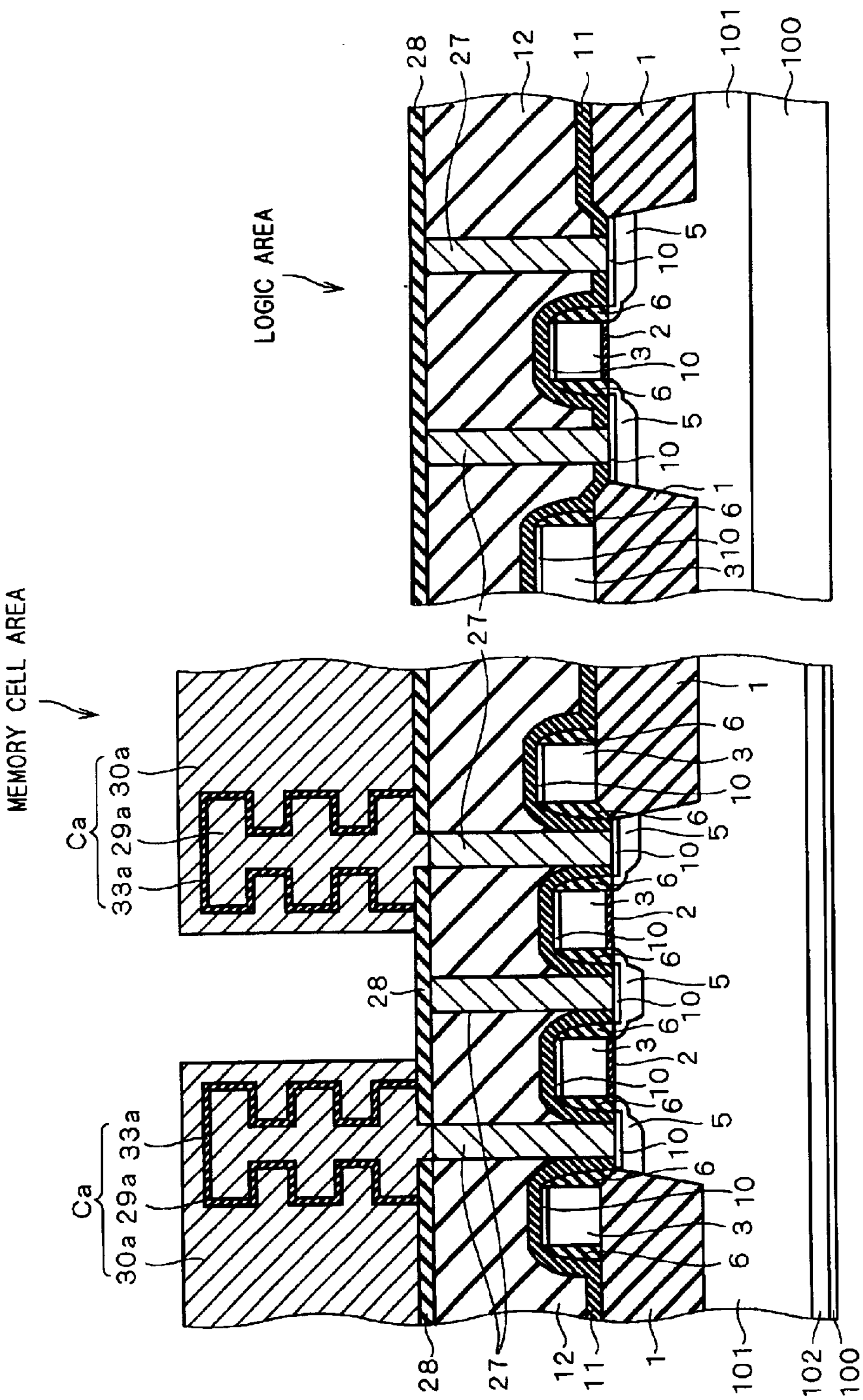

As described, the interlayer insulating films 151 and 152 can be etched at a higher etching rate relative to the silicon nitride film 28, and to the metal films 291 and 292. Therefore, only the interlayer insulating films 151 and 152 can be easily removed from the structure shown in FIG. 10. After removal of the interlayer insulating films 151 and 152 from the structure of FIG. 10, a dielectric film (including tantalum pentoxide, for example) is entirely deposited from the upper side, which is thereafter subjected to patterning. The dielectric film remains only on the surfaces of the lower electrodes 29*a* as capacitor dielectric films 33*a*. Thereafter, a metal film including high melting point metal such as ruthenium is further deposited, and is then patterned to form upper electrodes 30*a*. As a result, capacitors Ca each including the upper electrode 30*a*, the lower electrode 29*a*, and the capacitor dielectric film 33*a* are obtained (FIG. 11). Both the capacitor dielectric film 33*a* and the upper electrode 30*a* are not formed in the logic area, nor over the middle one among the three contact metals 27 in the memory cell area.

By way of alternative example, after only the interlayer insulating films 151 and 152 are removed, a dielectric film and a metal film may be entirely deposited from the upper side, followed by patterning to form the capacitor dielectric films 33*a* and the upper electrodes 30*a*. In this case, the capacitor dielectric films 33*a* remains not only on the surfaces of the lower electrodes 29*a*, but also remain between the upper electrode 30*a* and the silicon nitride film 28.

Figure 12:
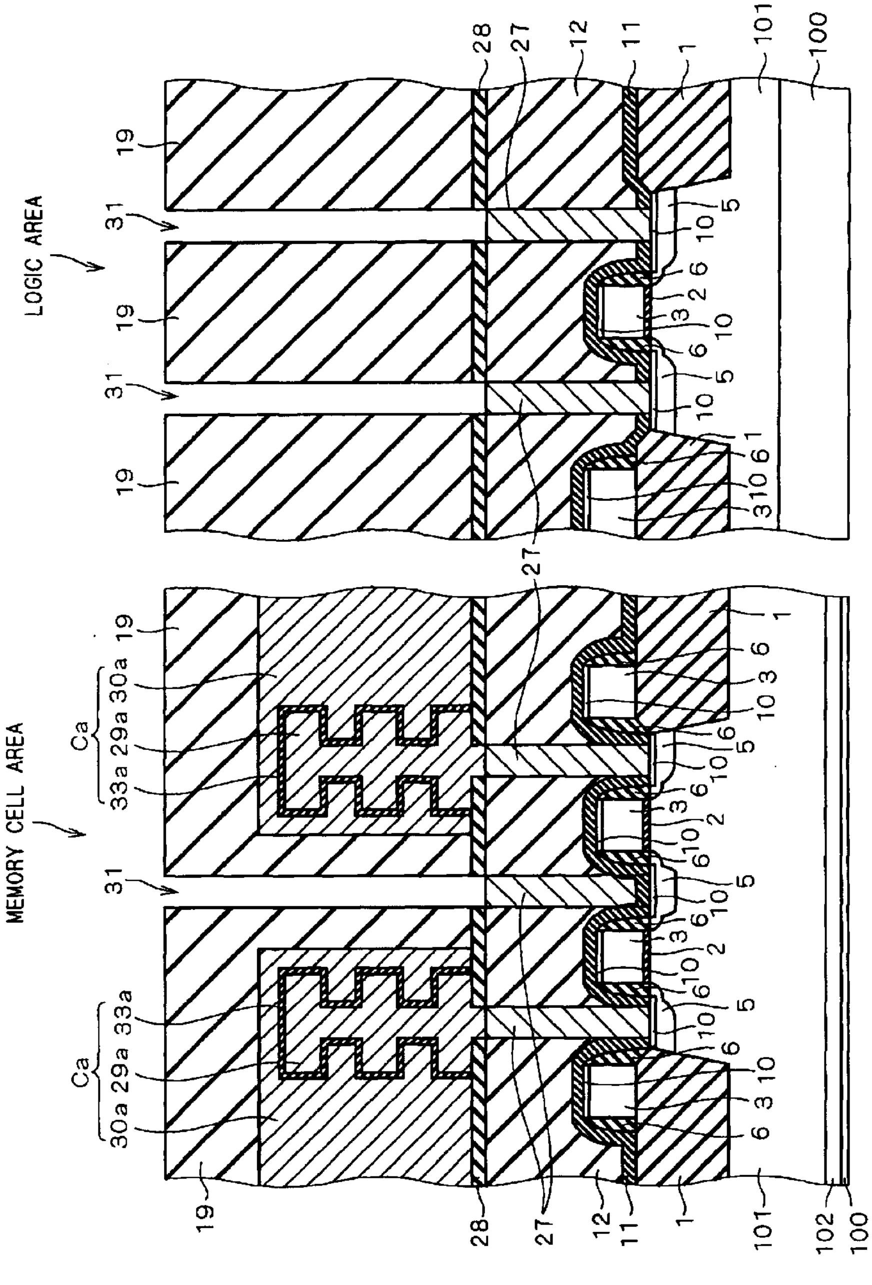

Next, an interlayer insulating film 19 is entirely deposited from the upper side of the structure of FIG. 11, followed by CMP to planarize the surface of the interlayer insulating film 19. As for the interlayer insulating film 19, a TEOS film deposited by plasma CVD (hereinafter referred to as a "plasma TEOS film") may be applicable, for example. Openings 31 are thereafter created to expose the contact metals 27 in the logic area, and the middle one among the three contact metals 27 in the memory cell area (FIG. 12). Although not shown, the opening 31 may be so created to expose the upper electrode 30*a*. With regard to the formation of the opening 31, anisotropic etching is performed on the interlayer insulating film 19 using the silicon nitride film 28 as a stopper, at a higher etching rate relative to the silicon nitride film 28. The silicon nitride film 28 thereby exposed is then subjected to further etching. Overetching of the interlayer insulating film 19 is avoided accordingly in the formation of the opening 31.

Figure 13:
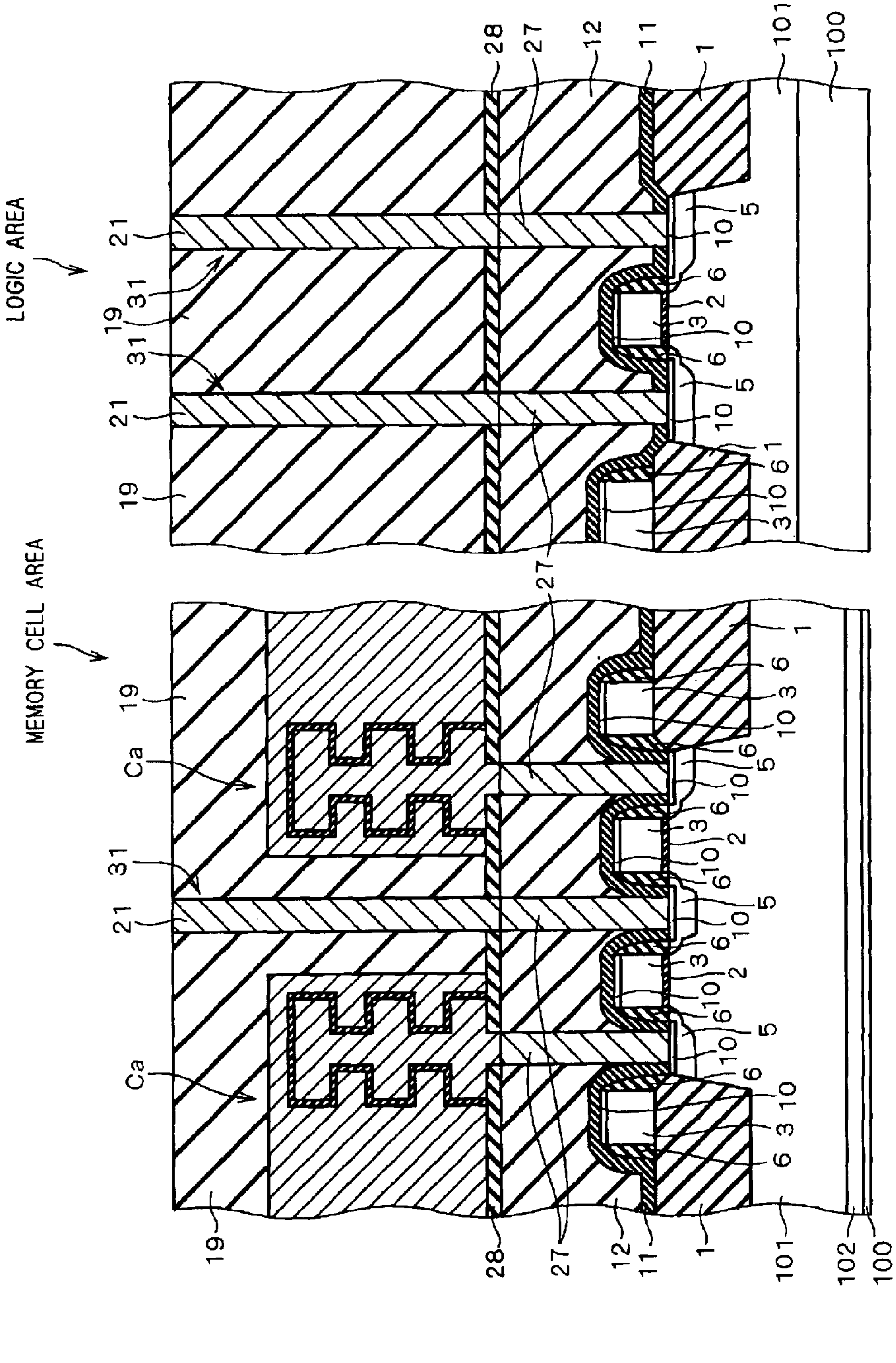

Next, the openings 31 are filled with contact metals 21. With regard to the formation of the contact metal 21, an underlying layer as a barrier metal is provided on the inner wall and the bottom surface of the opening 31, and thereafter, the opening 31 is filled with high melting point metal deposited therein through the underlying layer. Planarization is preferred so that the respective upper surfaces of the interlayer insulating film 19 and the contact metals 21 are arranged in the same plane. Following the steps described so far, the structure shown in FIG. 13 is obtained. As an example, the underlying layer may be a titanium nitride layer, and high melting point metal may be titanium or tungsten.

As described above, overetching of the interlayer insulating film 19 is avoided in the formation of the opening 31. Therefore, the contact metal 21 filling the opening 31 is prevented from being short-circuited with the gate electrode 3 or the source/drain region 5.

Figure 14:
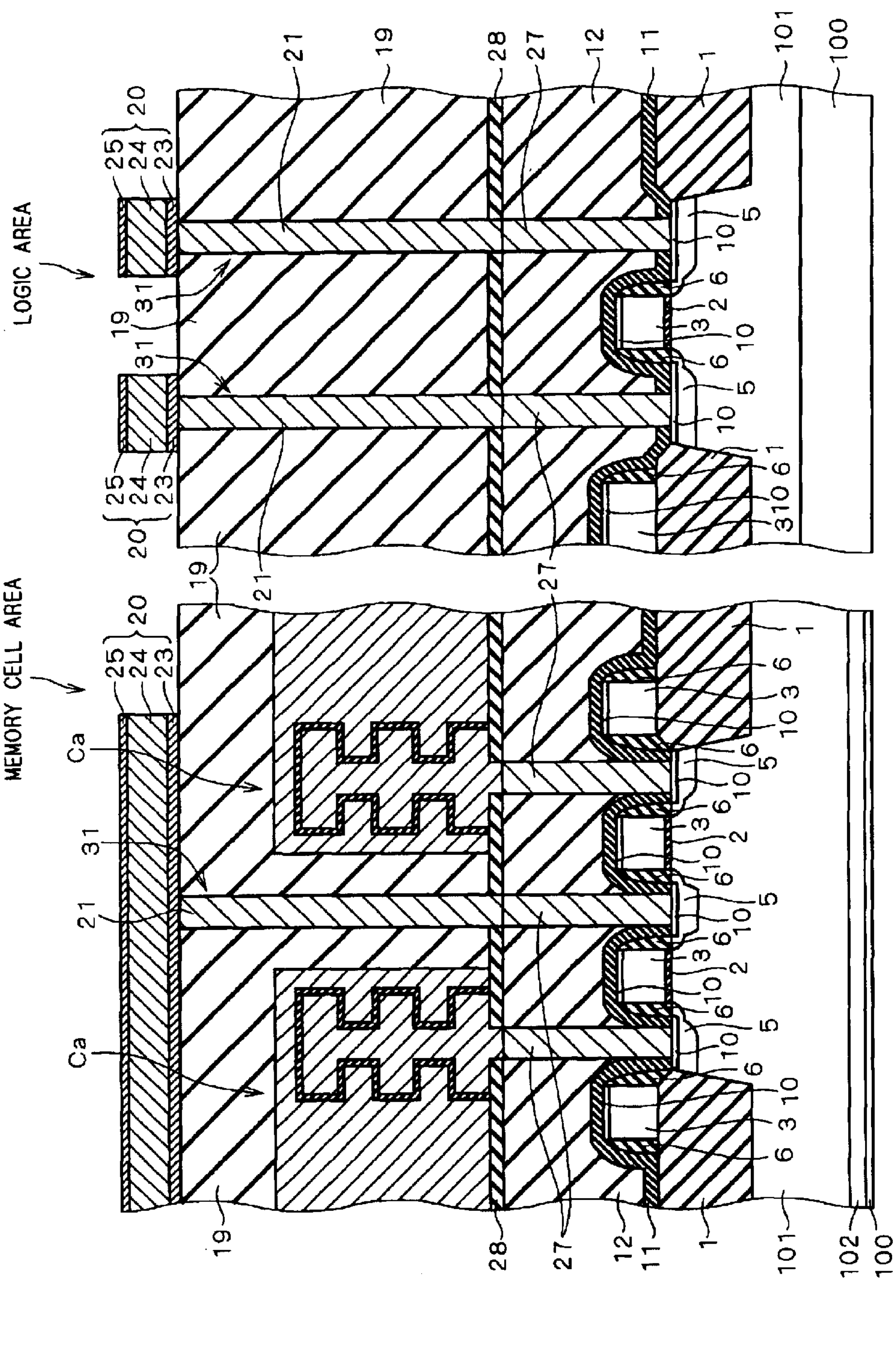

The next step is formation of interconnect lines 20 on the interlayer insulating film 19 to be connected to the contact metals 21, as shown in FIG. 14. The interconnect lines 20 each include a barrier metal 23, an aluminum interconnect line 24, and a barrier metal 25 stacked from the bottom in this order. The barrier metals 23 and 25 may be titanium nitride, for example. By way of example, the interconnect line 20 is operative to function as a bit line. In this case, the memory cell area has a CUB (capacitor under bit-line) structure in which the capacitor Ca is arranged under the interconnect line 20 as a bit line.

The lower electrode 29*a* is accordingly capable to be connected to the interconnect line 20 through a transistor defined thereunder including the source/drain region 5 and the gate electrode 3.

According to the first preferred embodiment, use of the fins 294 allows the increase in capacity of the capacitor Ca. Further, while being surrounded by the upper electrode 30*a*, the lower electrode 29*a* protrudes toward the upper electrode

30*a*. As compared with the structure where a lower electrode surrounds an upper electrode, it is allowed accordingly to easily form the lower electrode 29*a*.

Second Preferred Embodiment

FIGS. 15 through 22 are sectional views illustrating a method of manufacturing a semiconductor device according to the second preferred embodiment of the present invention, following the order of manufacturing steps. First, following the same steps as those of the first preferred embodiment, the structure shown in FIG. 7 is obtained. Next, interlayer insulating films 151, 341, 152, 342 and 153 are entirely deposited in this order from the upper side of the structure of FIG. 7. The interlayer insulating films 151, 152, 153 and 341, 342 include such materials allowing the interlayer insulating films 151, 152 and 153 to be etched at a higher etching rate relative to the silicon nitride film 28, and to the interlayer insulating films 341 and 342 under the same etching conditions. By way of example, the interlayer insulating films 151, 152 and 153 may be BPTEOS films, and the interlayer insulating films 341 and 342 may be non-doped silicon oxide films. Thereafter, openings 32*a* penetrating the interlayer insulating films 151, 341, 152, 342 and 153 are created, whereby the contact metal 27, to hold a to-be-formed lower electrode thereon, is exposed. Following the steps described so far, the structure shown in FIG. 15 is obtained.

As an exemplary way to create the opening 32*a*, anisotropic etching may be performed on the interlayer insulating films 151, 341, 152, 342 and 153 using the silicon nitride film 28 as a stopper. The silicon nitride film 28 thereby exposed is then subjected to further etching. The opening 32*a* is directed to the formation of a lower electrode of a capacitor, and therefore, is not created in the logic area. In the exemplary view of FIG. 15, among the three contact metals 27 shown in the memory cell area, two except the one in the middle are exposed by the openings 32*a*.

Figure 16:
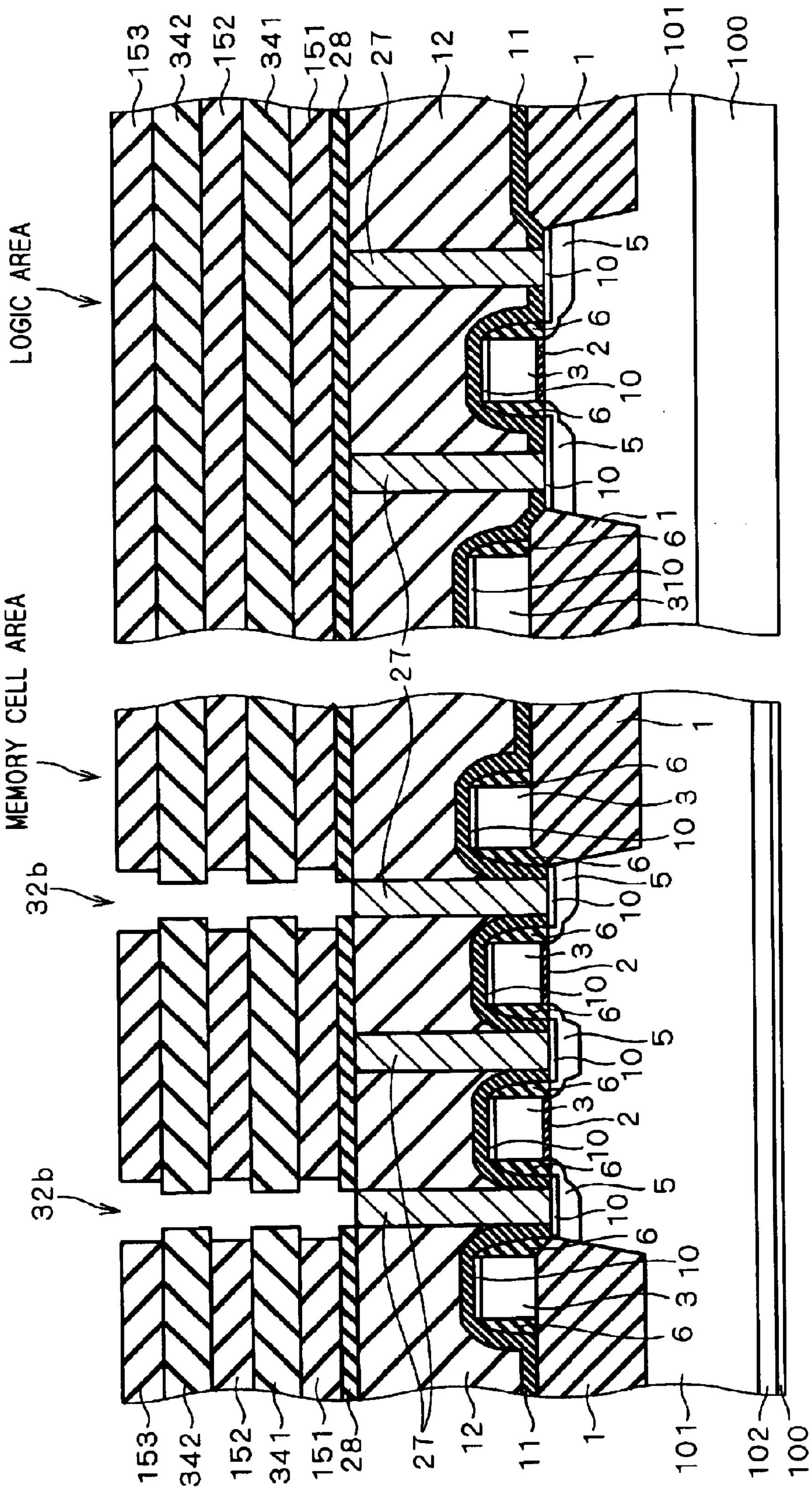

Subsequently, the silicon oxide films undergo etching. As an example, wet etching is performed. Resulting from the foregoing choice of the materials, an etchant, which allows the interlayer insulating films 151, 152 and 153 to be etched at a higher etching rate relative to the interlayer insulating films 341 and 342, can be easily selected. After etching, the openings 32*a* expand accordingly, entering into the interlayer insulating films 151, 152 and 153, which are hereinafter referred to as openings 32*b*. In other words, at the opening 32*b*, the interlayer insulating films 151, 152 and 153 have recessed end surfaces relative to the interlayer insulating films 341 and 342. The structure at this stage is as shown in FIG. 16. In this wet etching, the etching rate of the silicon nitride film 28 can be easily lowered. Therefore, the etching selectivity can be easily enhanced between the interlayer insulating films 151, 341, 152, 342 and 153, and the silicon nitride film 28. As a result of this etching, the opening 32*b* is unlikely to expand at the bottom.

Figure 17:
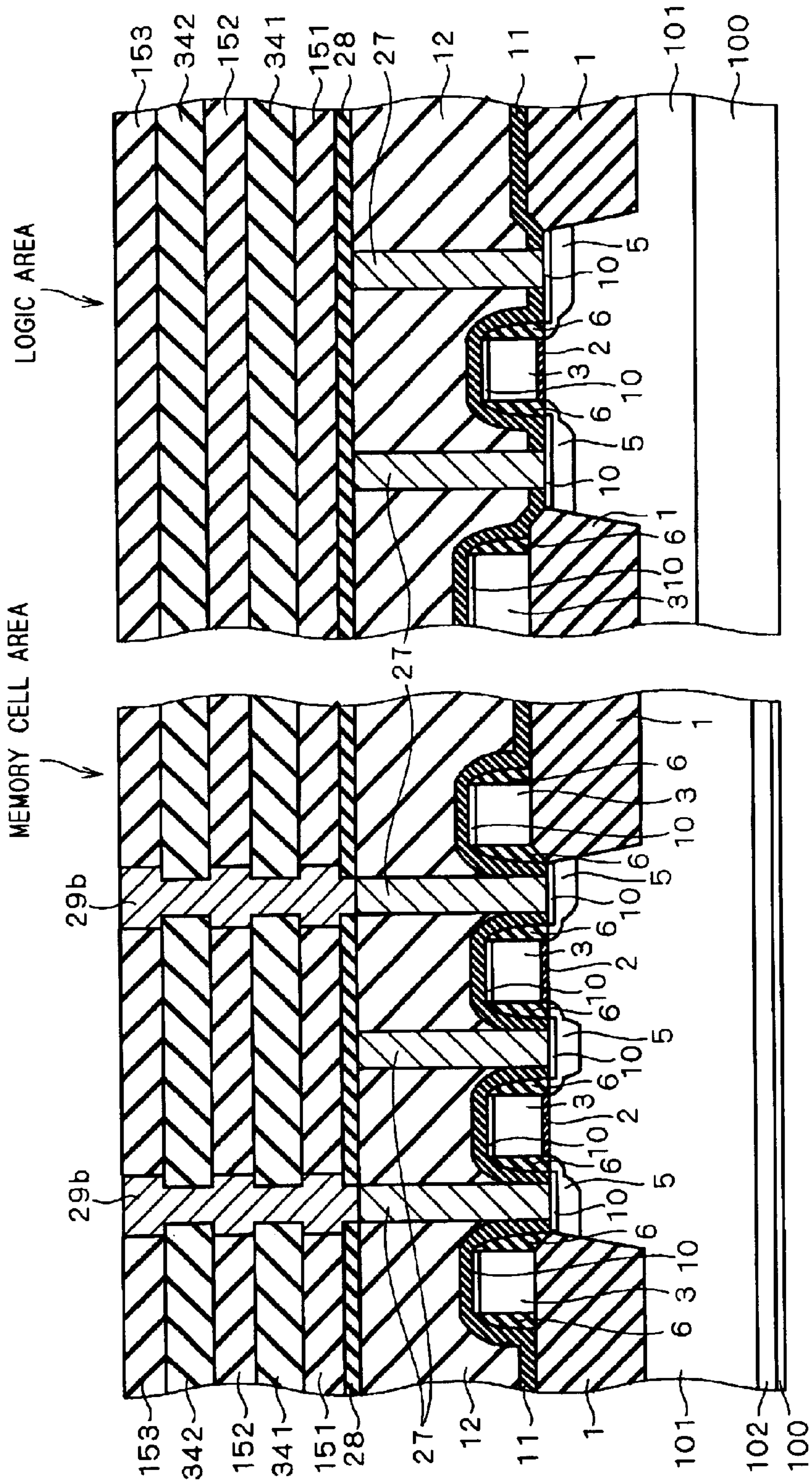

Next, a metal film to form a lower electrode is entirely deposited from the upper side of the structure of FIG. 16, whereby the openings 32*b* are filled. This metal film includes high melting point metal such as ruthenium. The metal film is kept only in the openings 32*b*, so that lower electrodes 29*b* are formed (FIG. 17). With regard to the formation of the lower electrode 29*b*, the metal film existing on the interlayer insulating film 153 is selectively removed by CMP. Alternatively, the metal film, to be operative to serve as the lower electrode 29*b*, is covered with a photoresist, followed by anisotropic etching.

The next step is removal of the interlayer insulating films 151, 341, 152, 342 and 153 by etching. Wet etching may be employed, for example. In this etching, the etching rate of the silicon nitride film 28 can be easily lowered, so that an echant is readily selected which provides the enhanced selectivity between the silicon nitride film 28, and the interlayer insulating films 151, 341, 152, 342 and 153.

From a structural point of view, similar to the lower electrode 29*a*, the lower electrode 29*b* also has a main part 295 extending upwardly from the contact metal 27, and at least one fin 294 extending laterally relative to the main part 295. Three fins 294 arranged in the vertical direction are illustratively shown in FIG. 18. Alternatively, more than three fins 294 may be provided by increasing the number of two types of interlayer insulating films which together form alternate layers as described with reference to FIG. 15. A to-be-formed capacitor will grow in electrostatic capacity by the increase in the number of its fins.

In the second preferred embodiment, the main part 295 and all the fins 294 are simultaneously formed by filling the opening 32*b* with the metal film. Therefore, the number of steps required for forming the lower electrode 29*b* can be reduced.

The formation of the fins 294 does not require etchback. Nor is etching of the metal film to form the lower electrode 29*b* necessary, except the one to shape the uppermost fin 294. In an MIM capacitor employing hard-to-process metal as the lower electrode 29*b*, it is thus allowed to easily form the lower electrode 29*b* with the fin 294.

Figure 18:
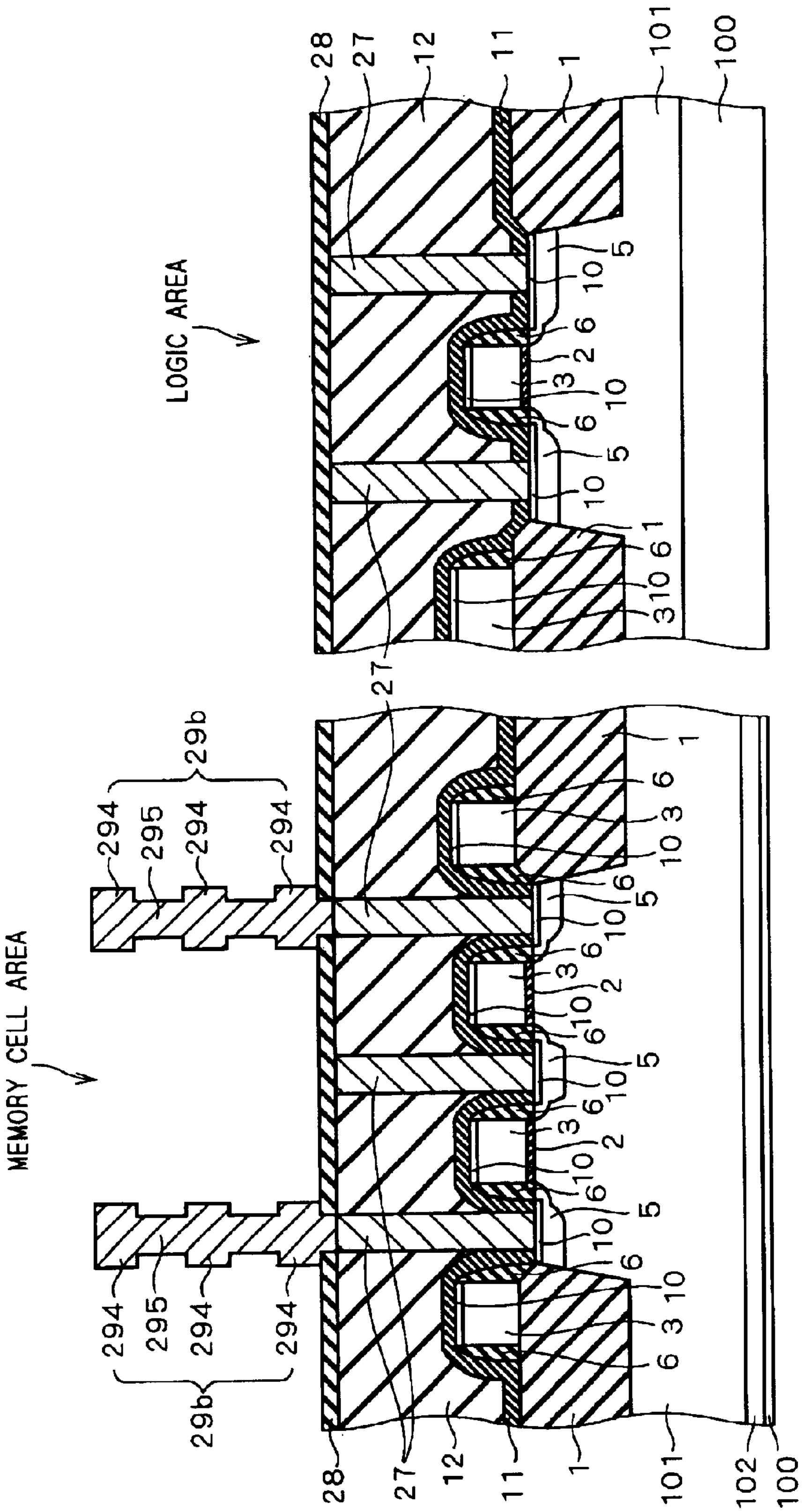
Figure 19:
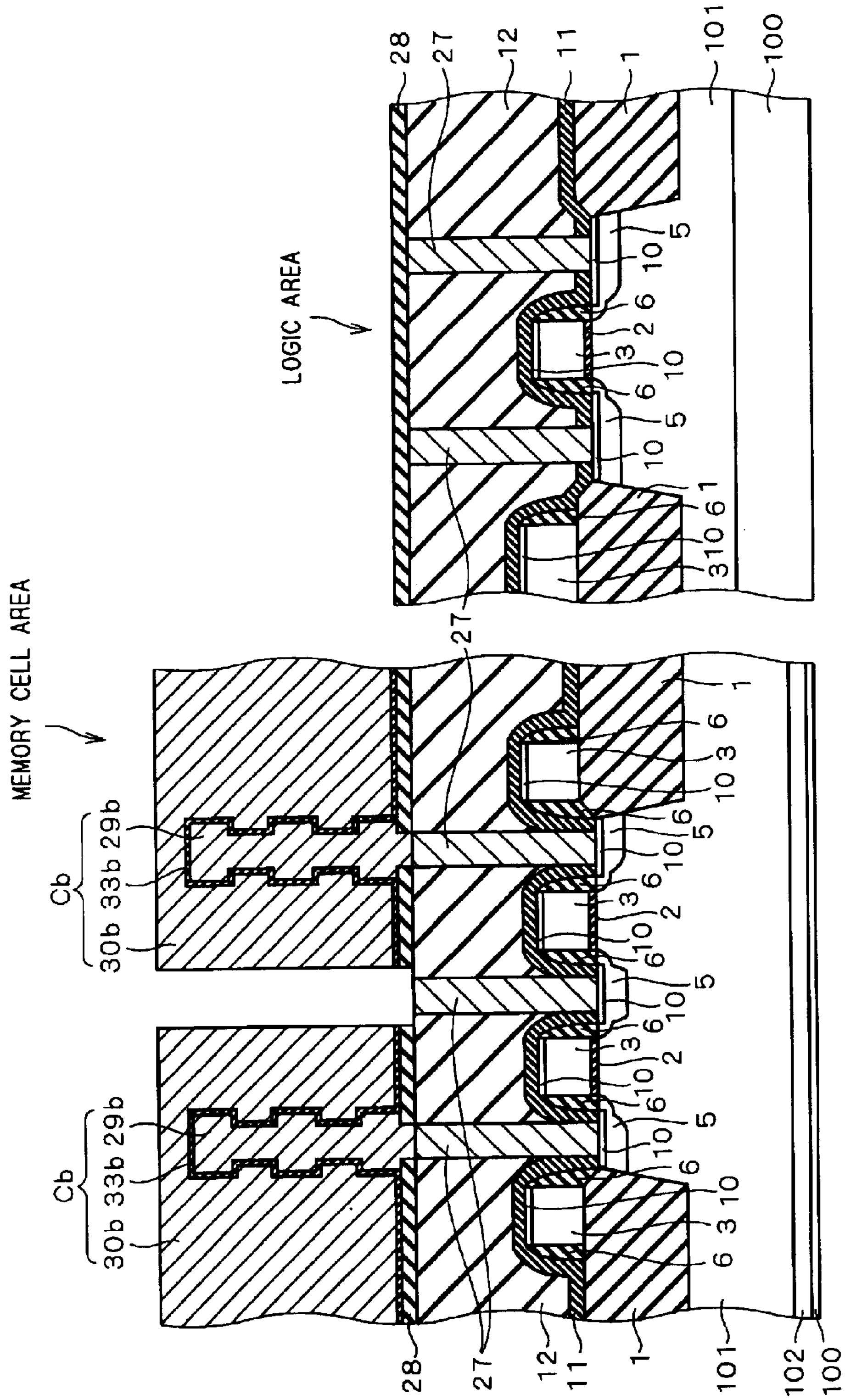

Next, a dielectric film (including tantalum pentoxide, for example) is entirely deposited from the upper side of the structure of FIG. 18. Further deposited thereon is a metal film including high melting point metal such as ruthenium, followed by patterning to form capacitor dielectric films 33*b* and upper electrodes 30*b*. As a result, capacitors Cb each including the upper electrode 30*b*, the lower electrode 29*b*, and the capacitor dielectric film 33*b* are obtained (FIG. 19). Both the capacitor dielectric film 33*b* and the upper electrode 30*b* are not formed in the logic area, nor over the middle one among the three contact metals 27 in the memory cell area.

Figure 20:
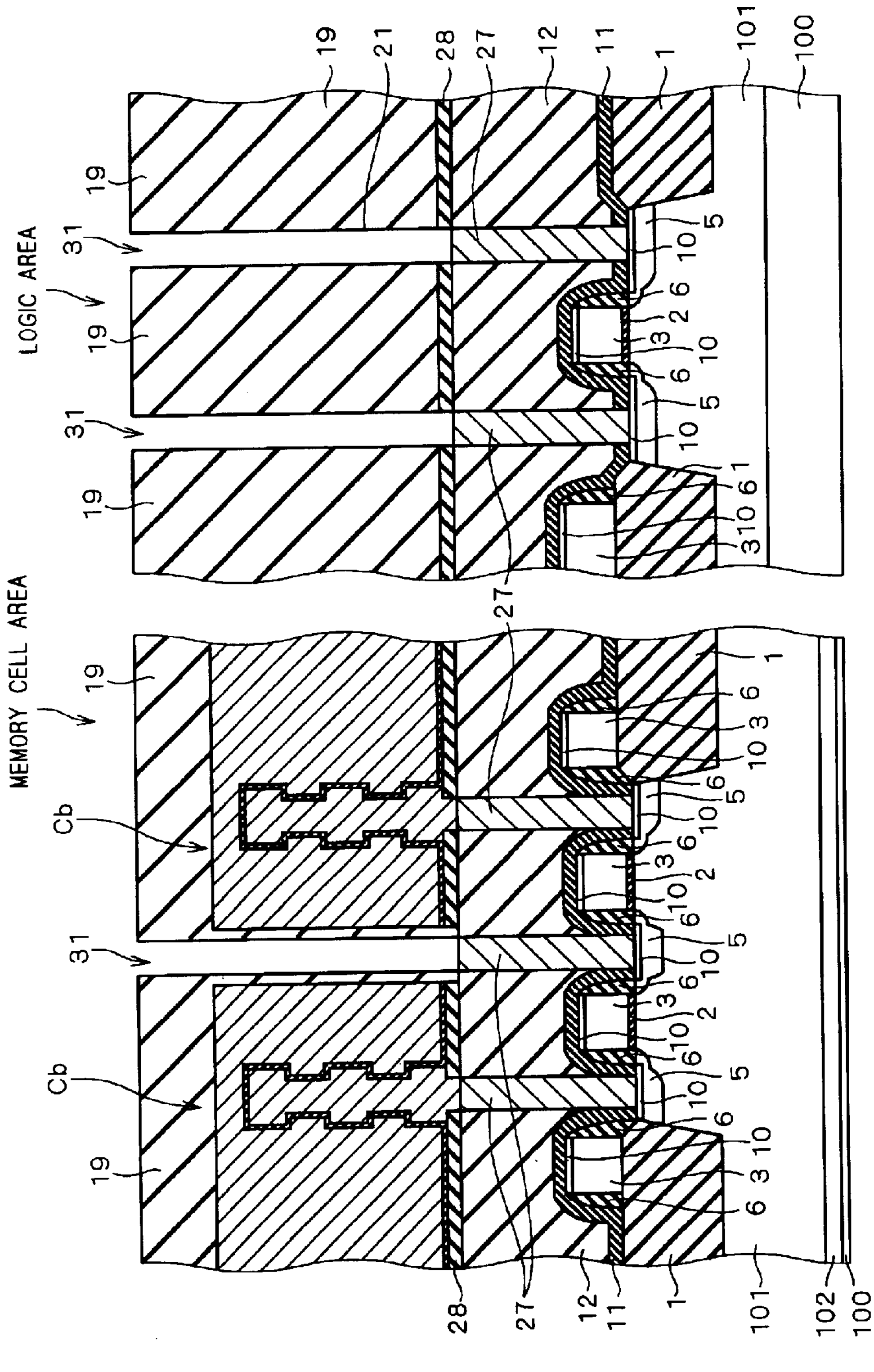
Figure 21:
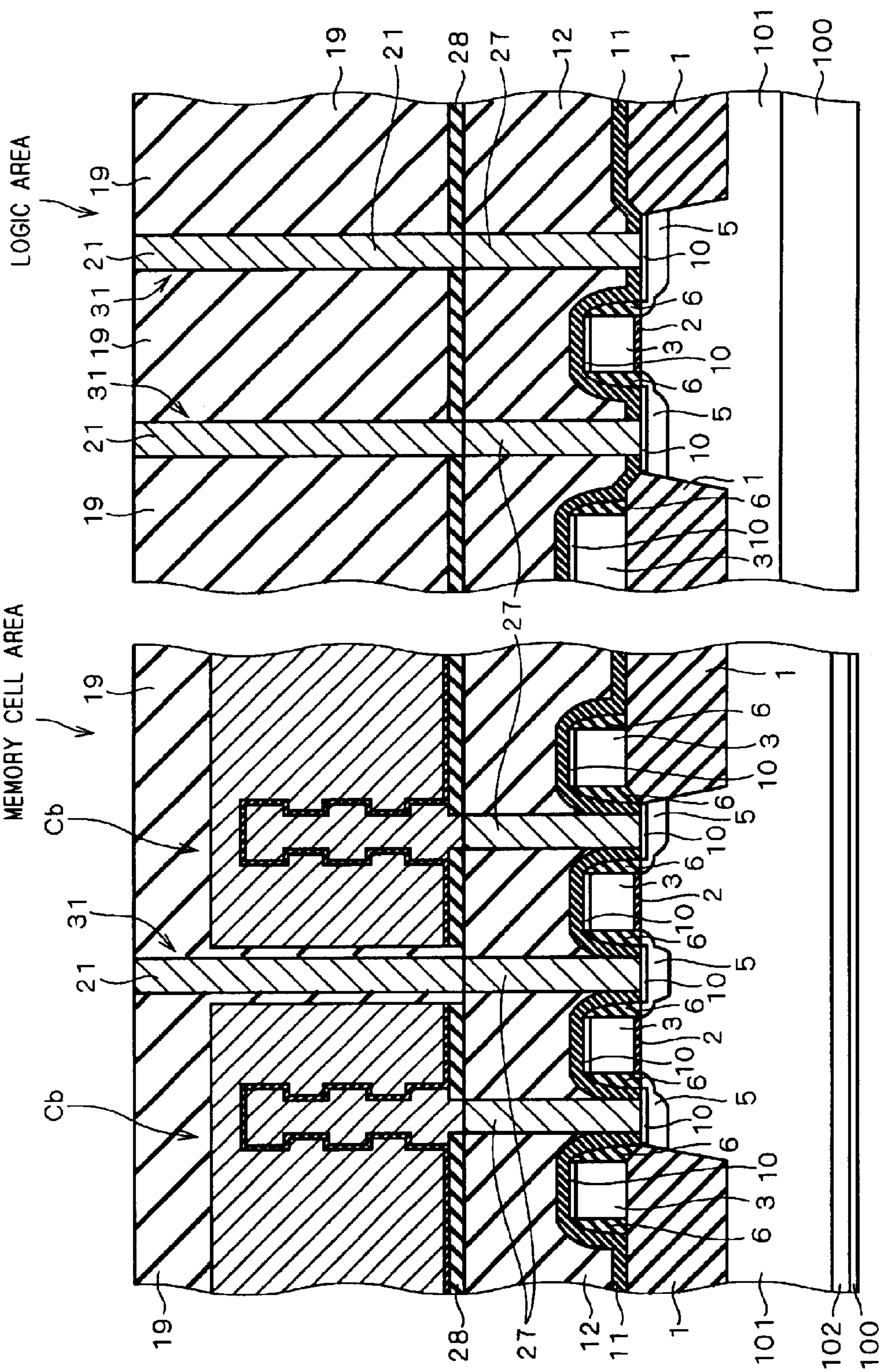

Thereafter, the steps shown in FIGS. 12 through 14 are also followed. The interlayer insulating film 19 is entirely deposited from the upper side of the structure of FIG. 19, followed by CMP to planarize the surface of the interlayer insulating film 19. The openings 31 are thereafter created to expose the contact metals 27 in the logic area, and the middle one among the three contact metals 27 in the memory cell area (FIG. 20). With regard to the formation of the opening 31, anisotropic etching is performed on the interlayer insulating film 19 using the silicon nitride film 28 as a stopper. The silicon nitride film 28 thereby exposed is then subjected to further etching. Overetching of the interlayer insulating film 19 is avoided accordingly in the formation of the opening 31. Although not shown, the opening 31 may be so created to expose the upper electrode 30*b*. Thereafter the openings 31 are filled with the contact metals 21 (FIG. 20).

As already described, the opening 32*b* is unlikely to expand at the bottom in the formation thereof. Therefore, the lower electrode 29*b* is prevented from being short-circuited with the gate electrode 3 or the source/drain region 5. Further, overetching of the interlayer insulating film 19 is avoided in the formation of the opening 31 using the silicon nitride film 28 as a stopper. Therefore, the contact metal 21 filling the opening 31 is also prevented from being short-circuited with the gate electrode 3 or the source/drain region 5.

The next step is formation of the interconnect lines 20 on the interlayer insulating film 19 to be connected to the contact metals 21, as shown in FIG. 22.

According to the second preferred embodiment, use of the fins 294 allows the increase in capacity of the capacitor Cb. Further, while being surrounded by the upper electrode 30*b*, the lower electrode 29*b* protrudes toward the upper electrode 30*b*. As compared with the structure where a lower electrode surrounds an upper electrode, it is allowed accordingly to easily form the lower electrode 29*b*.

Third Preferred Embodiment

Figure 23:
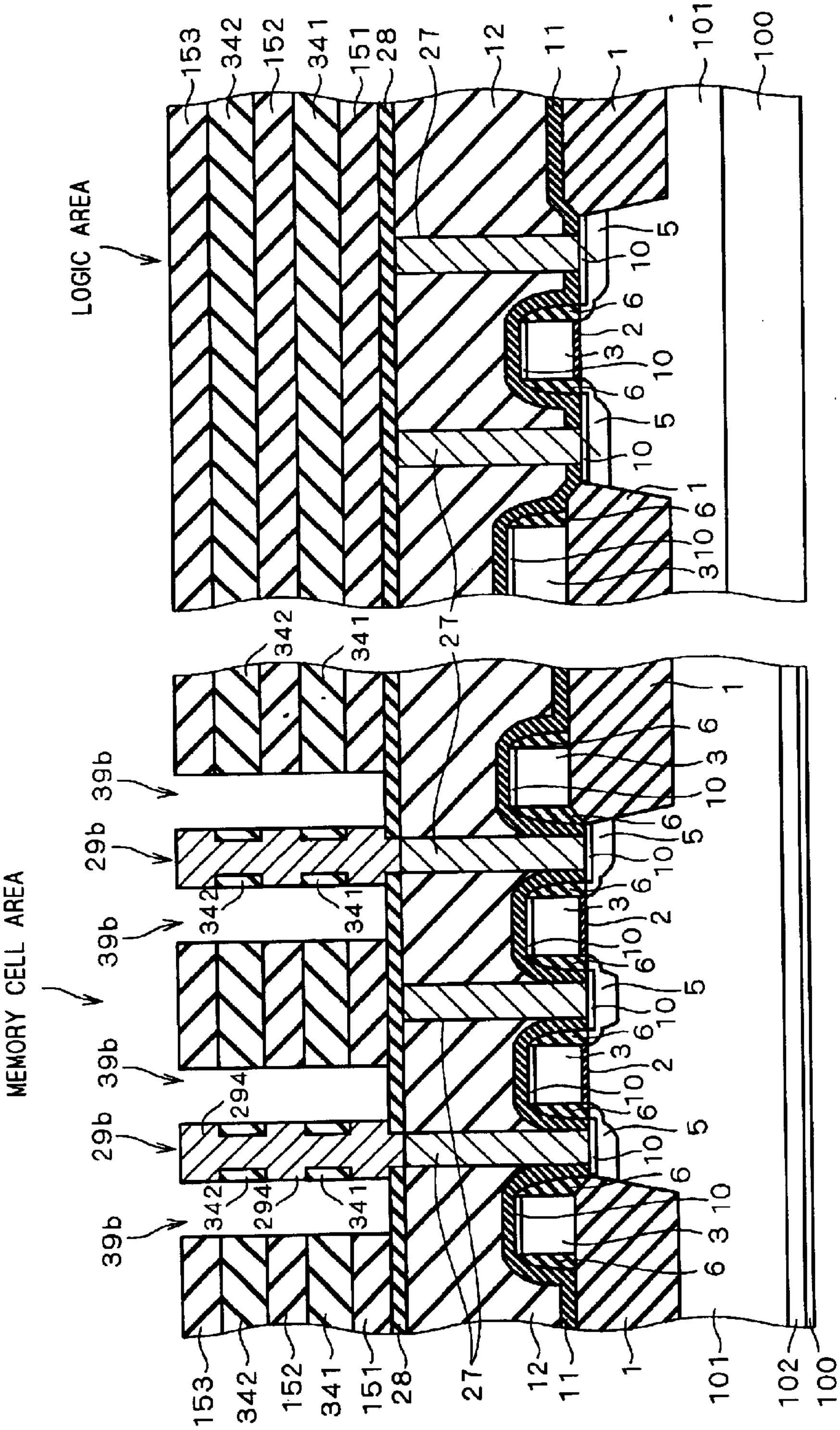

FIGS. 23 through 28 are sectional views illustrating a method of manufacturing a semiconductor device according to the third preferred embodiment of the present invention, following the order of manufacturing steps. First, following the same steps as those of the second preferred embodiment, the structure shown in FIG. 17 is obtained. Next, within certain areas around the lower electrodes 29*b*, the interlayer insulating films 151, 341, 152, 342 and 153 are selectively removed by anisotropic etching, for example. The resultant structure is as shown in FIG. 23, where openings 39*a* are created to surround the lower electrodes 29*b* (FIG. 23). The interlayer insulating films 151, 341, 152, 342 and 153 each may be a silicon oxide film, and the silicon nitride film 28 can easily be used as a stopper for this etching. After etching, the interlayer insulating films 151, 341, 152, 342 and 153 remain over the contact metal 27 which holds no lower electrode 29*b* thereover.

Subsequently, the silicon oxide films are etched to remove the interlayer insulating films 341 and 342 remaining between the fins 294 of the lower electrode 29*b*, whereby the structure shown in FIG. 24 is obtained. Wet etching may be performed using a photoresist as a mask which is so shaped to expose the uppermost fin 294 of the lower electrode 29*b*, whereby an etchant entering into the openings 39*a* removes the interlayer insulating films 341 and 342 remaining between the fins 294. In this etching, an etchant, which allows use of the silicon nitride film 28 as a stopper, can be easily selected. Similar to the formation of the opening 32*b* (see FIG. 16), the etching rate of the interlayer insulating films 151, 152 and 153 may be higher relative to the silicon nitride film 28, as well as to the interlayer insulating films 341 and 342. After etching, the openings 39*a* expand accordingly, which are hereinafter referred to as openings 39*b*. As seen from FIG. 24, at the openings 30*b*, the interlayer insulating films 151, 152 and 153 have recessed end surfaces relative to the interlayer insulating films 341 and 342 when viewed from the lower electrode 29*d*. In contrast to the opening 32*b*, such expansion is not inevitably required for the opening 39*b*.

Figure 25:
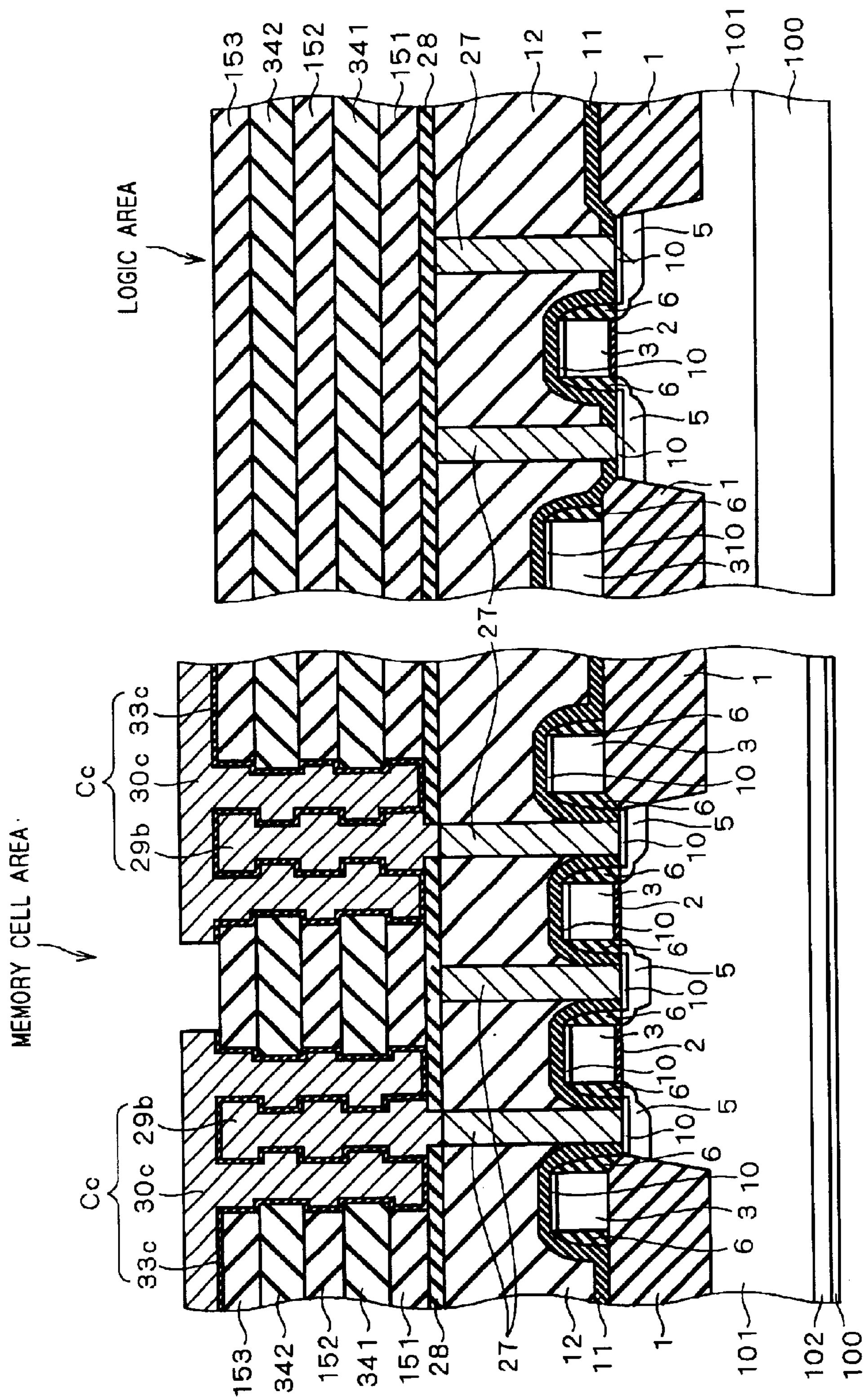

Following the same steps as those of the second preferred embodiment, a dielectric film (including tantalum pentoxide, for example) is entirely deposited from the upper side of the structure of FIG. 24. Further deposited thereon is a metal film including high melting point metal such as ruthenium, followed by patterning to form capacitor dielectric films 33*c* and upper electrodes 30*c*. As a result, capacitors Cc each including the upper electrode 30*c*, the lower electrode 29*b*, and the capacitor dielectric film 33*c* are obtained (FIG. 25). In the opening 39*b*, the capacitor dielectric film 33*c* and the upper electrode 30*c* are stacked in this order, relative to the lower electrode 29*b*. Both the capacitor dielectric film 33*c* and the upper electrode 30*c* are not formed in the logic area, nor over the middle one among the three contact metals 27 in the memory cell area.

Figure 26:
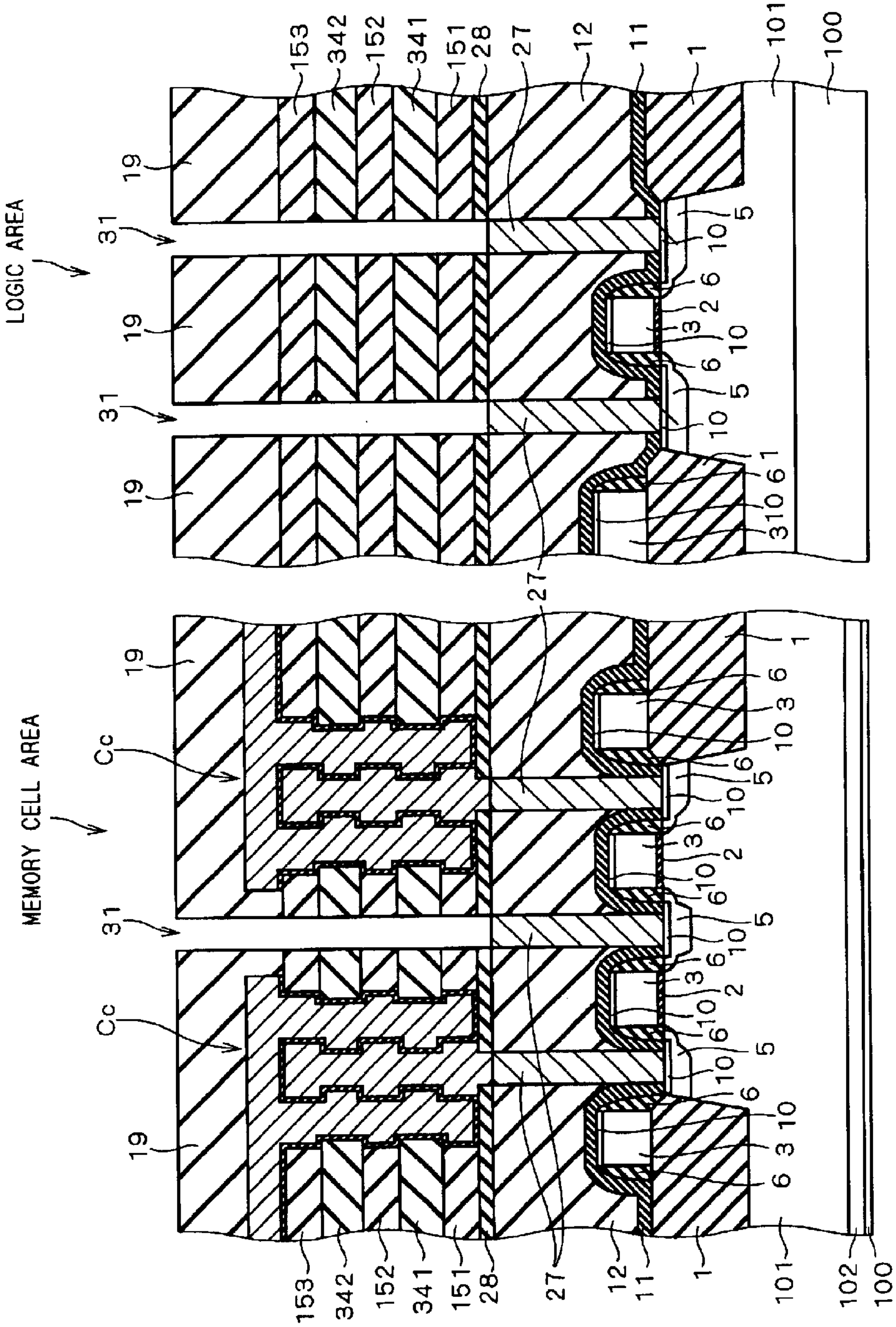
Figure 27:
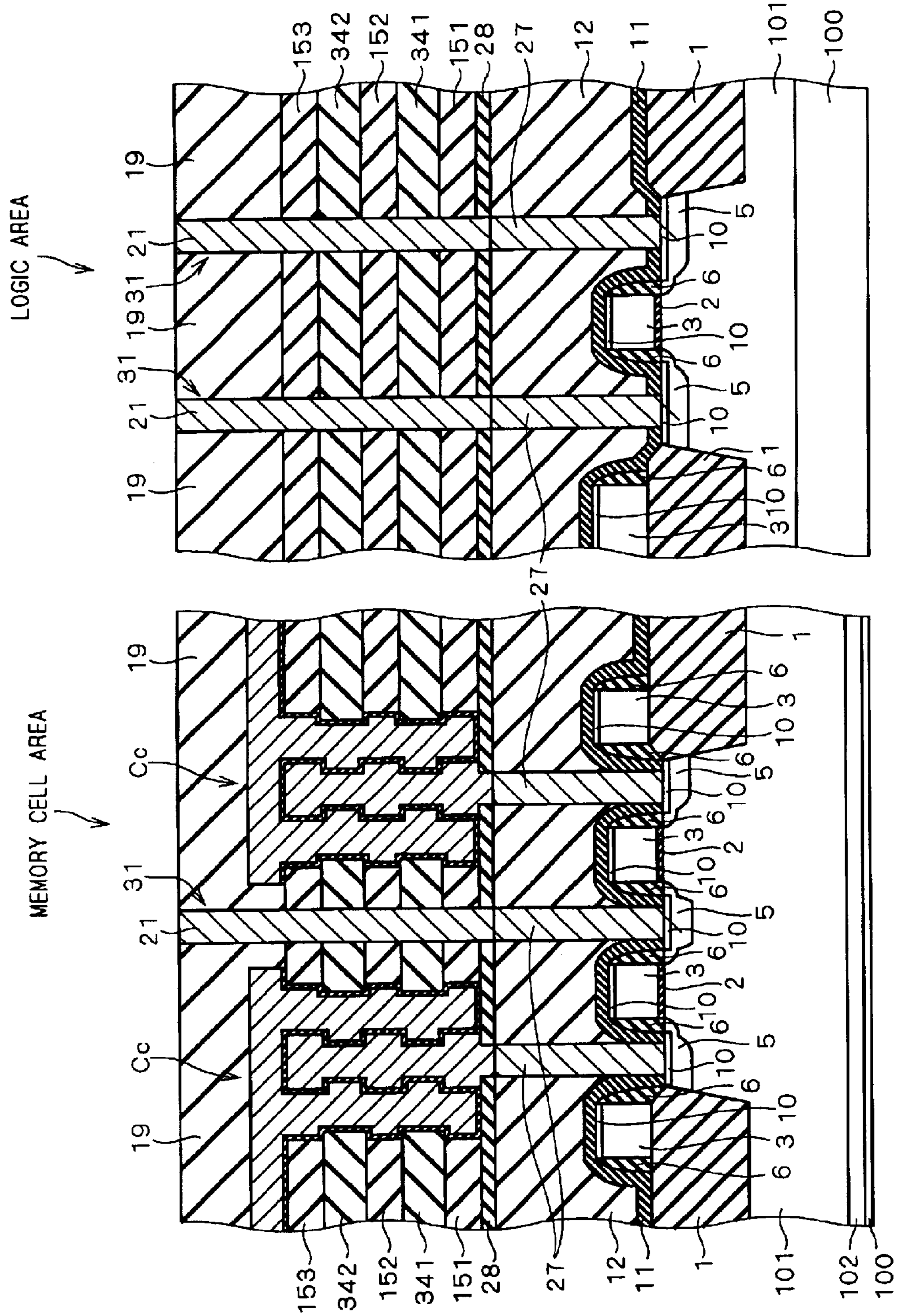

Next, the interlayer insulating film 19 is entirely deposited from the upper side of the structure of FIG. 25, followed by CMP to planarize the surface of the interlayer insulating film 19. The openings 31 are thereafter created to expose the contact metals 27 in the logic area, and the middle one among the three contact metals 27 in the memory cell area (FIG. 26). Although not shown, the opening 31 may be so created to expose the upper electrode 30*c*. Thereafter the openings 31 are filled with the contact metals 21 (FIG. 27).

With regard to the formation of the opening 31, anisotropic etching is performed on the interlayer insulating film 19 using the silicon nitride film 28 as a stopper. The silicon nitride film 28 is thereafter subjected to further etching. Overetching of the interlayer insulating film 19 is avoided accordingly. Therefore, the contact metal 21 filling the opening 31 is prevented from being short-circuited with the gate electrode 3 or the source/drain region 5.

Figure 28:
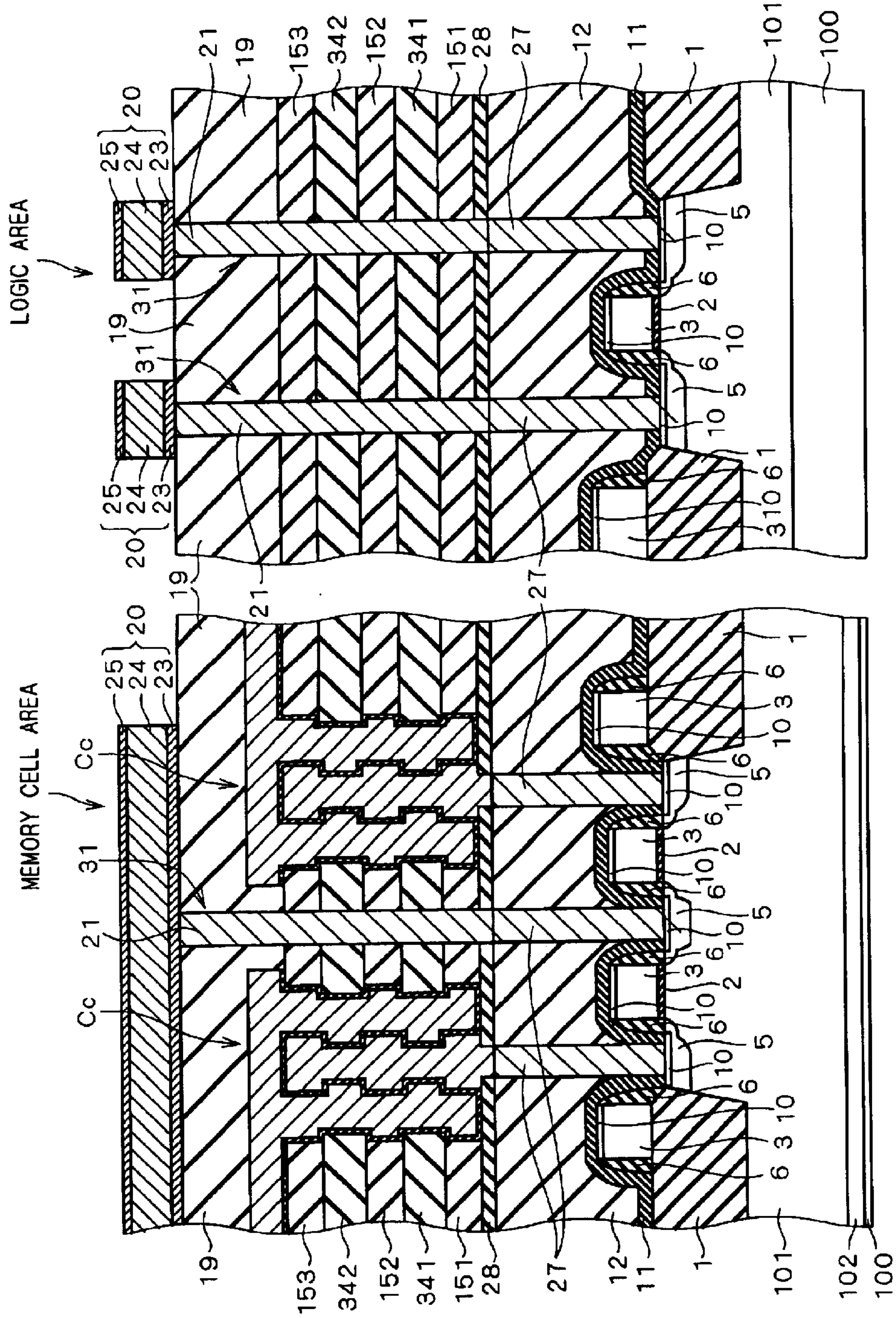

The next step is formation of the interconnect lines 20 on the interlayer insulating film 19 to be connected to the contact metals 21, as shown in FIG. 28.

As described so far, the third preferred embodiment realizes the same effect as obtained in the second preferred embodiment. Further, in the formation of the lower electrode 29*b*, the interlayer insulating films 151, 341, 152, 342 and 153 remain, while removed for creating the openings 39*b*. This means that good flatness is provided, to easily perform the subsequent steps with high precision, such as patterning for forming the capacitor dielectric film 33*c* and the upper electrode 30*c*.

The openings 39*b* is also unlikely to expand at the bottom in the formation thereof. Therefore, the upper electrode 30*c* is prevented from being short-circuited with the gate electrode 3 or the source/drain region 5.

Fourth Preferred Embodiment

Figure 29:
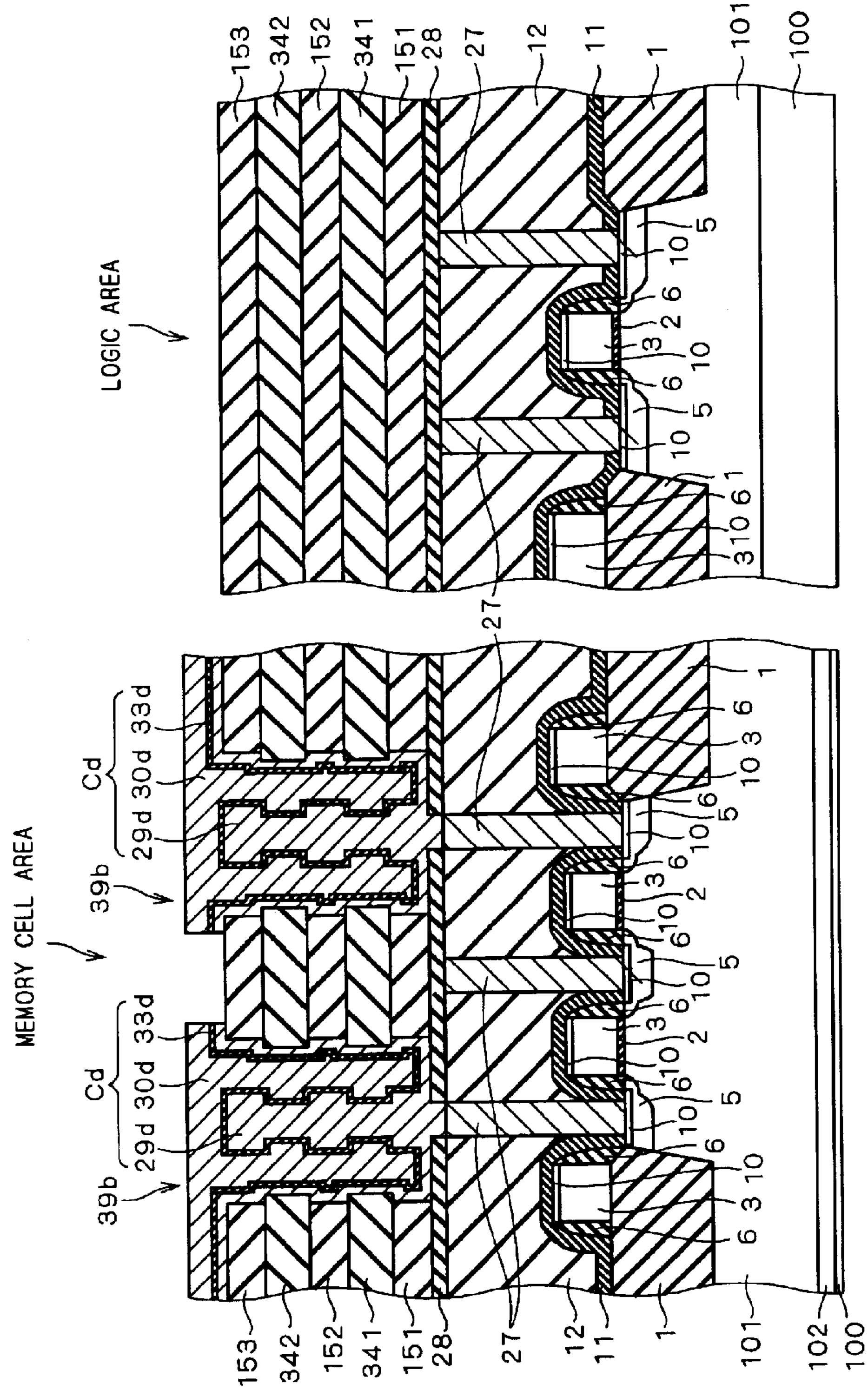
FIGS. 29 through 32 are sectional views illustrating a method of manufacturing a semiconductor device according to a fourth preferred embodiment of the present invention, following the order of manufacturing steps.

FIGS. 29 through 32 are sectional views illustrating a method of manufacturing a semiconductor device according to the fourth preferred embodiment of the present invention, following the order of manufacturing steps. First, following the same steps as those of the third preferred embodiment, the structure shown in FIG. 24 is obtained. Next, a metal film including high melting point metal (such as ruthenium), a dielectric film (including tantalum penoxide, for example), and a metal film including high melting point metal (such as ruthenium), are deposited in this order. The next step is patterning to shape these films into lower electrodes 29*d*, capacitor dielectric films 33*d*, and upper electrodes 30*d*, respectively. In the opening 39*b*, the metal film to be a part of the lower electrode 39*b*, the capacitor dielectric film 33*d*, and the upper electrode 30*d* are thereby stacked in this order, relative to the lower electrode 29*b* (FIG. 24), and to the interlayer insulating films 151, 341, 152, 342 and 153. As a result, capacitors Cd each including the upper electrode 30*d*, the lower electrode 29*d*, and the capacitor dielectric film 33*d* are obtained (FIG. 29). The upper electrode 30*d*, the lower electrode 29*d*, and the capacitor dielectric film 33*d* are not formed in the logic area, nor over the middle one among the three contact metals 27 in the memory cell area. The lower electrode 29*d* includes the lower electrode 29*b* shown in FIG. 24, and the metal film on the side surfaces of the openings 39*b* which has been deposited prior to deposition of the dielectric film. Therefore, the extensive surface area of the capacitor dielectric film 33*d* is provided, leading to the increase in electrostatic capacity of the capacitor Cd.

The fourth preferred embodiment especially benefits from the structure where at the opening 39*b*, the interlayer insulating films 151, 152 and 153 have recessed end surfaces relative to the interlayer insulating films 341 and 342 when viewed from the lower electrode 29*d*. This is because the metal film provided on the side surface of the opening 39*b* is allowed to have an increased surface area, contributing to the increase in electrostatic capacity of the capacitor Cd.

Figure 30:
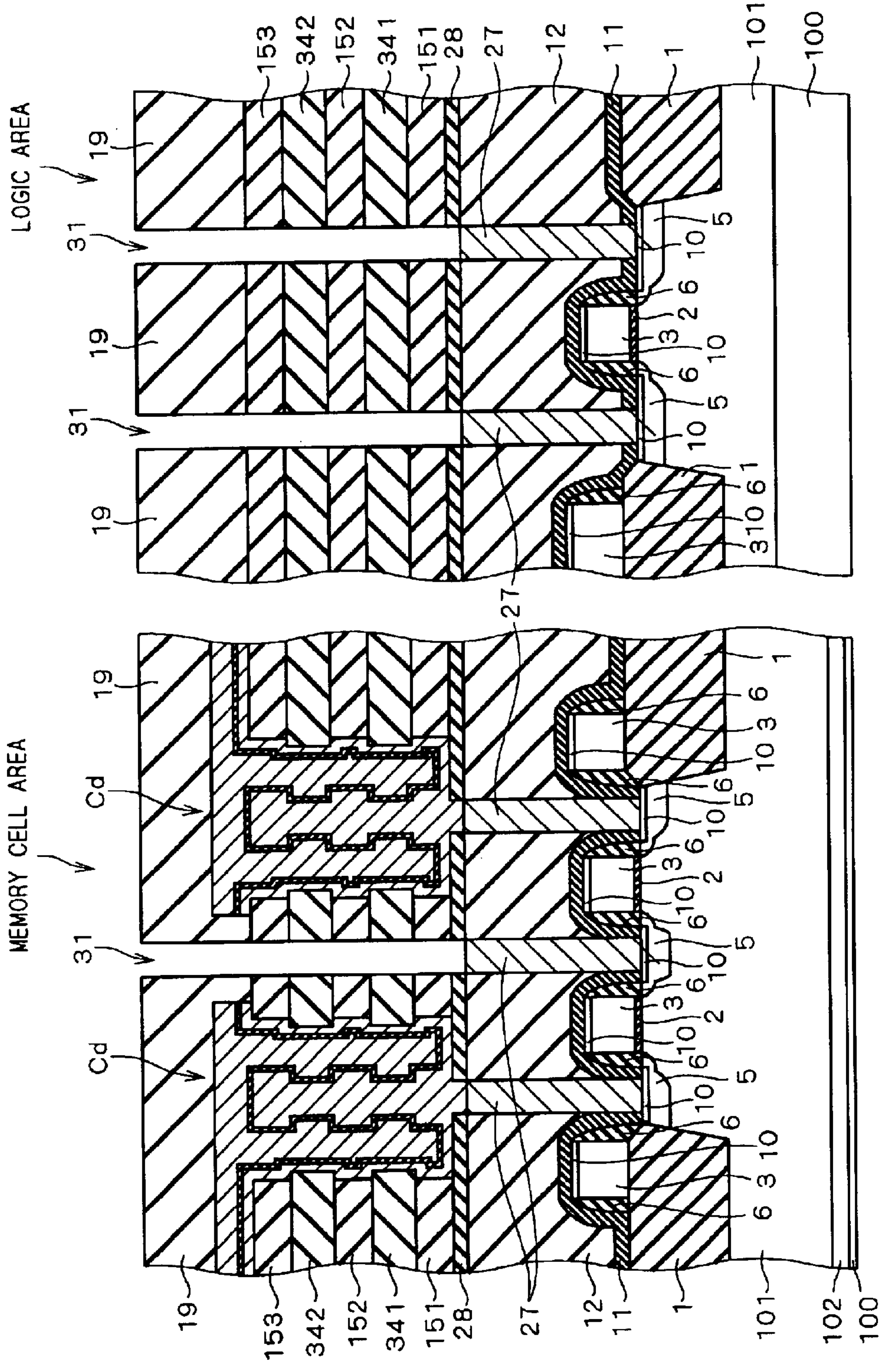
Figure 31:
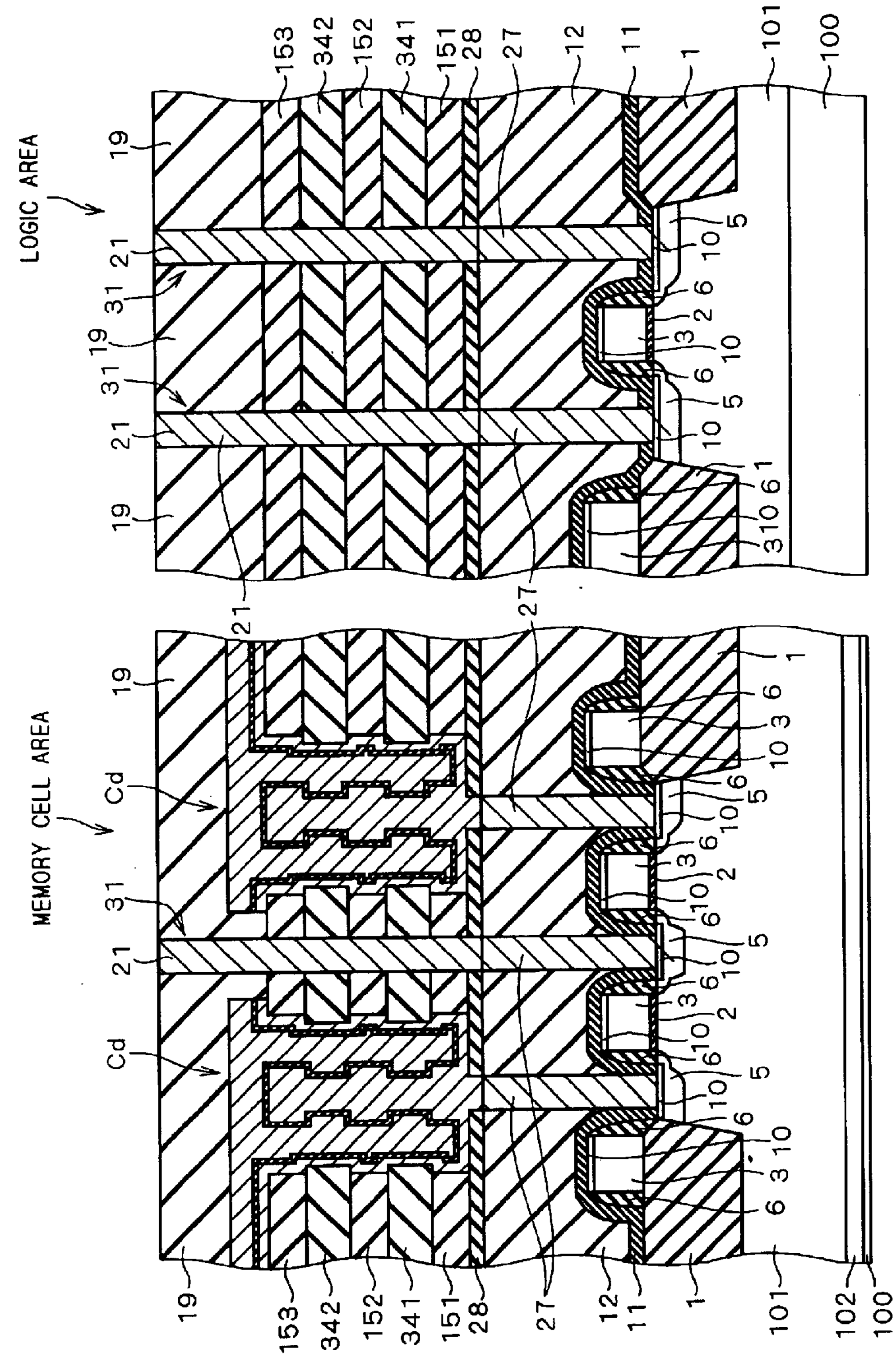
Figure 32:
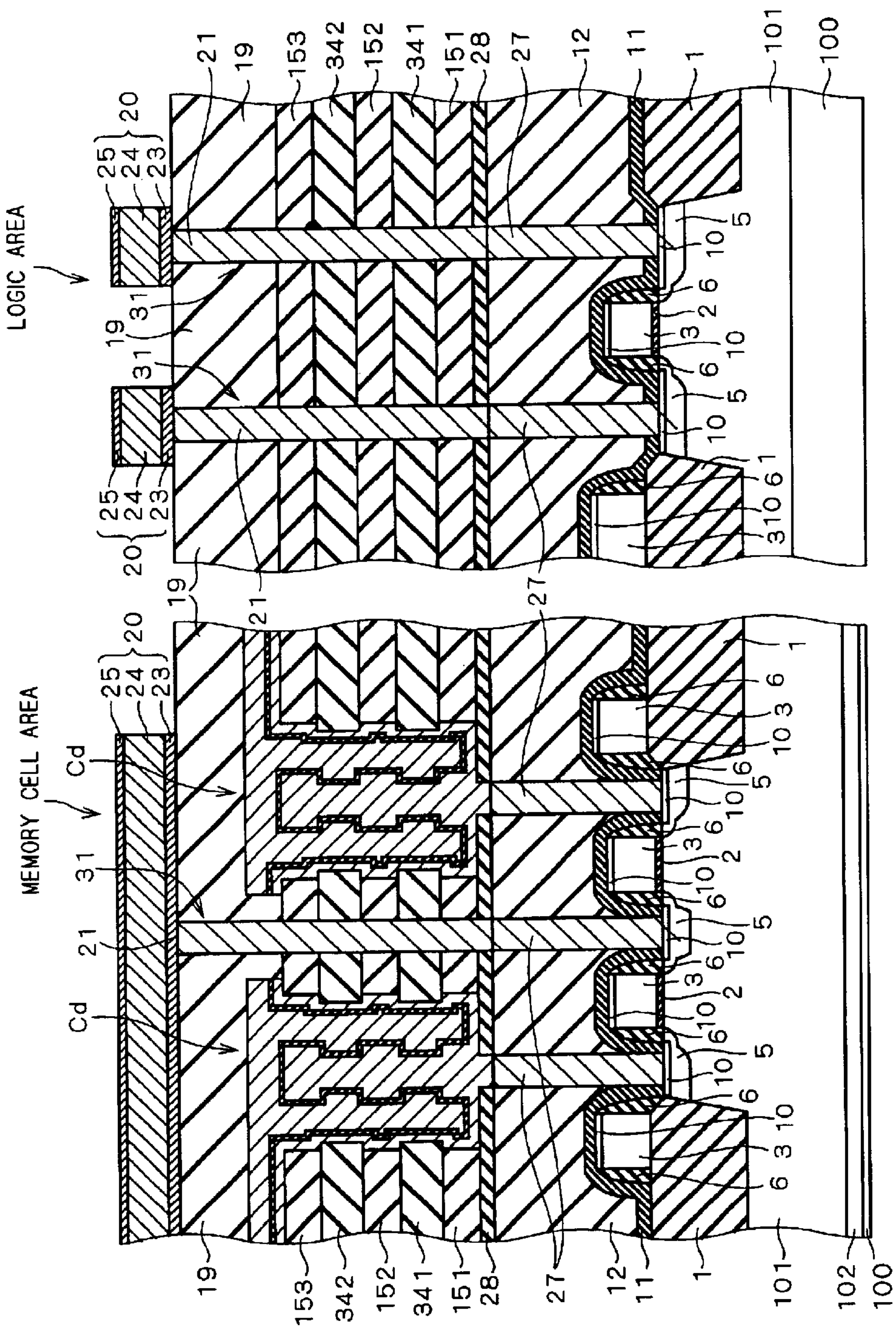

Next, the interlayer insulating film 19 is entirely deposited from the upper side of the structure of FIG. 29, followed by CMP to planarize the surface of the interlayer insulating film 19. The openings 31 are thereafter created to expose the contact metals 27 in the logic area, and the middle one among the three contact metals 27 in the memory cell area (FIG. 30). Although not shown, the opening 31 may be so created to expose the upper electrode 30*d*. Thereafter the openings 31 are filled with the contact metals 21 (FIG. 31). With regard to the formation of the opening 31, use of the silicon nitride film 28 as a stopper prevents overetching of the interlayer insulating film 19. Therefore, the contact metal 21 filling the opening 31 is prevented from being short-circuited with the gate electrode 3 or the source/drain region 5. Thereafter, the interconnect lines 20 are formed on the interlayer insulating film 19 to be connected to the contact metals 21, as shown in FIG. 32.

The fourth preferred embodiment realizes the same effect as obtained in the third preferred embodiment, except that it requires two deposition steps of the metal films to form the lower electrode 29*d*. Further, the fourth preferred embodiment characteristically improves electrostatic capacity.

Fifth Preferred Embodiment

Figure 33:
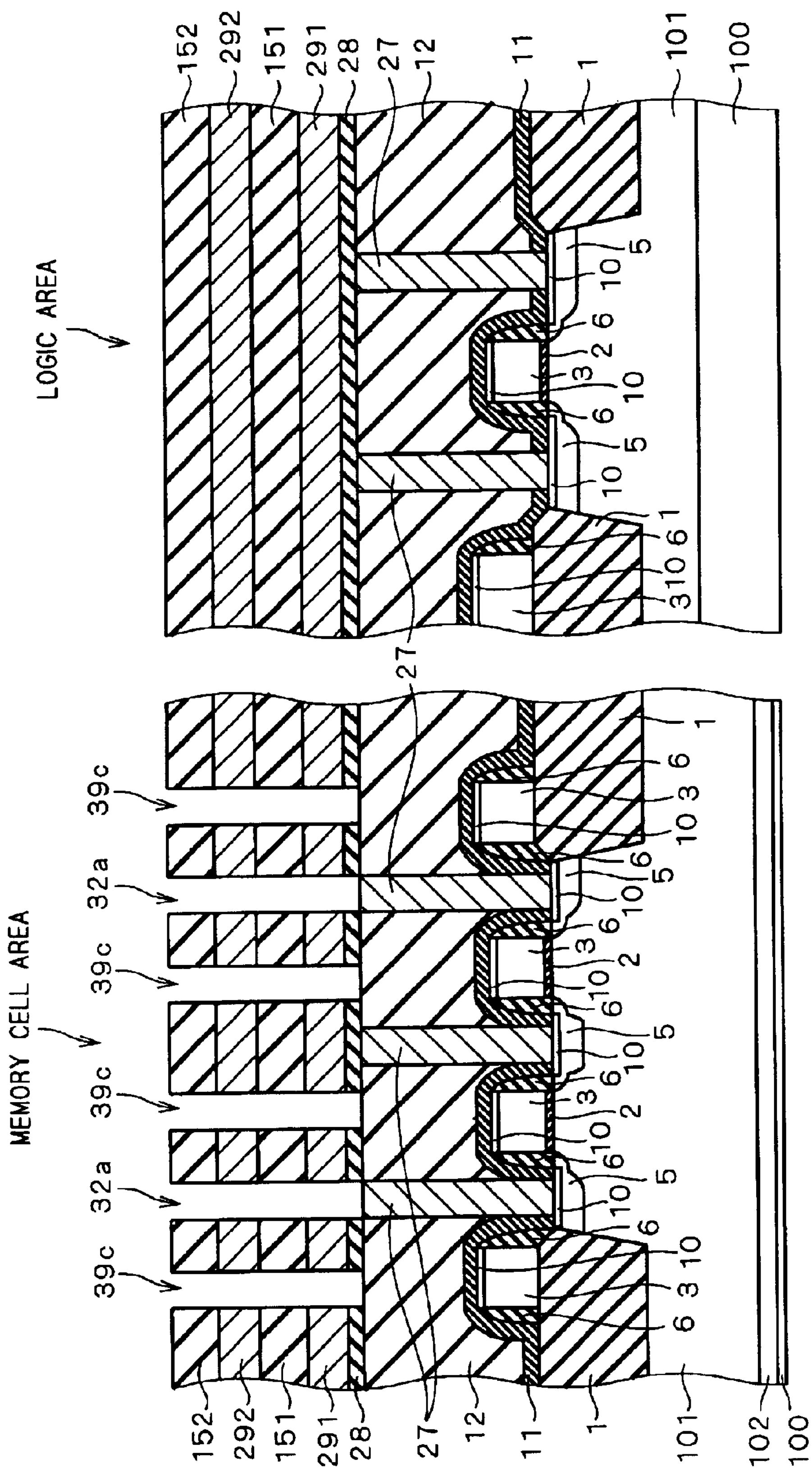
Figure 34:
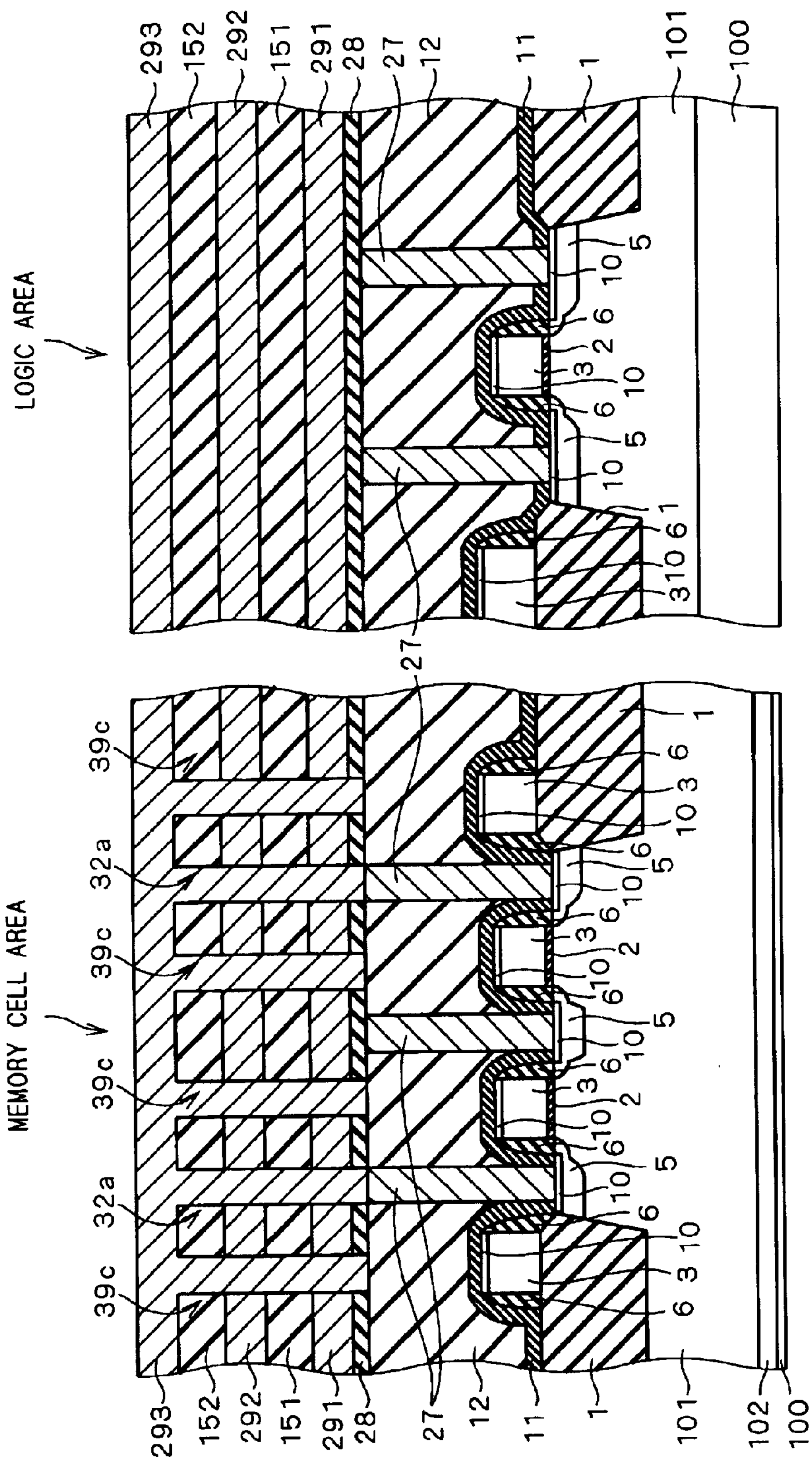
Figure 35:
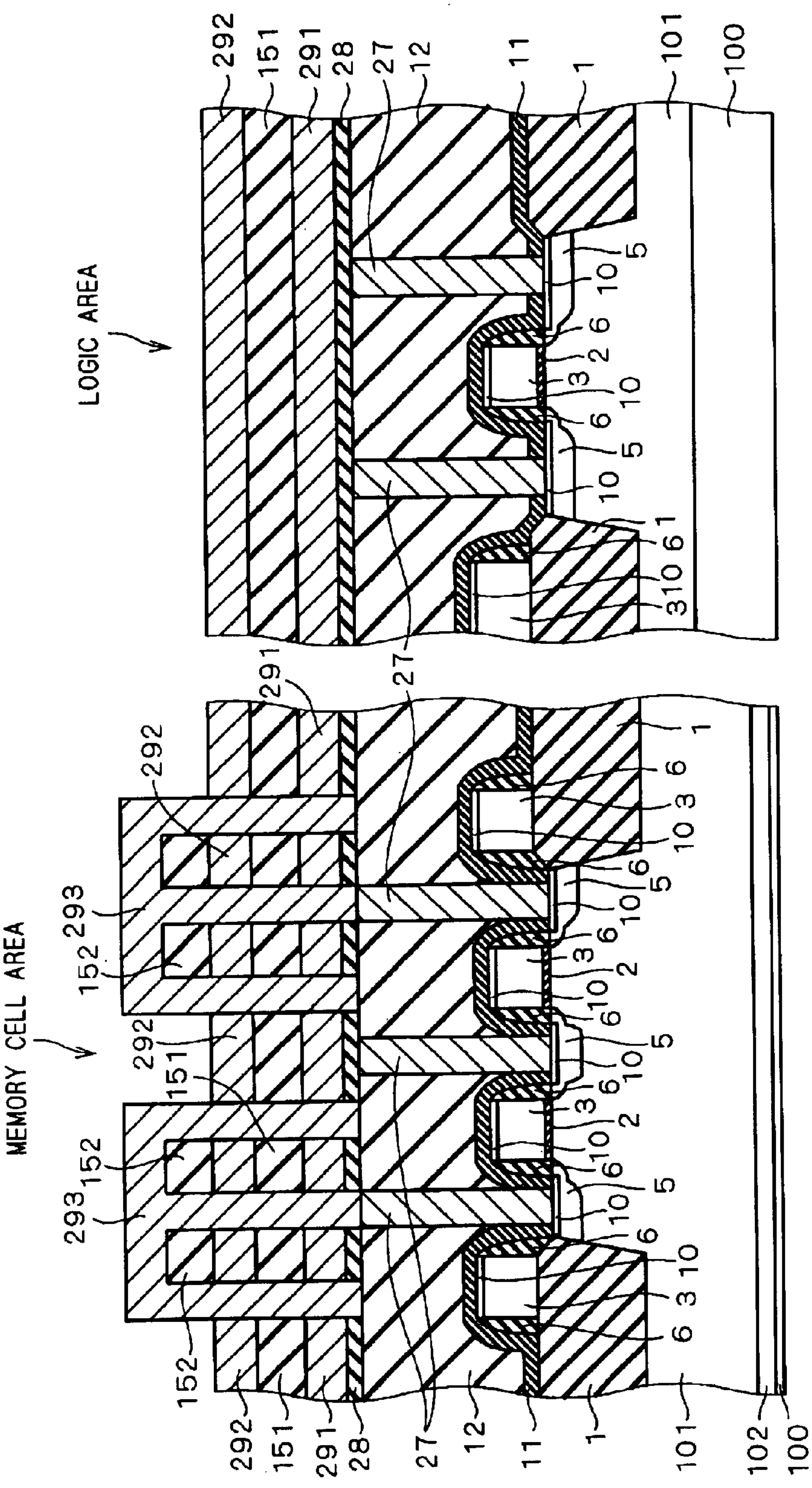
Figure 36:
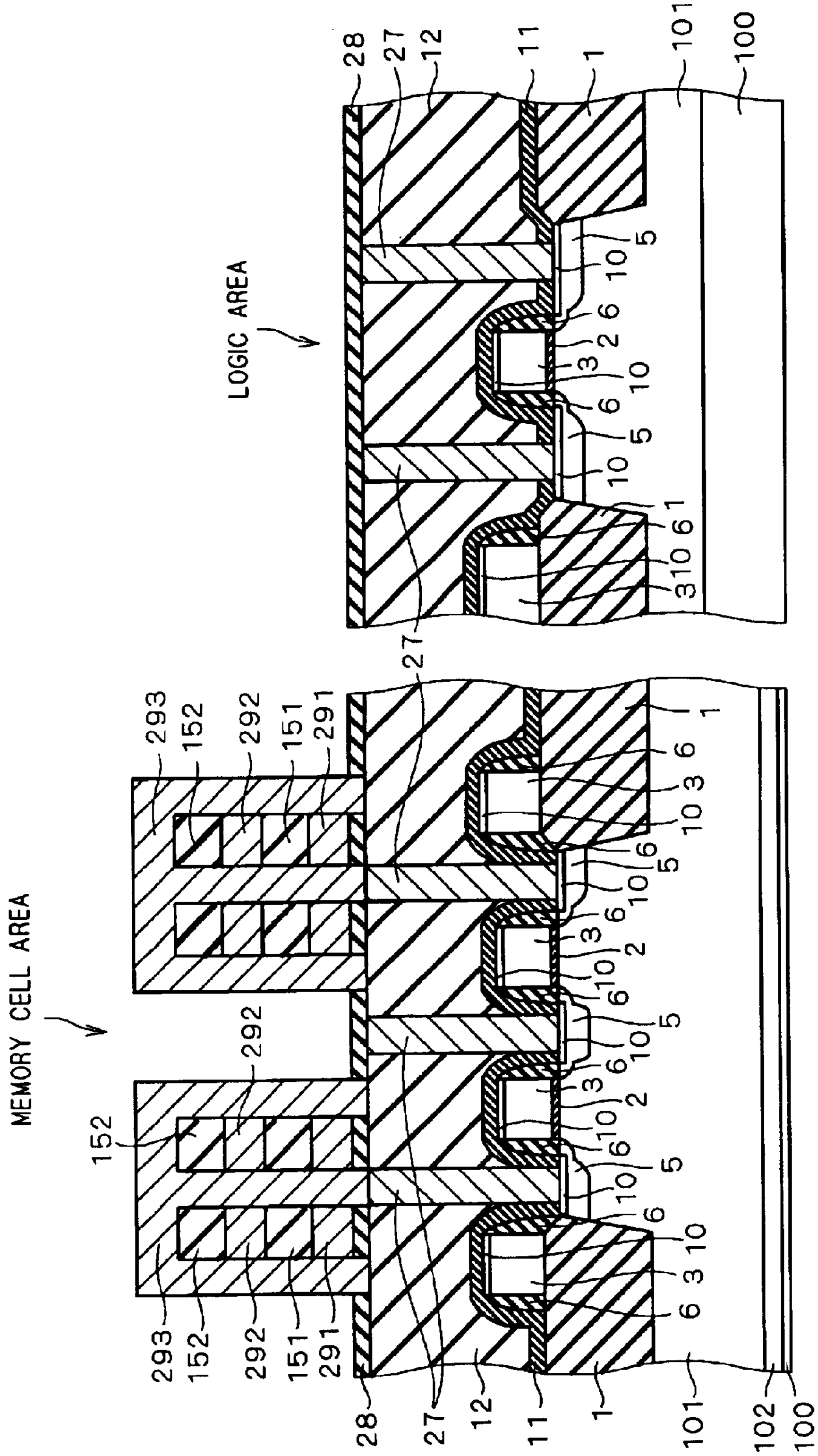

FIGS. 33 through 41 are sectional views illustrating a method of manufacturing a semiconductor device according to the fifth preferred embodiment of the present invention, following the order of manufacturing steps. First, following the same steps as those of the first preferred embodiment, the structure shown in FIG. 7 is obtained. Next, the metal film 291, the interlayer insulating film 151, the metal film 292, and the interlayer insulating film 152 are entirely deposited in this order from the upper side of the structure of FIG. 7. Thereafter, the openings 32*a* are created to expose the contact metal 27 to hold a to-be-formed lower electrode thereon. Further provided are openings 39*c* around the openings 32*a* (FIG. 33). The openings 32*a* and 39*c* can be created by the same etching step. After etching, the interlayer insulating films 151 and 152, and the metal films 291 and 292 remain over the contact metal 27 which is subjected to no exposure by the opening 32*a*. Following the steps described so far, the structure shown in FIG. 33 is obtained.

Subsequently, the metal film 293 is entirely deposited from the upper side of the structure of FIG. 33. While filling the openings 32*a* and 39*c*, the metal film 293 covers the interlayer insulating film 152.

Using a photoresist so shaped to cover a region extending between the openings 32*a* and 39*c*, the metal film 293 is thereafter etched. Further etched is the interlayer insulating film 152 using a mask of the same shape, to reach the structure of FIG. 35. Using a mask of the same shape, the metal film 292, the interlayer insulating film 151, and the metal film 291 are thereafter sequentially etched, to reach the structure of FIG. 36. At this stage, the interlayer insulating films 152 and 151 remain. The former is surrounded by the remaining metal films 292 and 293, and the latter is surrounded by the remaining metal films 291, 292 and 293.

Figure 37:
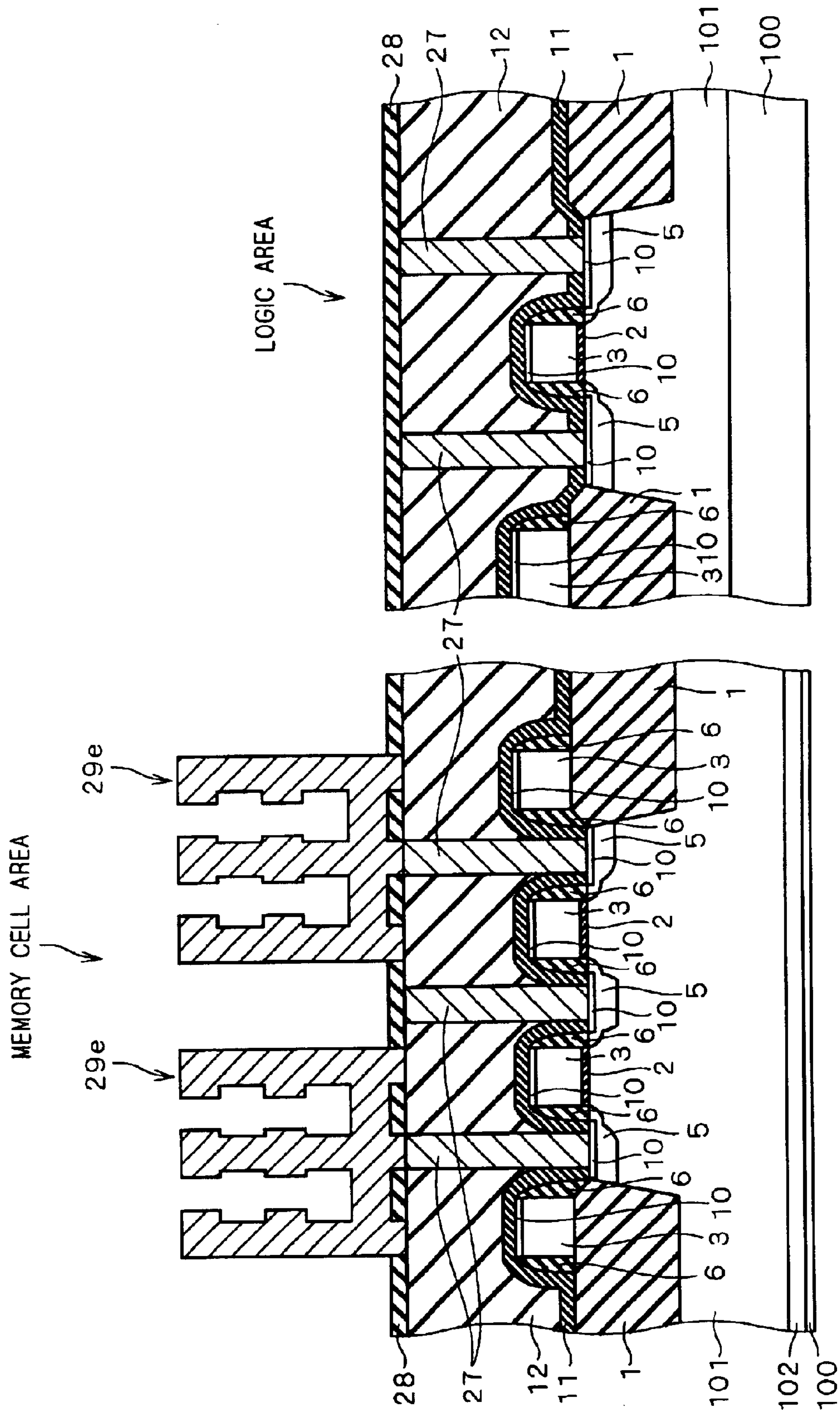

Using a photoresist as a mask having an opening above the remaining interlayer insulating film 152, the metal film 293, the interlayer insulating film 152, the metal film 292, the interlayer insulating film 151, and the metal film 291 are sequentially etched. As a result of this etching, the interlayer insulating films 151 and 152 are removed. The remaining metal films 291, 292 and 293 form lower electrodes 29*e* (FIG. 37). A mask used in this etching is smaller in size than the remaining interlayer insulating film 152, in a horizontal direction in the plane of the drawing. Therefore, fins can be provided to the lower electrodes 29*e*. Two fins arranged in the vertical direction are illustratively shown in FIG. 37. Alternatively, more than two fins may be provided by increasing the number of interlayer insulating films and metal films which together form alternate layers as described with reference to FIG. 33. A to-be-formed capacitor will grow in electrostatic capacity by the increase in the number of its fins.

Figure 38:
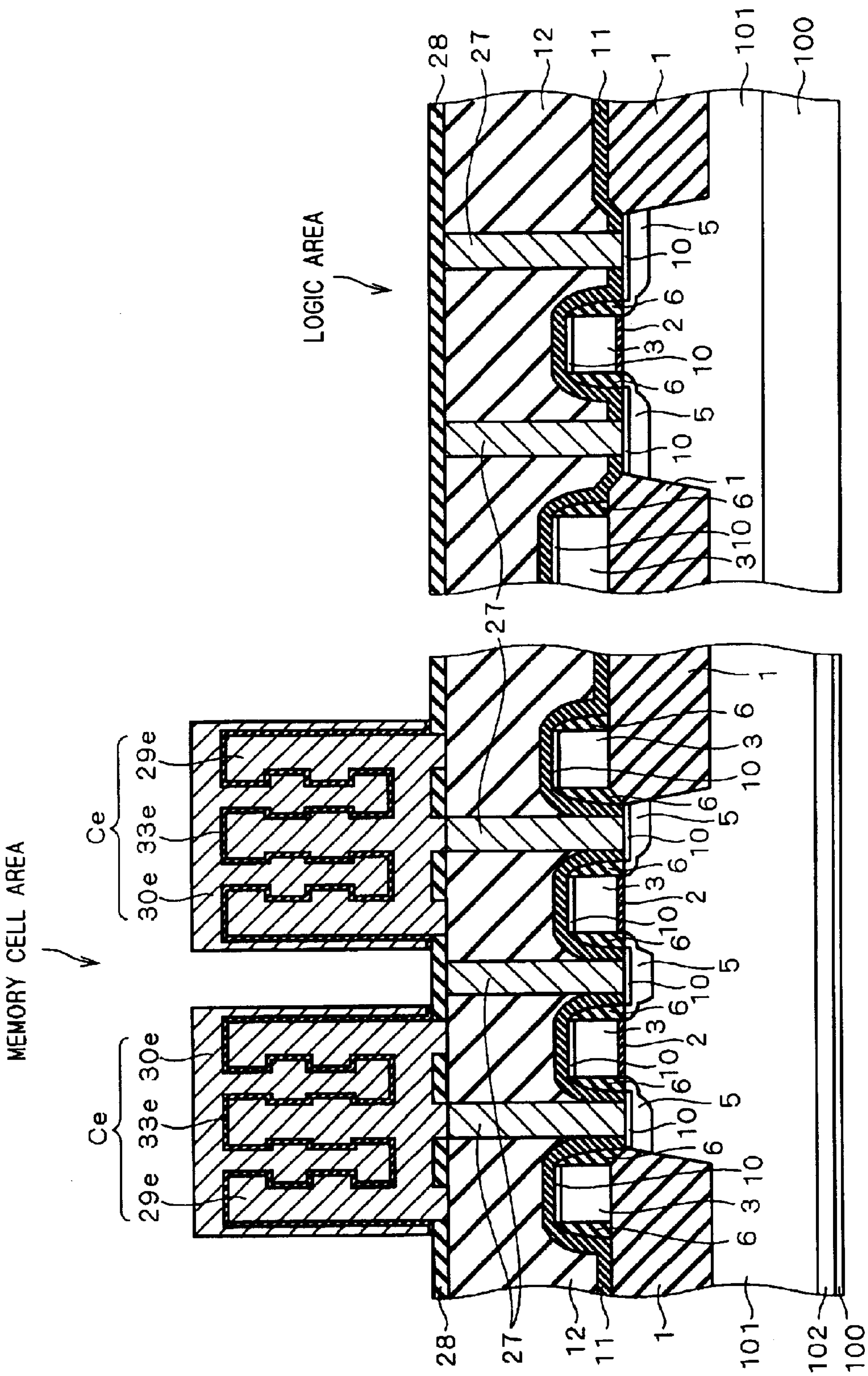

Following the same steps as those of the second preferred embodiment, a dielectric film (including tantalum penoxide, for example) is entirely deposited from the upper side of the structure of FIG. 37. Further deposited thereon is a metal film including high melting point metal such as ruthenium, followed by patterning to form capacitor dielectric films 33*e* and upper electrodes 30*e*. As a result, capacitors Ce each including the upper electrode 30*e*, the lower electrode 29*e*, and the capacitor dielectric film 33*e* are obtained (FIG. 38). Both the capacitor dielectric film 33*e* and the upper electrode 30*e* are not formed in the logic area, nor over the middle one among the three contact metals 27 in the memory cell area (that is, the contact metal 27 holding no opening 32*a* thereover).

Figure 39:
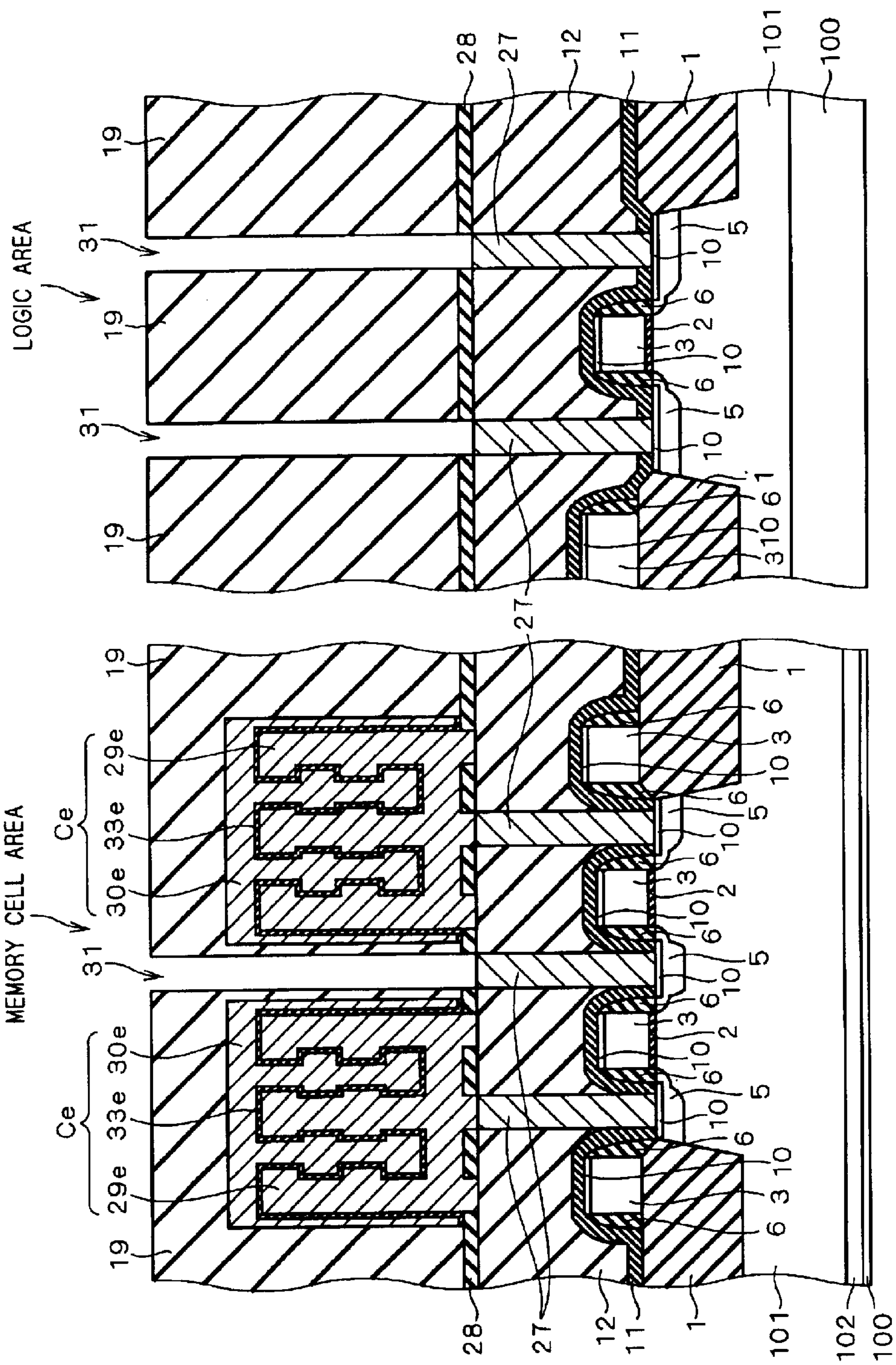
Figure 40:
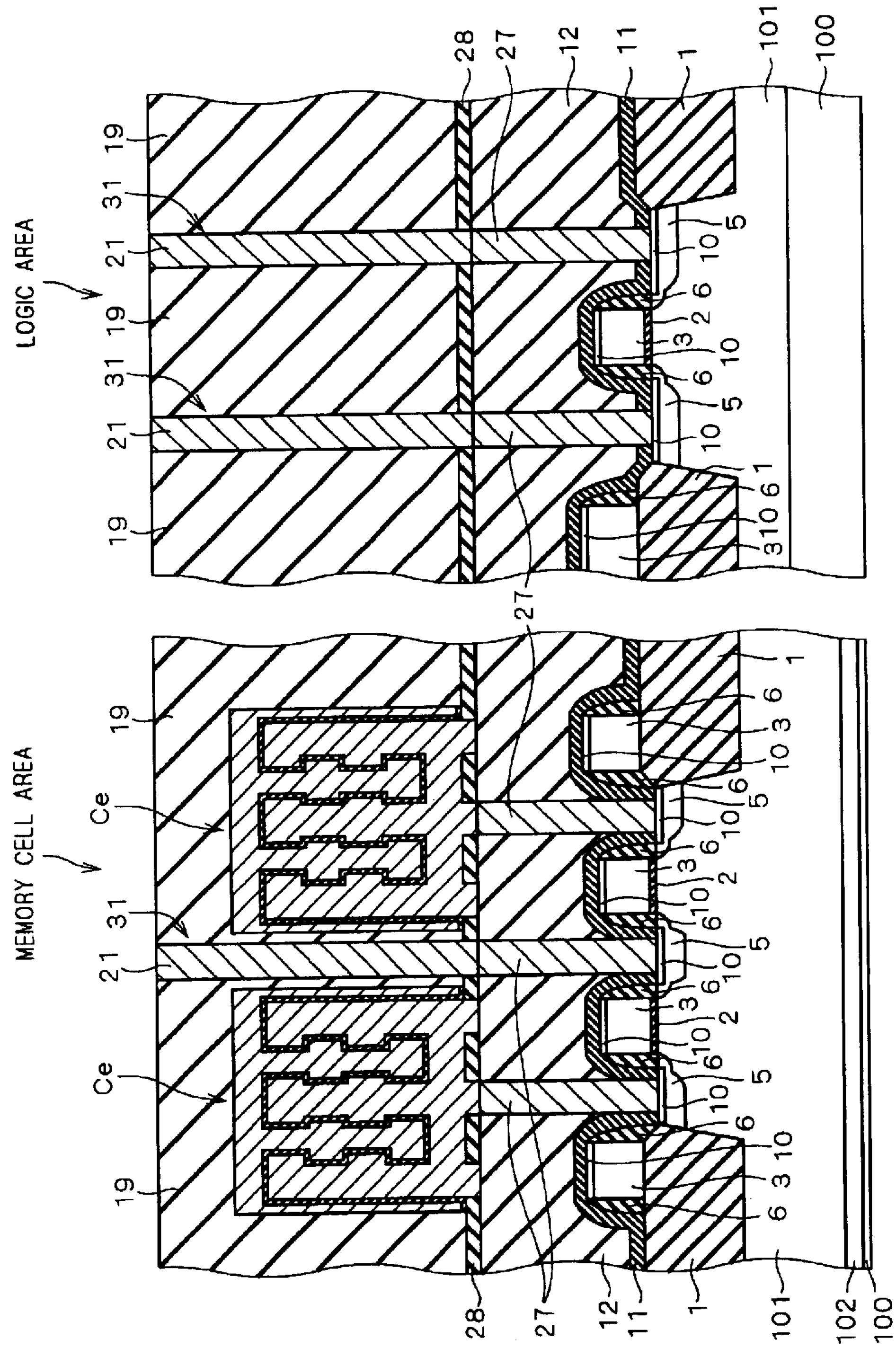

Next, the interlayer insulating film 19 is entirely deposited from the upper side of the structure of FIG. 38, followed by CMP to planarize the surface of the interlayer insulating film 19. The openings 31 are thereafter created to expose the contact metals 27 in the logic area, and the middle one among the three contact metals 27 in the memory cell area (FIG. 39). Although not shown, the opening 31 may be so created to expose the upper electrode 30*e*. Thereafter the openings 31 are filled with the contact metals 21 (FIG. 40).

As already described, overetching of the interlayer insulating film 19 is prevented in the formation of the openings 31. Therefore, the contact metal 21 filling the opening 31 is prevented from being short-circuited with the gate electrode 3 or the source/drain region 5.

The next step is formation of the interconnect lines 20 on the interlayer insulating film 19 to be connected to the contact metals 21, as shown in FIG. 41.

The fifth preferred embodiment realizes the same effect as obtained in the first preferred embodiment. Further, the fifth preferred embodiment provides improved electrostatic capacity.

Sixth Preferred Embodiment

Figure 42:
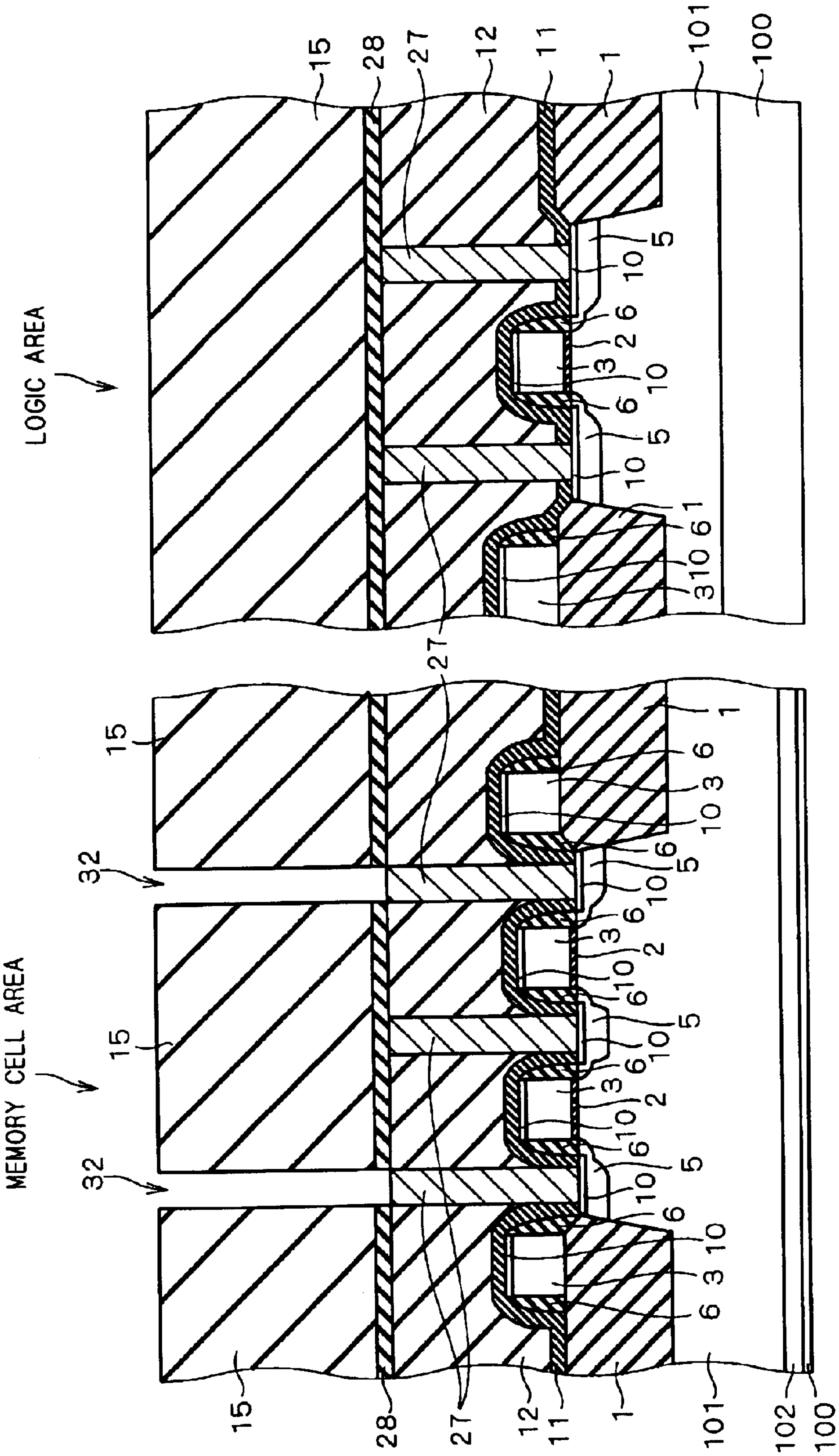

FIGS. 42 through 48 are sectional views illustrating a method of manufacturing a semiconductor device according to the sixth preferred embodiment of the present invention, following the order of manufacturing steps. First, following the same steps as those of the first preferred embodiment, the structure shown in FIG. 7 is obtained. Next, an interlayer insulating film 15 is entirely deposited from the upper side of the structure of FIG. 7. The interlayer insulating film 15 includes such a material allowing the interlayer insulating film 15 to be etched at a higher etching rate relative to the silicon nitride film 28. As an example, the interlayer insulating film 15 may be a BPTEOS film. Thereafter, openings 32 penetrating the interlayer insulating film 15 and the silicon nitride film 28 are created, whereby the contact metal 27, to hold a to-be-formed lower electrode thereon, is exposed. Following the steps described so far, the structure shown in FIG. 42 is obtained.

As an exemplary way to create the opening 32, anisotropic etching may be performed on the interlayer insulating film 15 using the silicon nitride film 28 as a stopper. The silicon nitride film 28 thereby exposed is then subjected to further etching. The opening 32 is directed to the formation of a lower electrode of a capacitor, and therefore, is not created in the logic area. In FIG. 42, among the three contact metals 27 shown in the memory cell area, two except the one in the middle are exposed by the openings 32.

Figure 43:
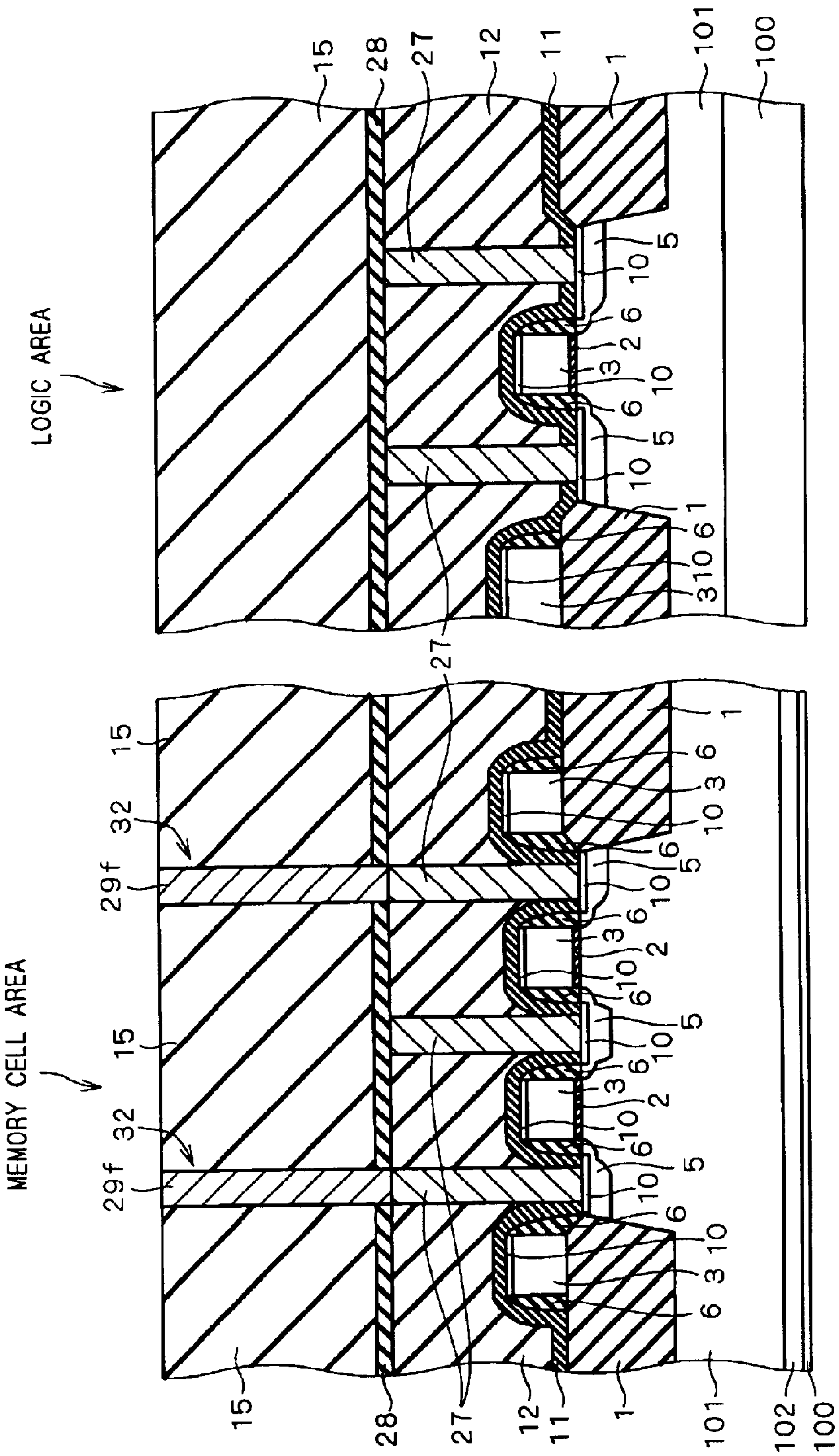

Next, a metal film to form a lower electrode is entirely deposited from the upper side of the structure of FIG. 42, whereby the openings 32 are filled. This metal film includes high melting point metal such as ruthenium, for example, which is kept only in the openings 32, whereby lower electrodes 29*f* are formed (FIG. 43). With regard to the formation of the lower electrode 29*f*, the metal film existing on the interlayer insulating film 15 is selectively removed by CMP. Alternatively, the metal film, to be operative to serve as the lower electrode 29*f*, is covered with a photoresist, followed by anisotropic etching.

Figure 44:
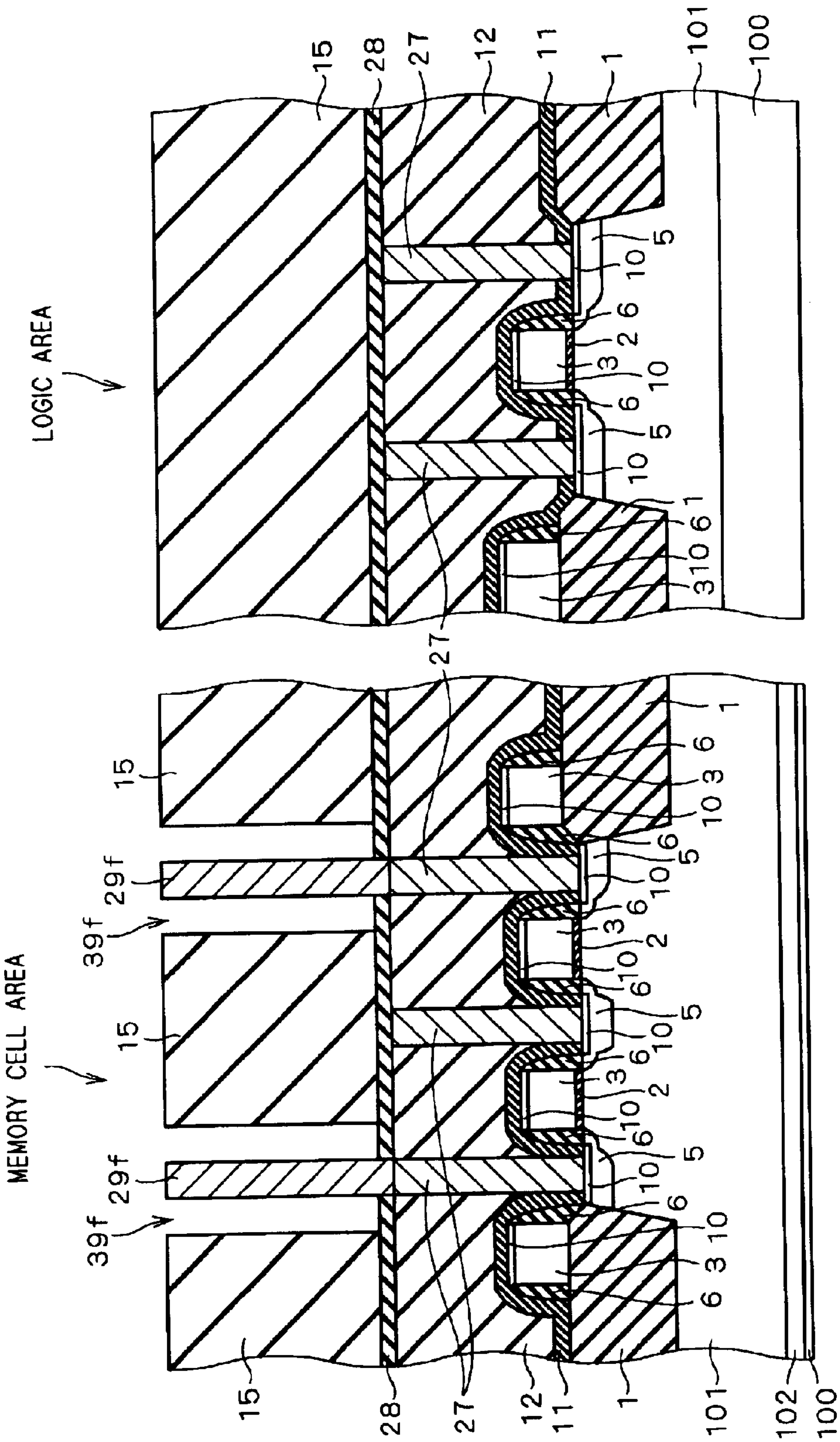
Figure 45:
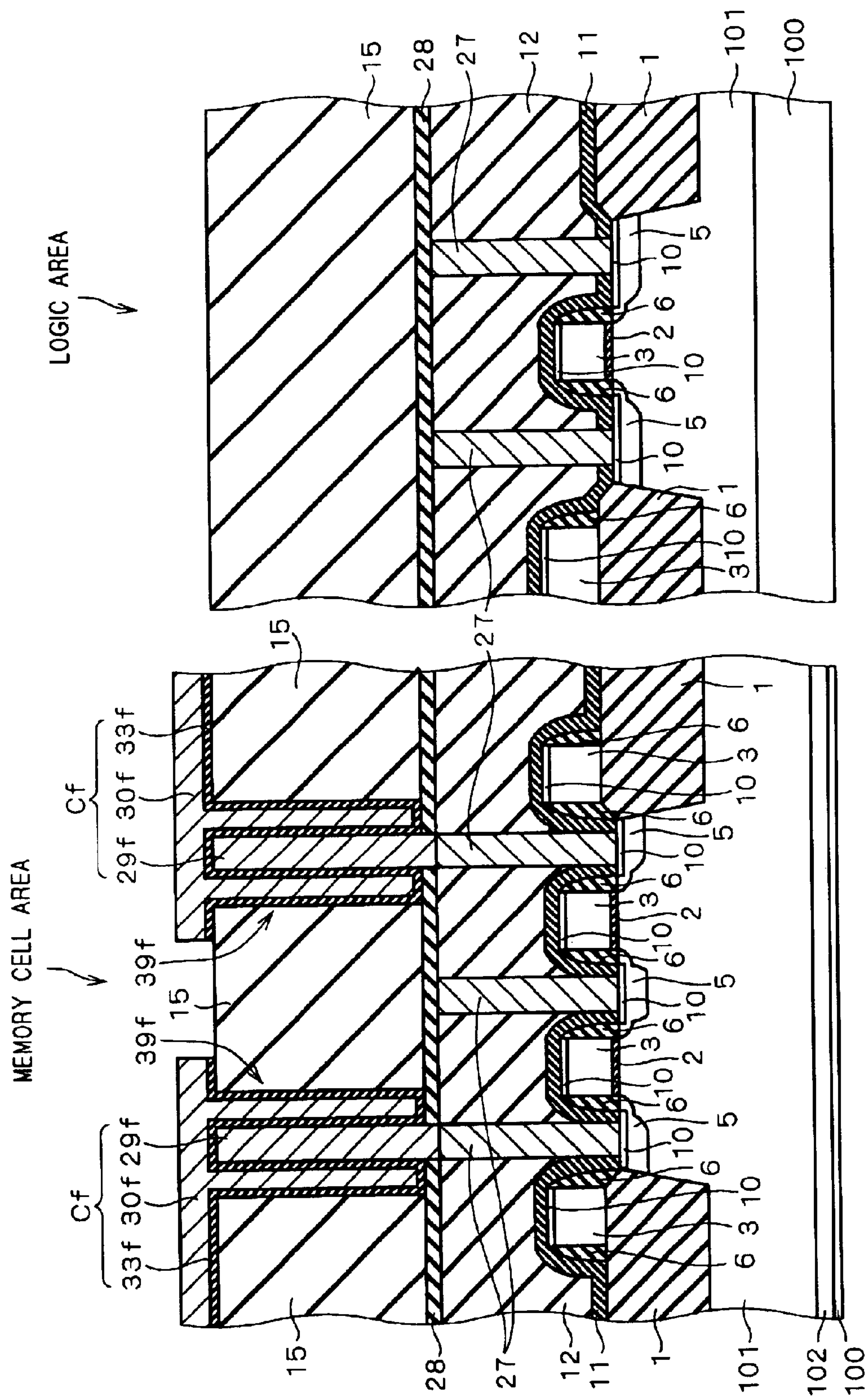

The interlayer insulating film 15 thereafter undergoes selective etching, whereby the openings 32 expand, which are hereinafter referred to as openings 39*f*, to surround the lower electrodes 29*f* (FIG. 44). Next, a dielectric film (including tantalum penoxide, for example) is entirely deposited from the upper side of the structure of FIG. 44. Further deposited thereon is a metal film including high melting point metal such as ruthenium, followed by patterning to form capacitor dielectric films 33*f* and upper electrodes 30*f*. In the opening 39*f*, the capacitor dielectric film 33*f* and the upper electrode 30*f* are stacked in this order, relative to the lower electrode 29*f*. As a result, capacitors Cf each including the upper electrode 30*f*, the lower electrode 29*f*, and the capacitor dielectric film 33*f* are obtained (FIG. 45). Both the capacitor dielectric film 33*f* and the upper electrode 30*f* are not formed in the logic area, nor over the middle one among the three contact metals 27 in the memory cell area.

Figure 46:
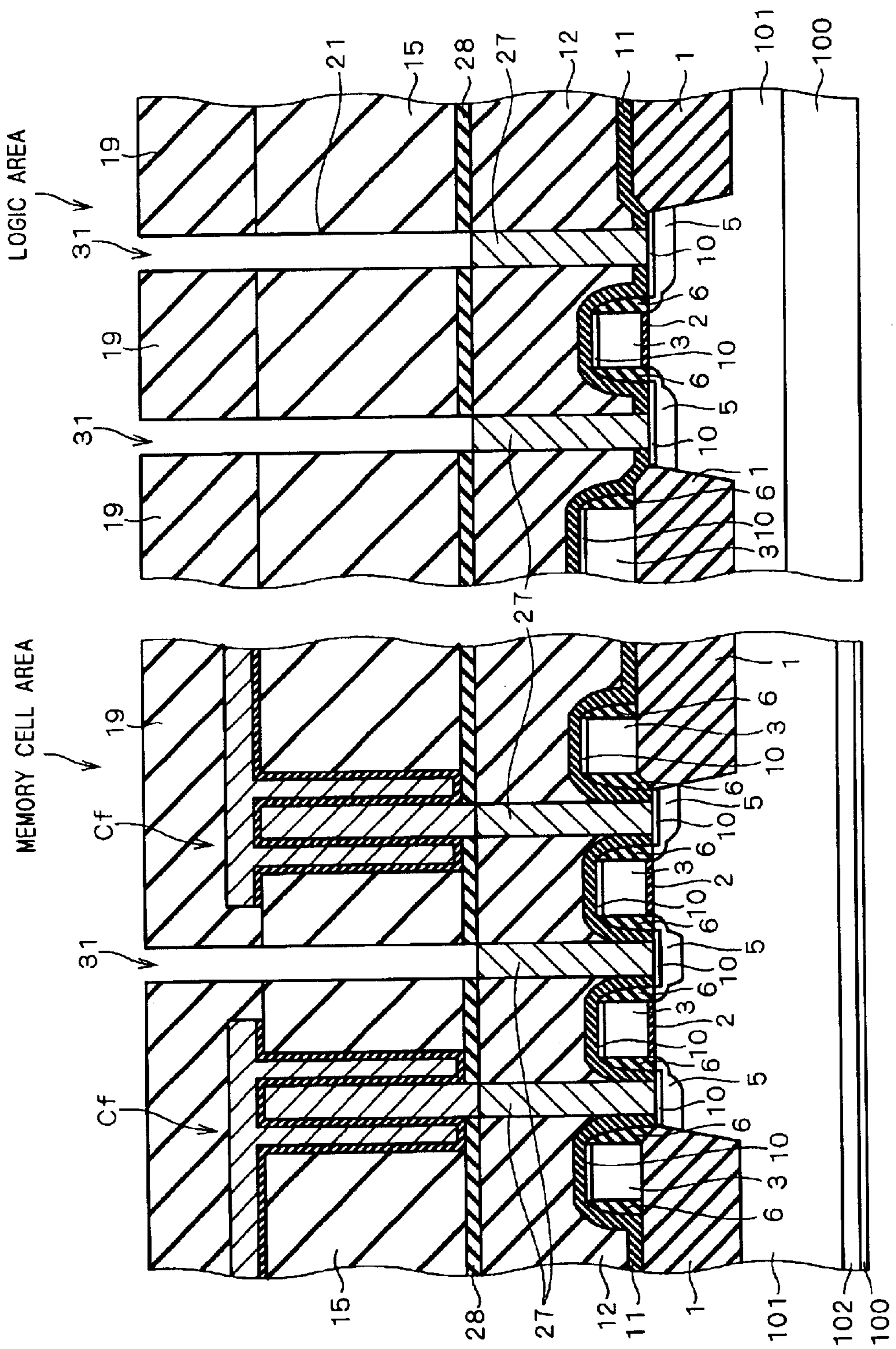

Next, the interlayer insulating film 19 is entirely deposited from the upper side of the structure of FIG. 45, followed by CMP to planarize the surface of the interlayer insulating film 19. The openings 31 are thereafter created to expose the contact metals 27 in the logic area, and the middle one among the three contact metals 27 in the memory cell area (FIG. 46). Although not shown, the opening 31 may be so created to expose the upper electrode 30*f*. Thereafter the openings 31 is filled with the contact metals 21 (FIG. 47).

In the formation of the opening 32, the silicon nitride film 28 is once used as a stopper, and is then subjected to further etching. Therefore, the opening 32 is unlikely to expand at the bottom, avoiding short circuit of the lower electrode 29*f* with the gate electrode 3 or the source/drain region 5. Further, overetching of the interlayer insulating film 19 is avoided in the formation of the opening 31 using the silicon nitride film 28 as a stopper. Therefore, the contact metal 21 filling the opening 31 is also prevented from being short-circuited with the gate electrode 3 or the source/drain region 5.

Figure 48:
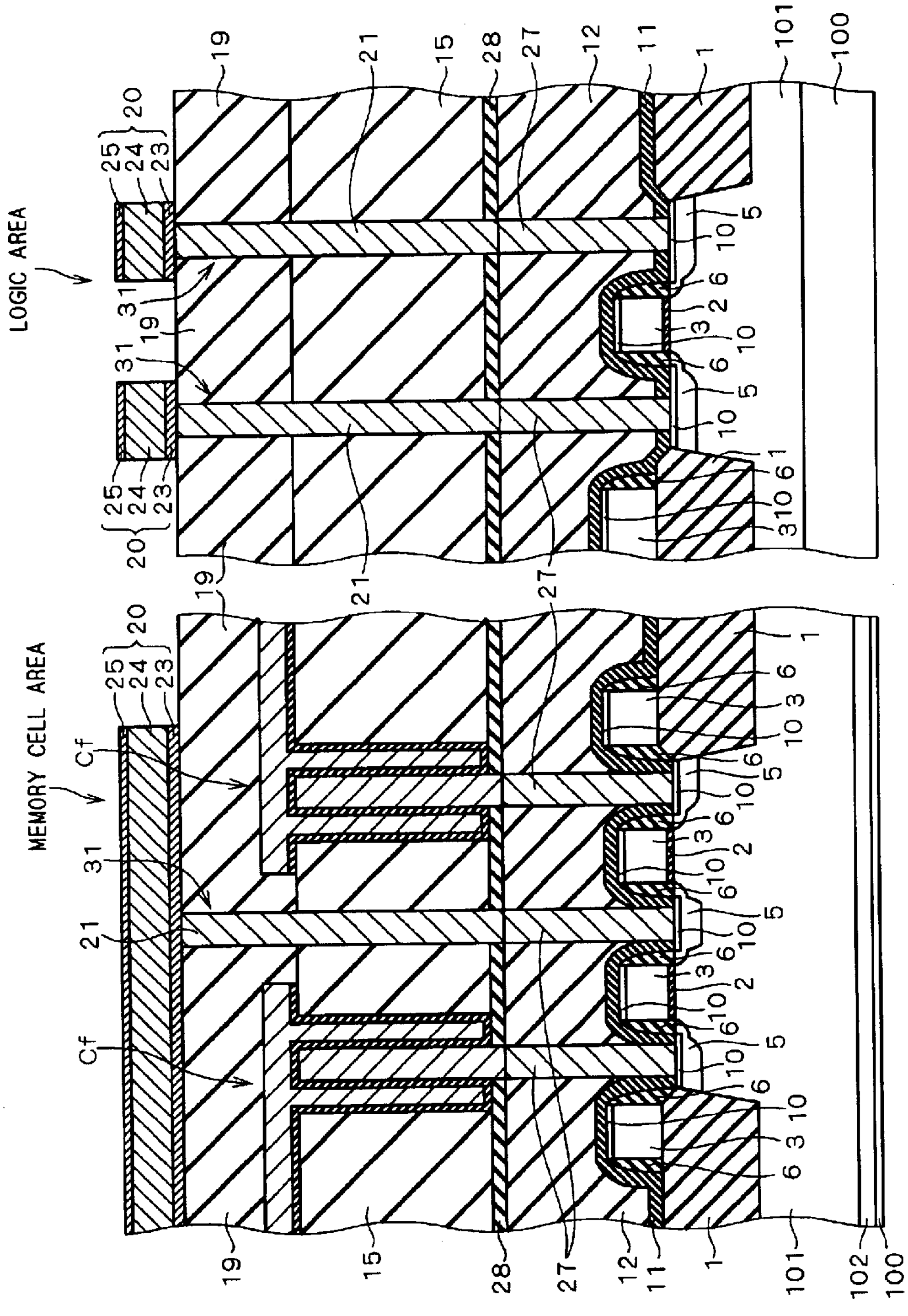

The next step is formation of the interconnect lines 20 on the interlayer insulating film 19 to be connected to the contact metals 21, as shown in FIG. 48.

According to the sixth preferred embodiment, while being surrounded by the upper electrode 30*f*, the lower electrode 29*f* protrudes toward the upper electrode 30*f*. As compared with the structure where a lower electrode surrounds an upper electrode, it is allowed accordingly to easily form the lower electrode 29*f*. Further, in the formation of the lower electrode 29*f*, and still in the formation of the upper electrode 30*f*, the interlayer insulating film 15 remains, while removed for forming the capacitors Cf. This means that good flatness is provided, to easily perform the subsequent steps with high precision.

Seventh Preferred Embodiment

Figure 49:
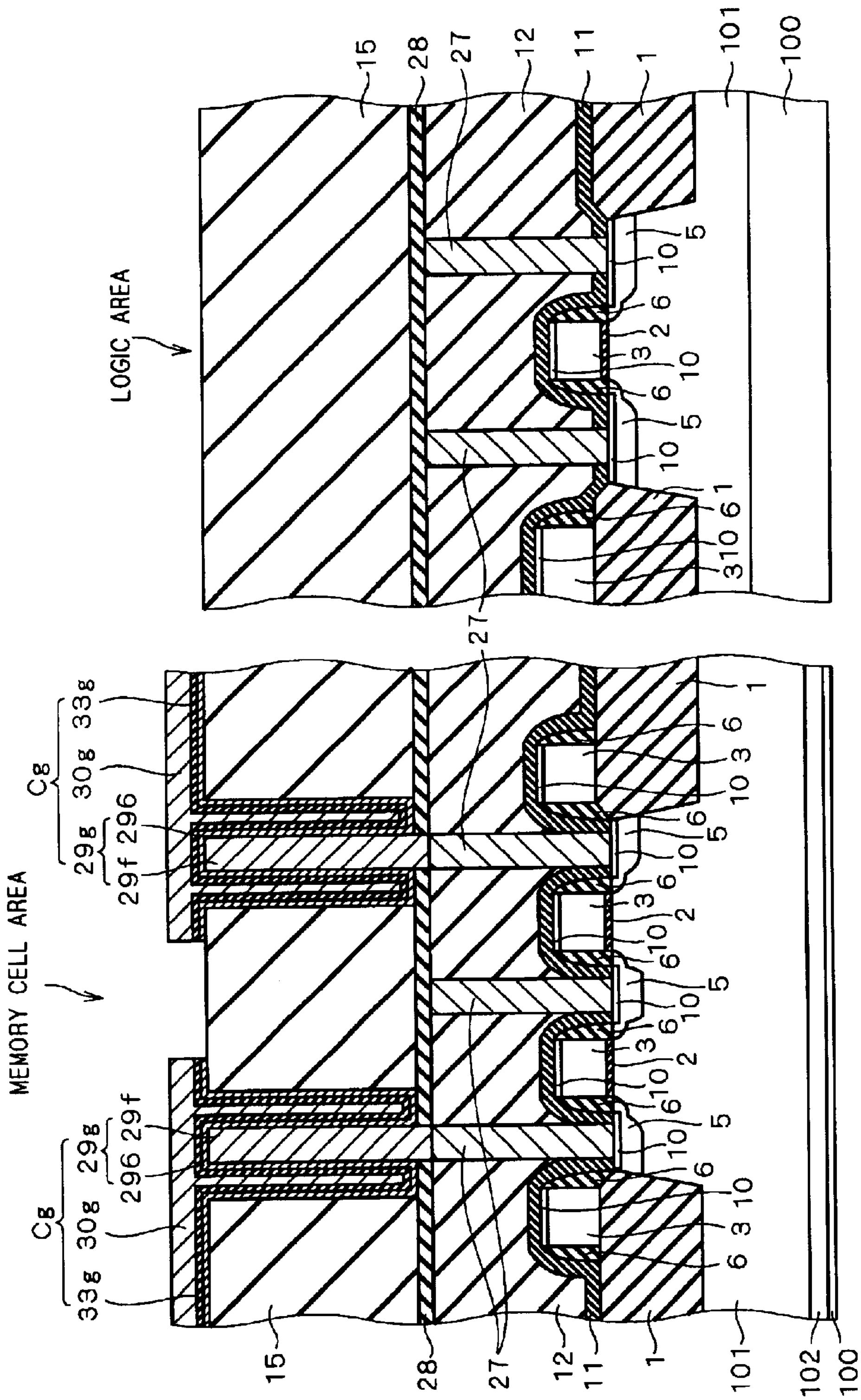
FIGS. 49 through 52 are sectional views illustrating a method of manufacturing a semiconductor device according to a seventh preferred embodiment of the present invention, following the order of manufacturing steps.

FIGS. 49 through 52 are sectional views illustrating a method of manufacturing a semiconductor device according to the seventh preferred embodiment of the present invention, following the order of manufacturing steps. First, following the same steps as those of the sixth preferred embodiment, the structure shown in FIG. 44 is obtained. Next, a metal film including high melting point metal (such as ruthenium), a dielectric film (including tantalum penoxide, for example), and high melting point metal (such as ruthenium), are deposited in this order from the upper side of the structure of FIG. 44, which thereafter undergo patterning to be shaped into metal films 296, capacitor dielectric films 33*g*, and upper electrodes 30*g*, respectively. The metal film 296 and the lower electrode 29*f* together form a lower electrode 29*g*. As a result, capacitors Cg each including the upper electrode 30*g*, the lower electrode 29*g*, and the capacitor dielectric film 33*g* are obtained (FIG. 49). The upper electrode 30*g*, the lower electrode 29*g*, and the capacitor dielectric film 33*g* are not formed in the logic area, nor over the middle one among the three contact metals 27 in the logic area. In the opening 39*f*, the metal film 296, the capacitor dielectric film 33*g*, and the upper electrode 30*g* are stacked in this order, relative to the lower electrode 29*f* and the interlayer insulating film 15.

The metal film 296 is provided, not only to the lower electrode 29*f* shown in FIG. 43, but to the bottom and side surfaces of the opening 39*g*. Therefore, the extensive surface area of the capacitor dielectric film 33*g* is provided, leading to the increase in electrostatic capacity of the capacitor Cg.

Figure 50:
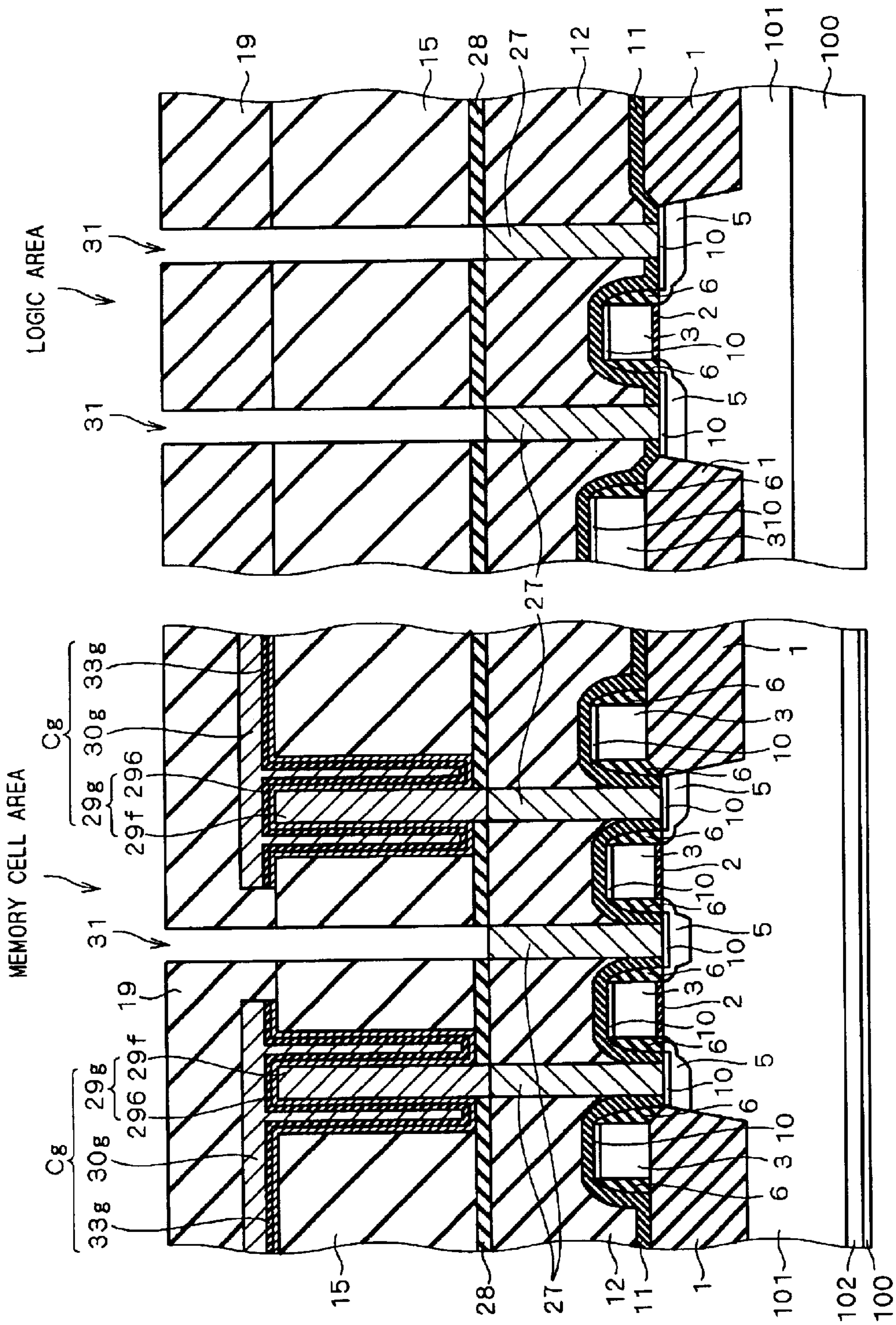
Figure 51:
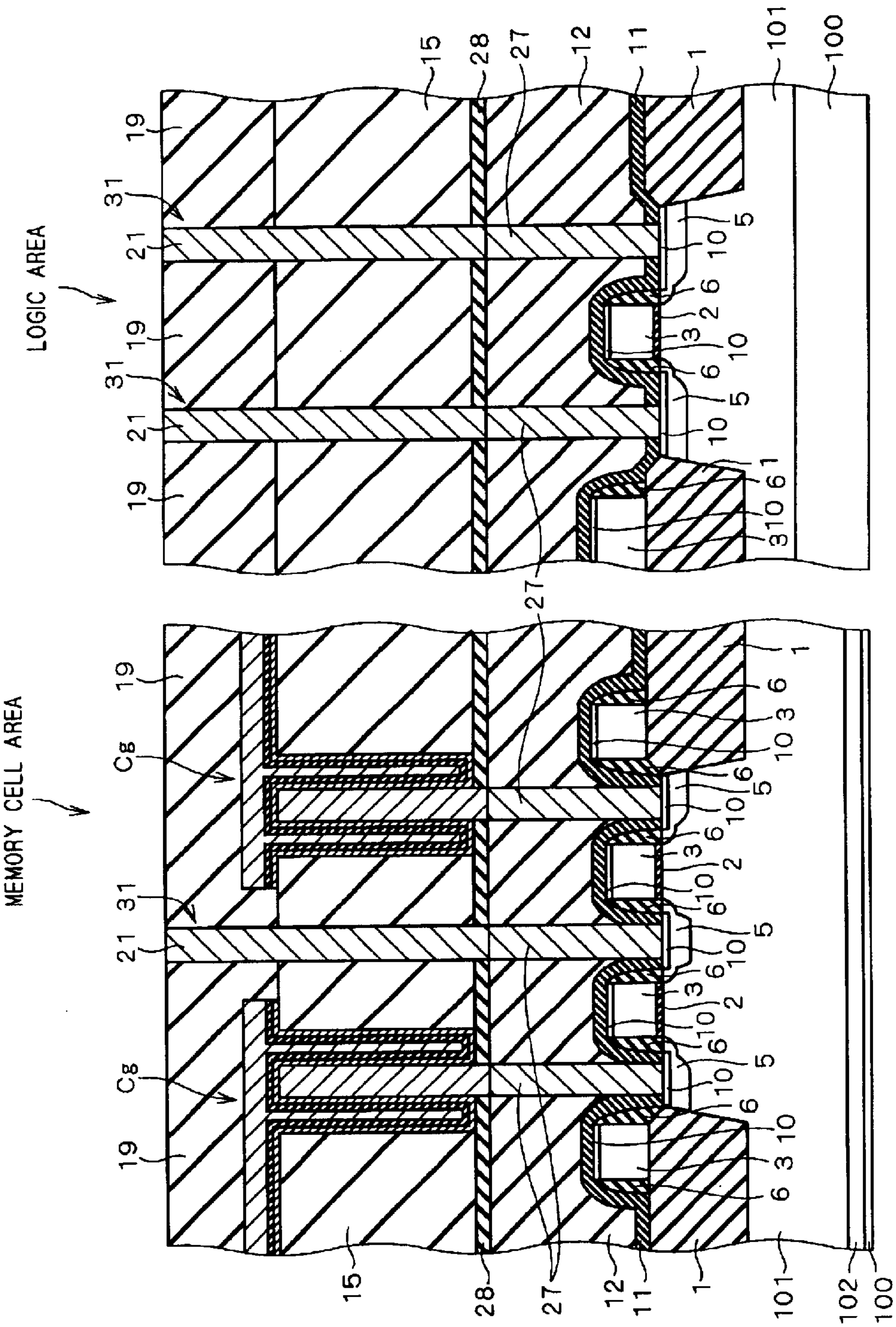

Next, the interlayer insulating film 19 is entirely deposited from the upper side of the structure of FIG. 49, followed by CMP to planarize the surface of the interlayer insulating film 19. The openings 31 are thereafter created to expose the contact metals 27 in the logic area, and the middle one among the three contact metals 27 in the memory cell area (FIG. 50). Although not shown, the opening 31 may be so created to expose the upper electrode 30*g*. Thereafter the openings 31 are filled with the contact metals 21 (FIG. 51).

As already described, overetching of the interlayer insulating film 19 is avoided in the formation of the opening 31 using the silicon nitride film 28 as a stopper. Therefore, the contact metal 21 filling the opening 31 is prevented from being short-circuited with the gate electrode 3 or the source/drain region 5.

Figure 52:
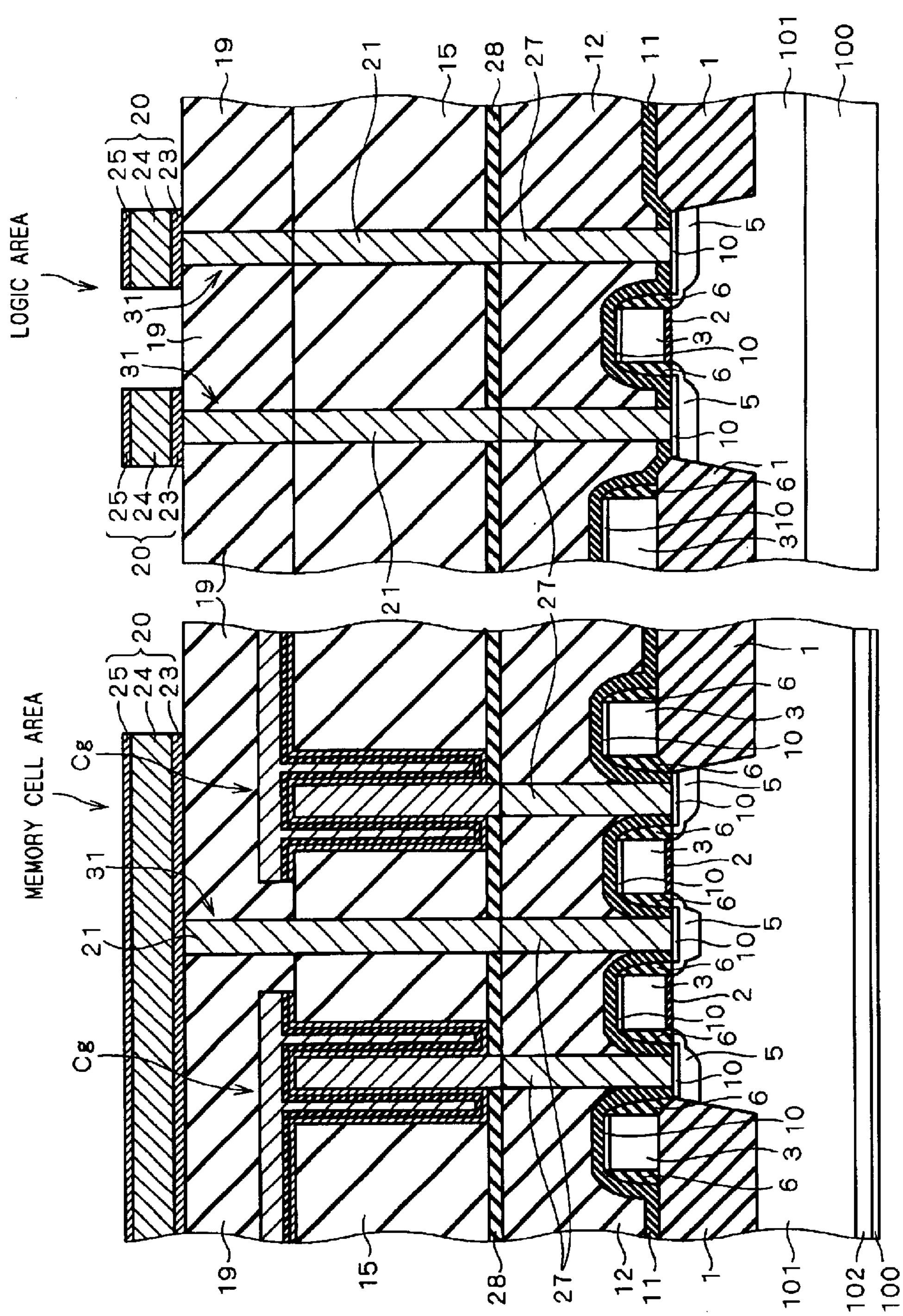
Figure 53:
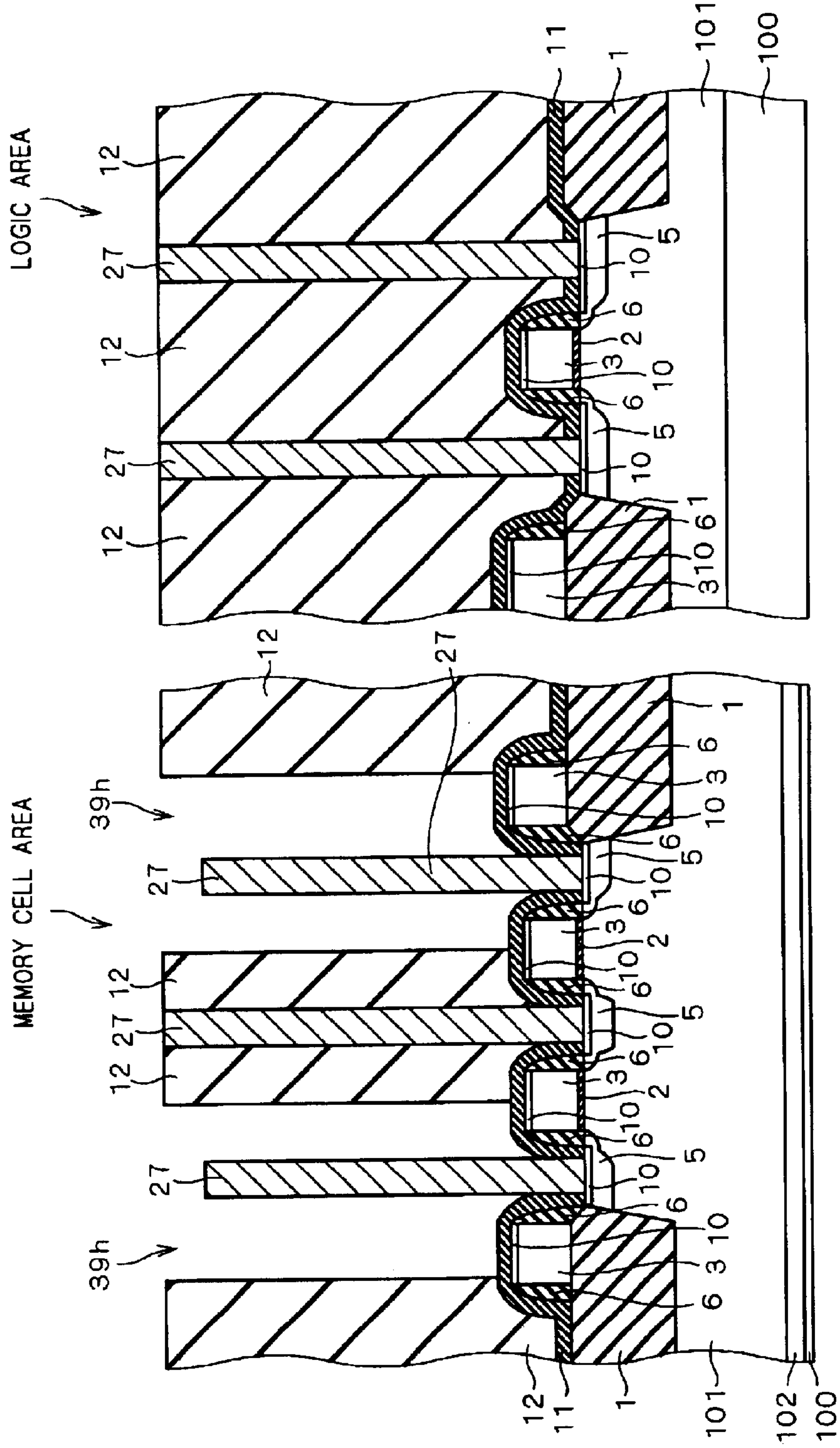
FIGS. 53 through 58 are sectional views illustrating a method of manufacturing a semiconductor device according to an eighth preferred embodiment of the present invention, following the order of manufacturing steps.

The next step is formation of the interconnect lines 20 on the interlayer insulating film 19 to be connected to the contact metals 21, as shown in FIG. 52.

The seventh preferred embodiment realizes the same effect as obtained in the sixth preferred embodiment. Further, the capacitor dielectric film 33*g* characteristically covers a more extensive area than the one covered by the capacitor dielectric film 33*f*, contributing to the increase in capacity of the capacitor Cg.

Eighth Preferred Embodiment

FIGS. 53 through 58 are sectional views illustrating a method of manufacturing a semiconductor device according to the eighth preferred embodiment of the present invention, following the order of manufacturing steps. First, following the same steps as those of the first preferred embodiment, the structure shown in FIG. 6 is obtained. Next, openings 39*h* are created to surround the contact metals 27 which are to be operative to serve as lower electrodes. The opening 39*h* is not created in the logic area. In the exemplary view of FIG. 53, among the three contact metals 27 shown in the memory cell area, two except the one in the middle are exposed by the openings 39*h*. Selective etching of the interlayer insulating film 12 forms the openings 39*h*. In this etching, etching condition, which provides higher selectivity to the interlayer insulating film 12 relative to the silicon nitride film 11 and the contact metal 27, can be easily determined.

Accordingly, the silicon nitride film 11 and the contact metal 27 can be used as a stopper in the etching of the interlayer insulating film 12, causing no overetching. As a result, a conductor filled in the opening 39*h* is prevented from being short-circuited with the gate electrode 3 or the source/drain region 5.

Figure 54:
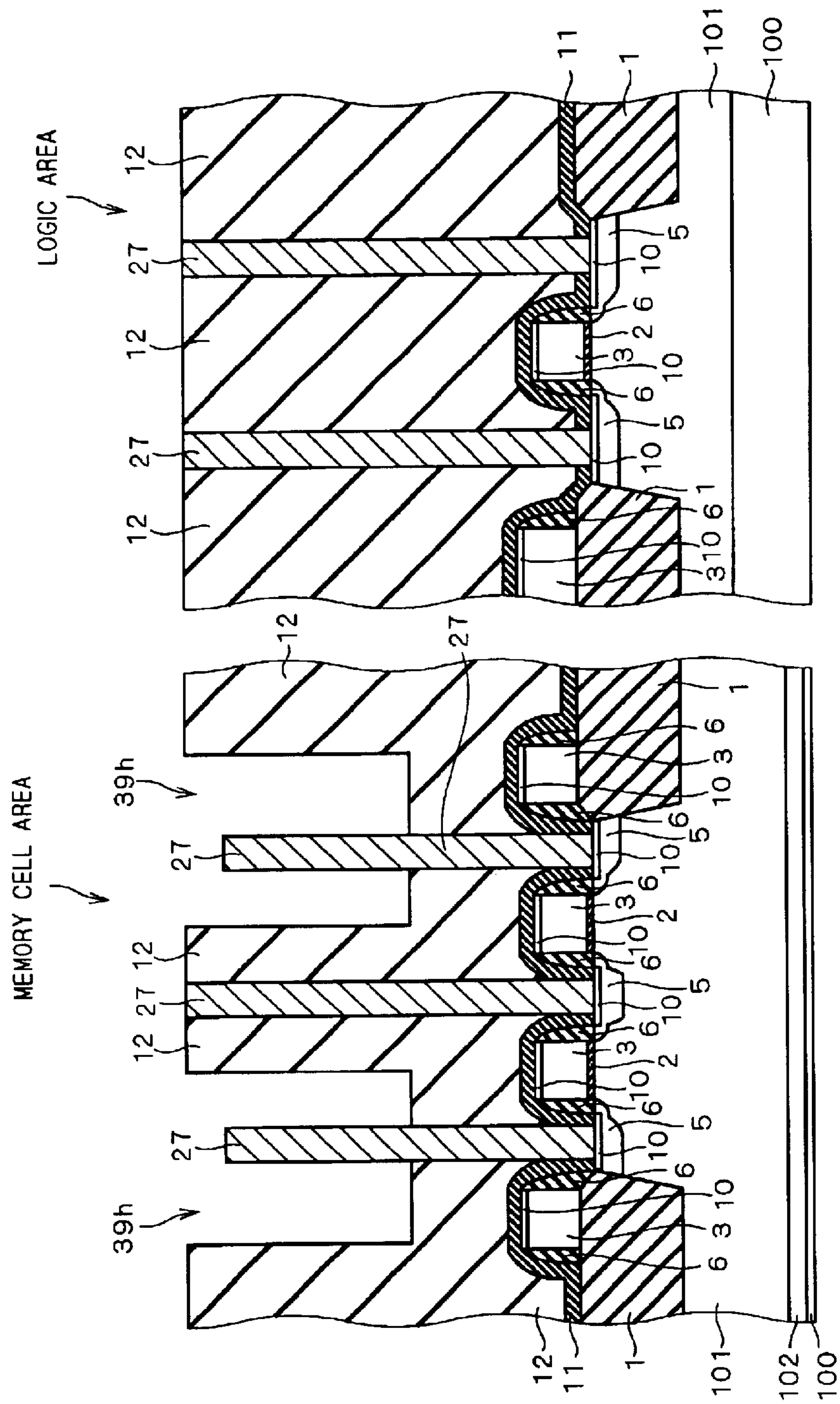

FIG. 54 shows an alternative form of the opening 39*h*, where the bottom of the opening 39*h* is created in the interlayer insulating film 12. The shortened duration for the etching of the interlayer insulating film 12 to create the opening 39*h* results in this alternative. In the following description, the manufacturing steps proceed on the basis of the structure where the bottom of the opening 39*h* is defined in the interlayer insulating film 12. However, the to-be-described steps are also applicable to the structure shown in FIG. 53 where the silicon nitride film 11 is exposed by the opening 39*h*.

Figure 55:
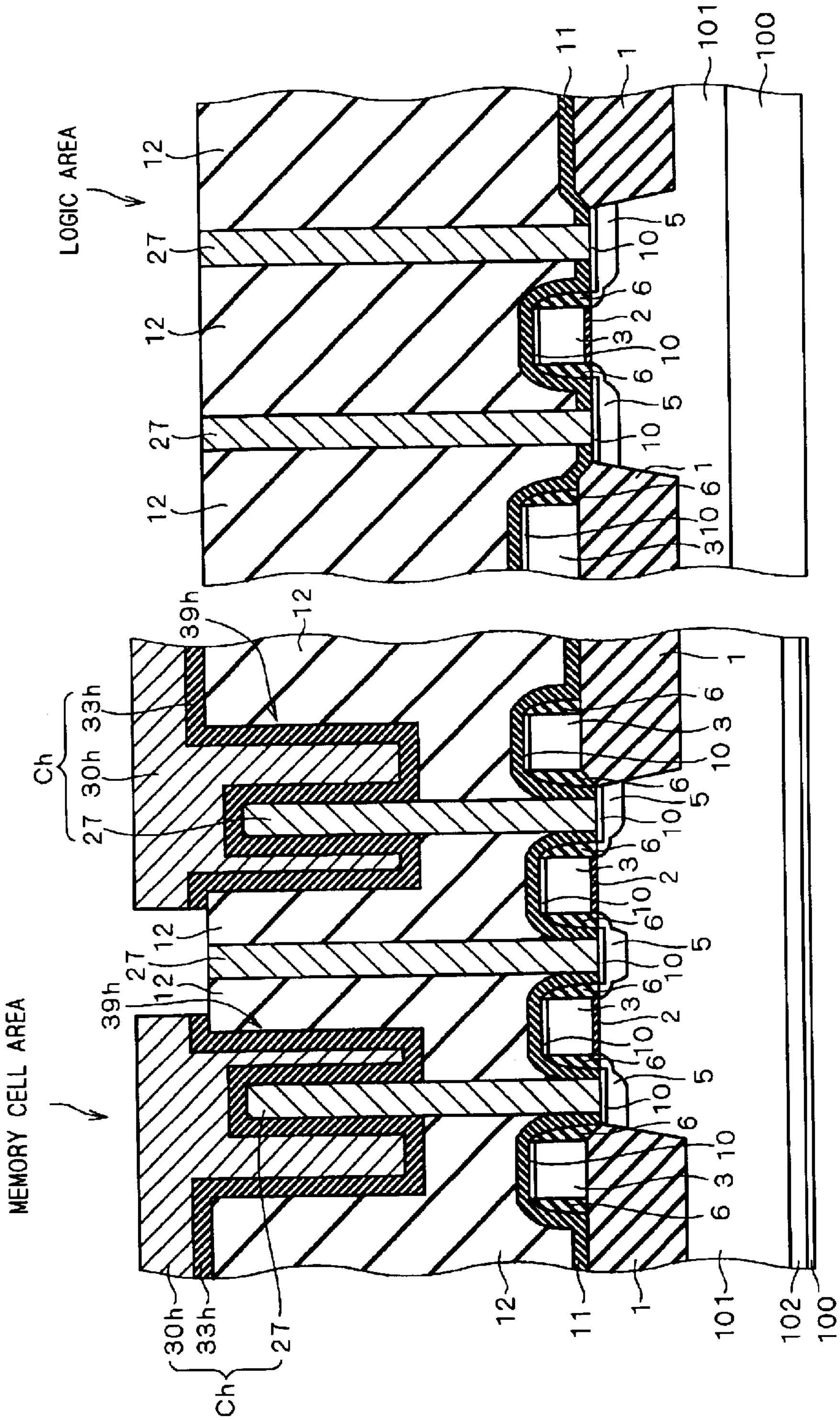

A dielectric film (including tantalum penoxide) and a high melting point metal (such as ruthenium) are deposited in this order, which are then shaped by patterning into capacitor dielectric films 33*h* and upper electrodes 30*h*, respectively. The upper portion of the contact metal 27 is operative to serve as a lower electrode. The upper electrode 30*h*, the capacitor dielectric film 33*h*, and the upper portion of the contact metal 27 form a capacitor Ch (FIG. 55). Both the upper electrode 30*h* and the capacitor dielectric film 33*h* are not formed in the logic area, nor over the middle one among the three contact metals 27 in the memory cell area. In the opening 39*h*, the capacitor dielectric film 33*h* and the upper electrode 30*h* are stacked in this order, relative to the contact metal 27.

Figure 56:
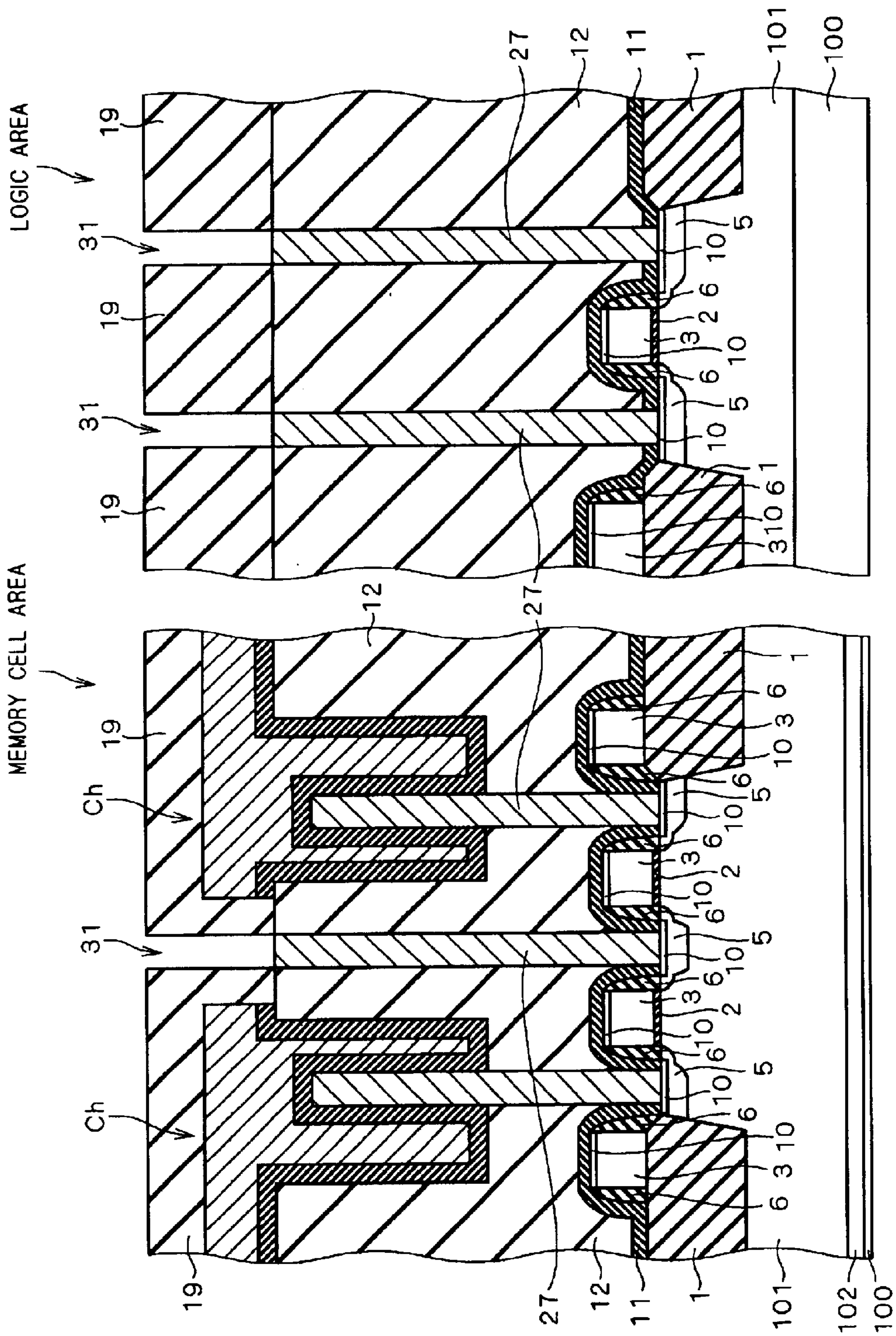
Figure 57:
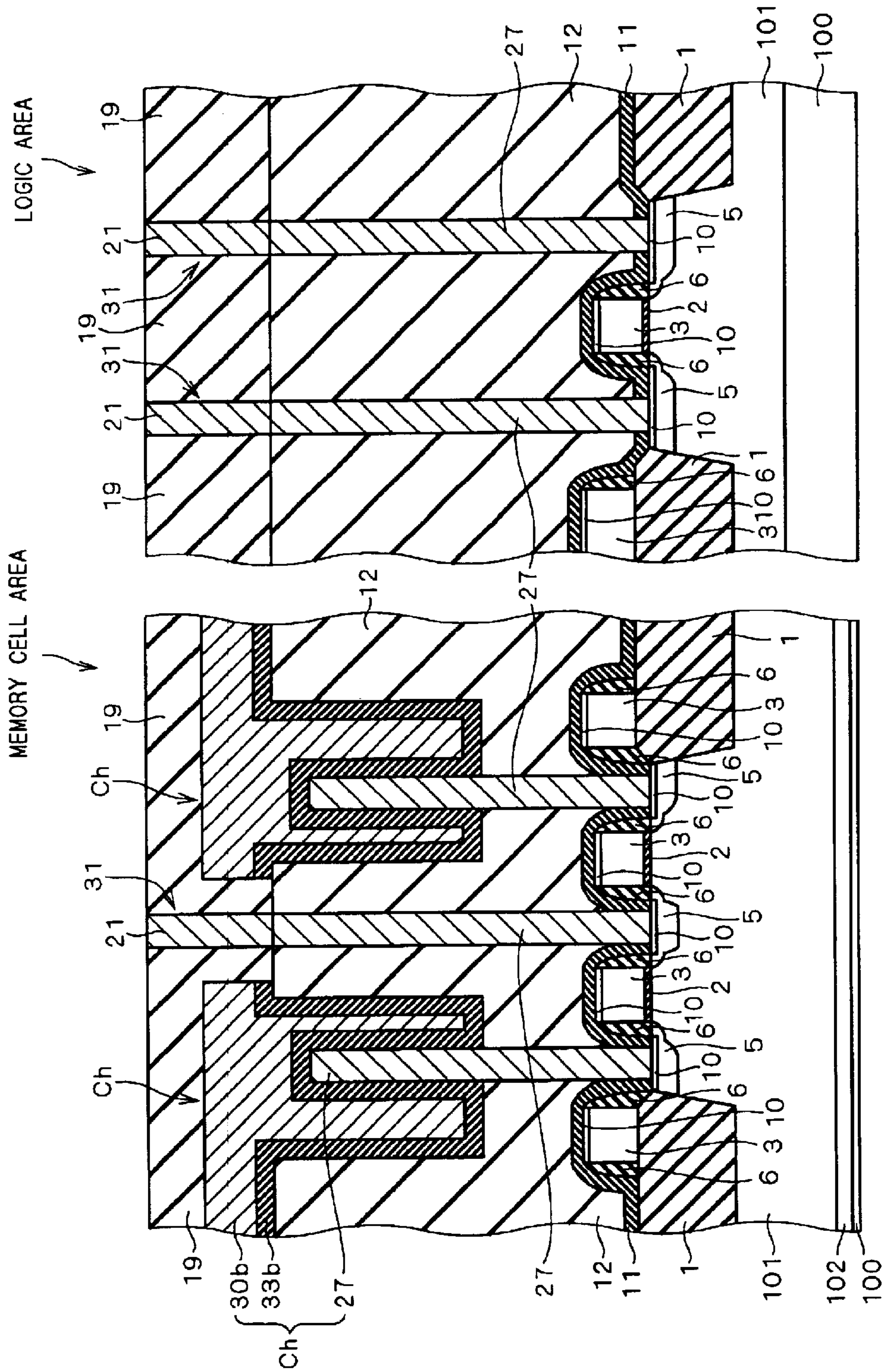
Figure 58:
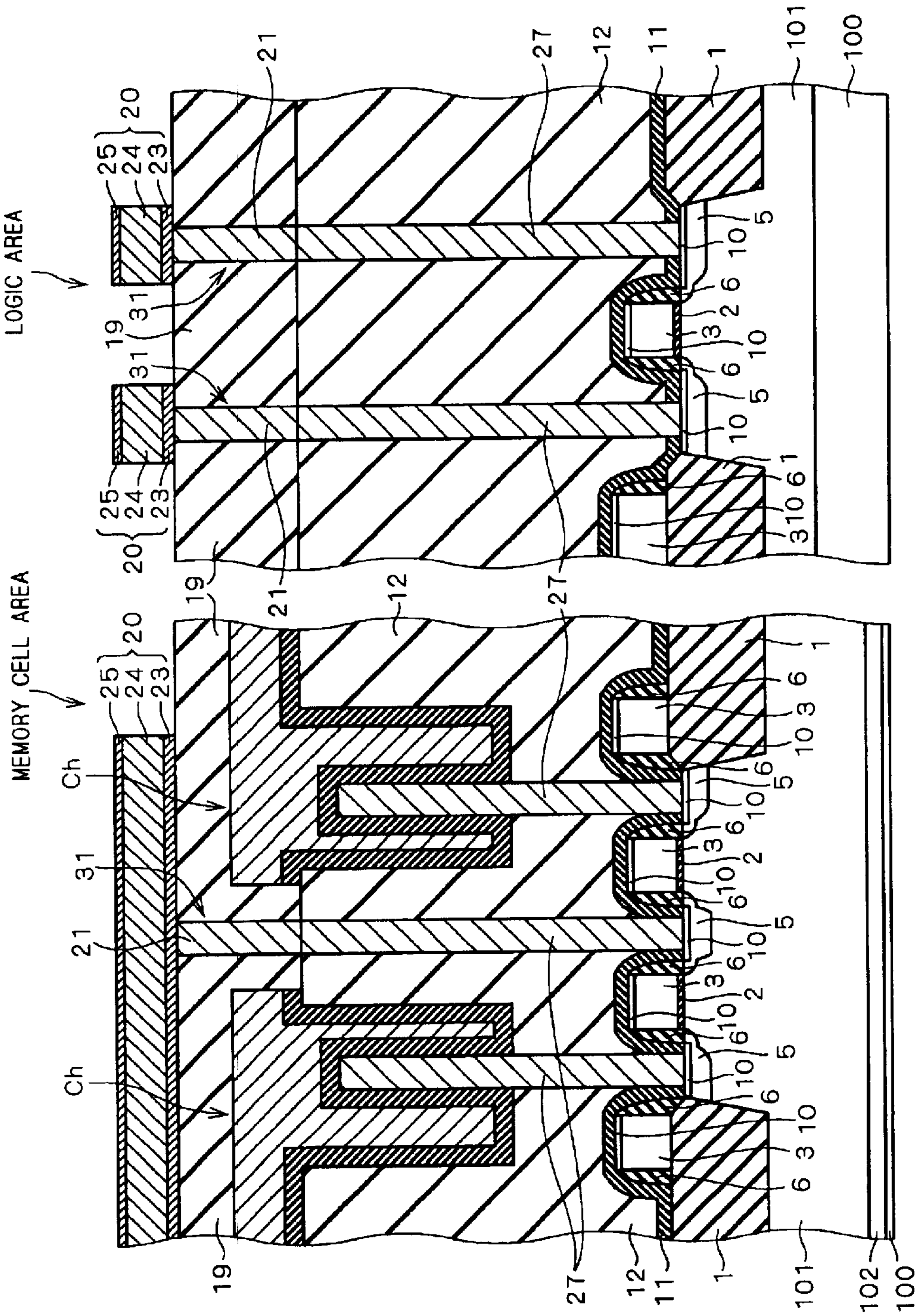

Next, the interlayer insulating film 19 is entirely deposited from the upper side of the structure of FIG. 55, followed by CMP to planarize the surface of the interlayer insulating film 19. The openings 31 are thereafter created to expose the contact metals 27 in the logic area, and the middle one among the three contact metals 27 in the memory cell area (FIG. 56). Although not shown, the opening 31 may be so created to expose the upper electrode 30*h*. Thereafter, the openings 31 are filled with the contact metals 21 (FIG. 57), and the interconnect lines 20 are formed on the interlayer insulating film 19 to be connected to the contact metals 21 (FIG. 58).

According to the eighth preferred embodiment, the lower portion of the contact metal 27 extending from the bottom of the opening 39*h* connects the capacitor Ch to the source/drain region 5, while the upper portion of which contact metal 27 is operative to serve as a lower electrode of the capacitor Ch. That is, the portion operative to serve as a lower electrode, and the portion operative to connect the capacitor Ch to another constituent, are formed by the same process. This advantageously leads to a cutback in the number of manufacturing steps, and also to a reduction in resistance between the capacitor Ch and the source/drain region 5. Further, while being surrounded by the upper electrode 30*h*, the contact metal 27 operative to serve as a lower electrode protrudes toward the upper electrode 30*h*. As compared with the structure where a lower electrode surrounds an upper electrode, it is allowed accordingly to easily form the lower electrode.

Ninth Preferred Embodiment

Figure 59:
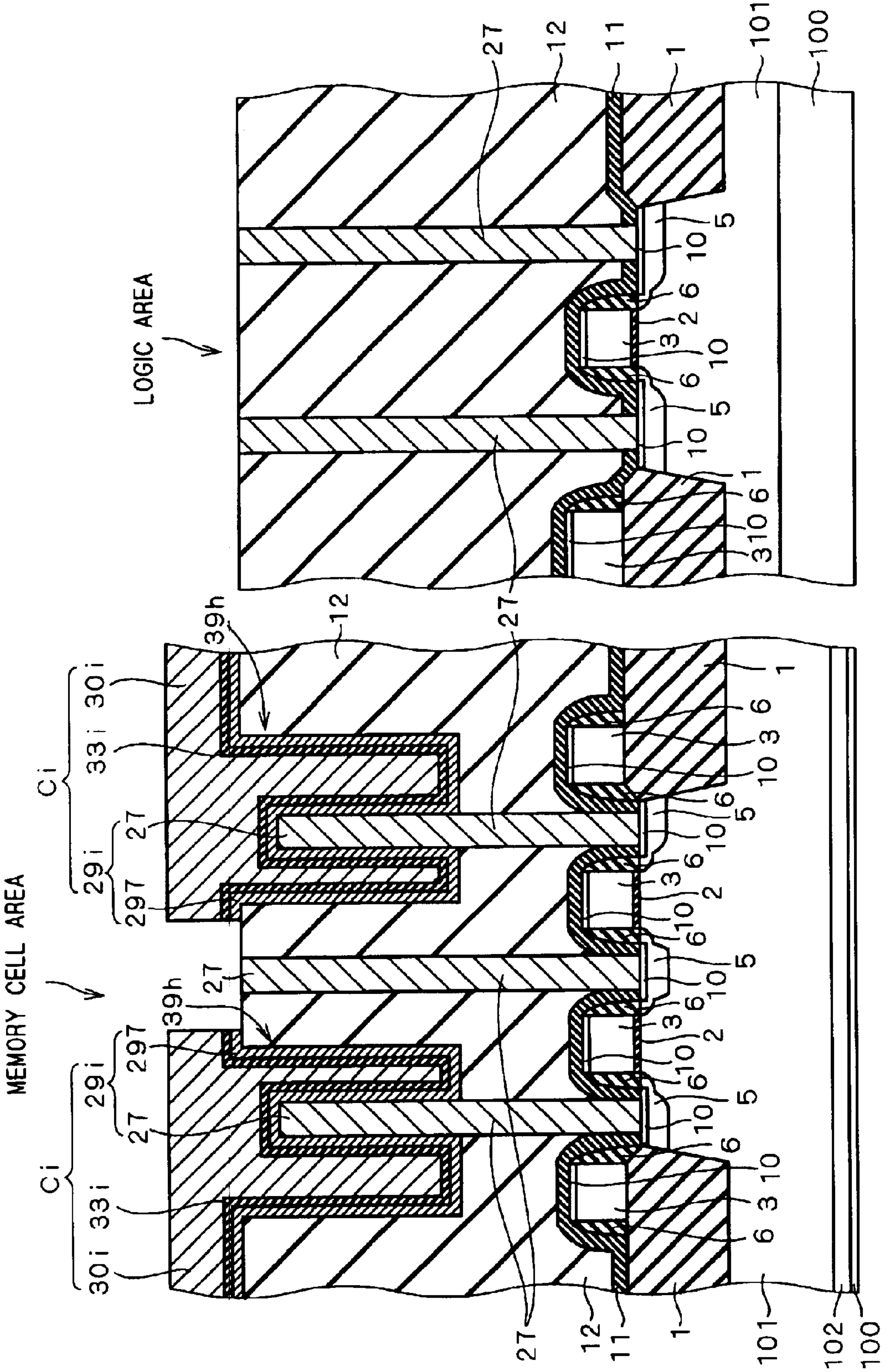

FIGS. 59 through 62 are sectional views illustrating a method of manufacturing a semiconductor device according to the ninth preferred embodiment of the present invention, following the order of manufacturing steps. First, following the same steps as those of the eighth preferred embodiment, the structure shown in FIG. 54 is obtained. Next, a metal film including high melting point metal (such as ruthenium), a dielectric film (including tantalum penoxide, for example), and high melting point metal (such as ruthenium), are deposited in this order, which thereafter undergo patterning to be shaped into metal films 297, capacitor dielectric films 33*i*, and upper electrodes 30*i*, respectively. The metal film 297 and the contact metal 27 together form a lower electrode 29*i*. As a result, capacitors Ci each including the upper electrode 30*i*, the lower electrode 29*i*, and the capacitor dielectric film 33*i* are obtained (FIG. 59). The upper electrode 30*i*, the capacitor dielectric film 33*i*, and the metal film 297 are not formed in the logic area, nor over the middle one among the three contact metals 27 in the memory cell area. In the opening 39*h*, the metal film 297, the capacitor dielectric film 33*i*, and the upper electrode 30*i* are stacked in this order, relative to the contact metal 27 and the interlayer insulating film 12.

The metal film 297 is provided, not only to the contact metal 27, but to the bottom and side surfaces of the opening 39*h*. Therefore, the extensive surface area of the capacitor dielectric film 33*i* is provided, leading to the increase in electrostatic capacity of the capacitor Ci.

Figure 60:
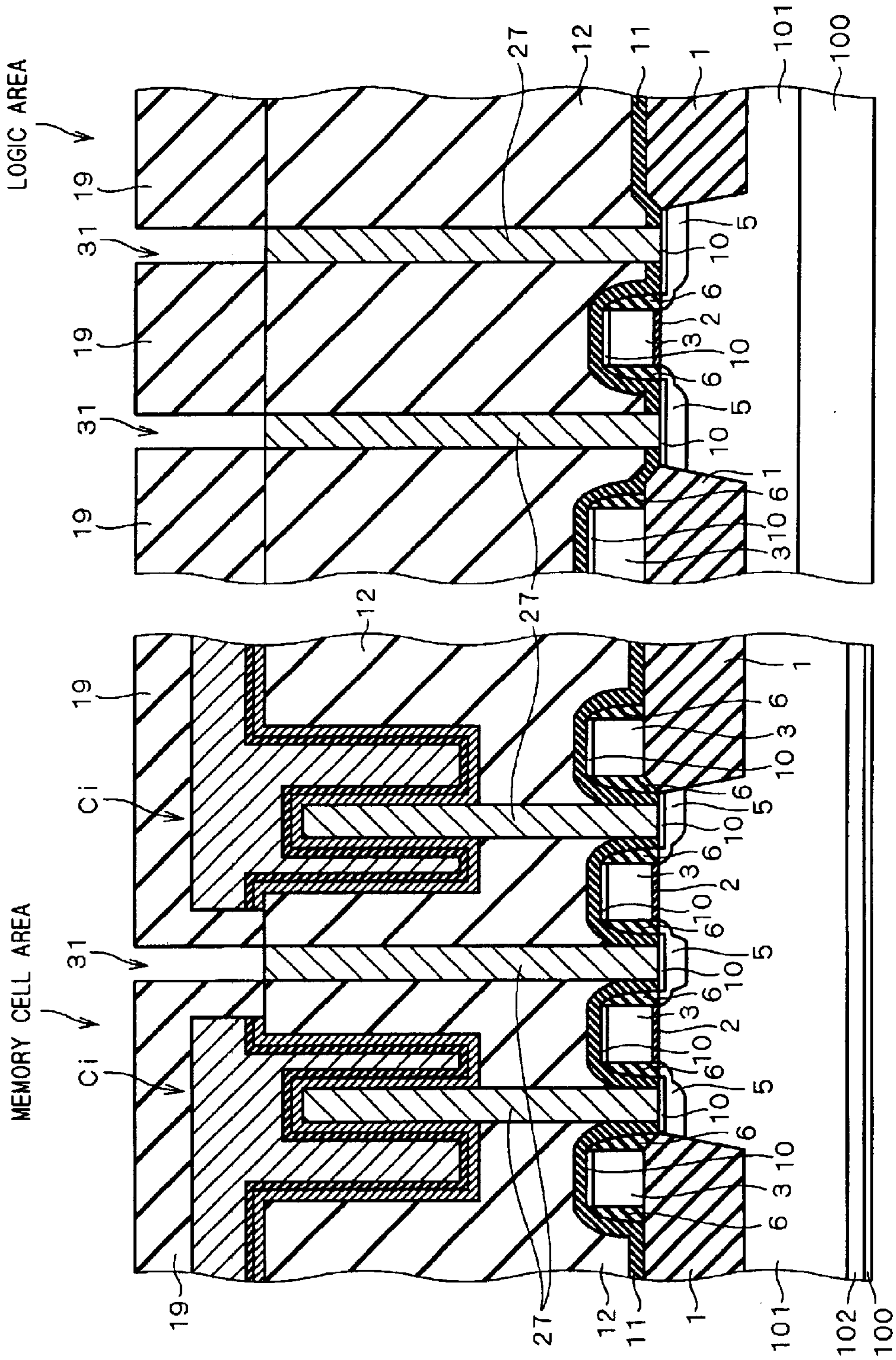

Next, the interlayer insulating film 19 is entirely deposited from the upper side of the structure of FIG. 59, followed by CMP to planarize the surface of the interlayer insulating film 19. The openings 31 are thereafter created to expose the contact metals 27 in the logic area, and the middle one among the three contact metals 27 in the memory cell area (FIG. 60). Although not shown, the opening 31 may be so created to expose the upper electrode 30*i*. Thereafter the openings 31 are filled with the contact metals 21 (FIG. 61).

Figure 62:
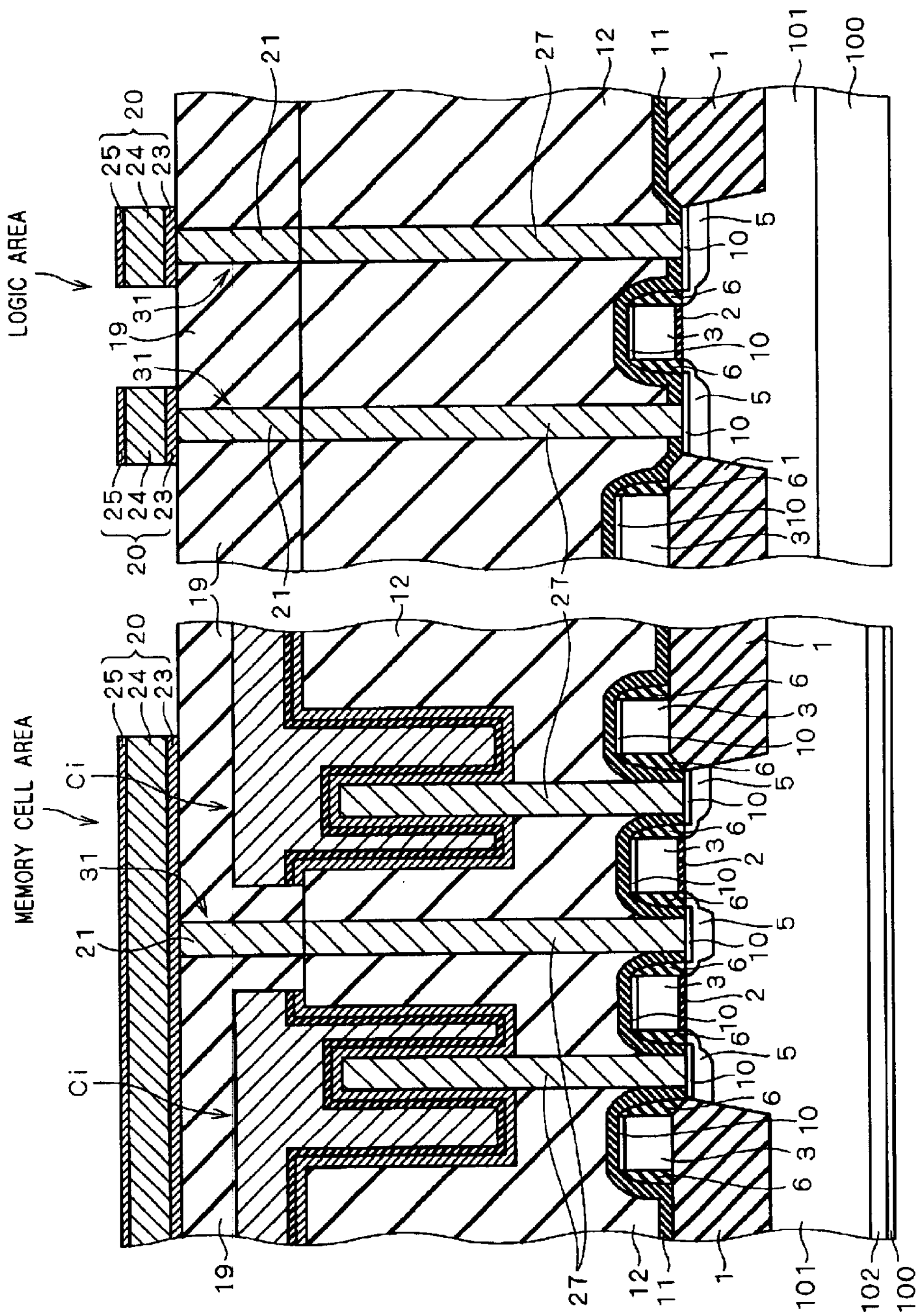
Figure 63:
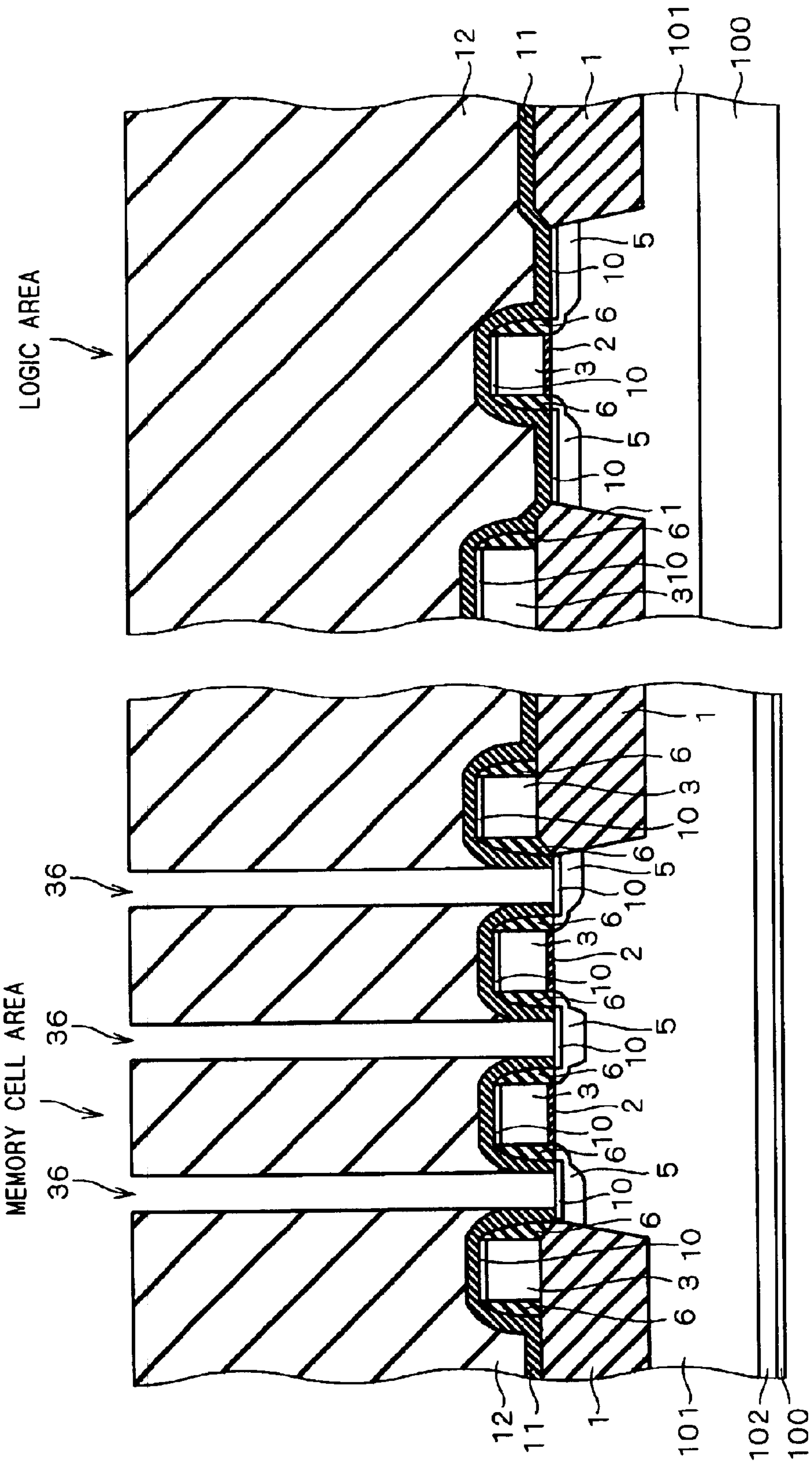

The next step is formation of the interconnect lines 20 on the interlayer insulating film 19 to be connected to the contact metals 21, as shown in FIG. 62.

The ninth preferred embodiment realizes the same effect as obtained in the eighth preferred embodiment. Further, the capacitor dielectric film 33*i* characteristically covers a more extensive area than the one covered by the capacitor dielectric film 33*h*, contributing to the increase in capacity of the capacitor Ci.

Tenth Preferred Embodiment

FIGS. 63 through 69 are sectional views illustrating a method of manufacturing a semiconductor device according to the tenth preferred embodiment of the present invention, following the order of manufacturing steps. First, following the same steps as those of the first preferred embodiment, the structure shown in FIG. 5 is obtained. Next, openings 36 penetrating the silicon nitride film 11 and the interlayer insulating film 12 over the source/drain regions 5 are created in the memory cell area, whereby the silicide films 10 are exposed. As an exemplary way to create the opening 36, anisotropic etching may be performed on the interlayer insulating film 12 using the silicon nitride film 11 as a stopper. The silicon nitride film 11 thereby exposed is then subjected to further etching. The opening 36 is not created in the logic area. In the exemplary view of FIG. 63, three silicide films 10 provided in the upper surfaces of the source/drain regions 5 are each shown to be exposed.

Figure 64:
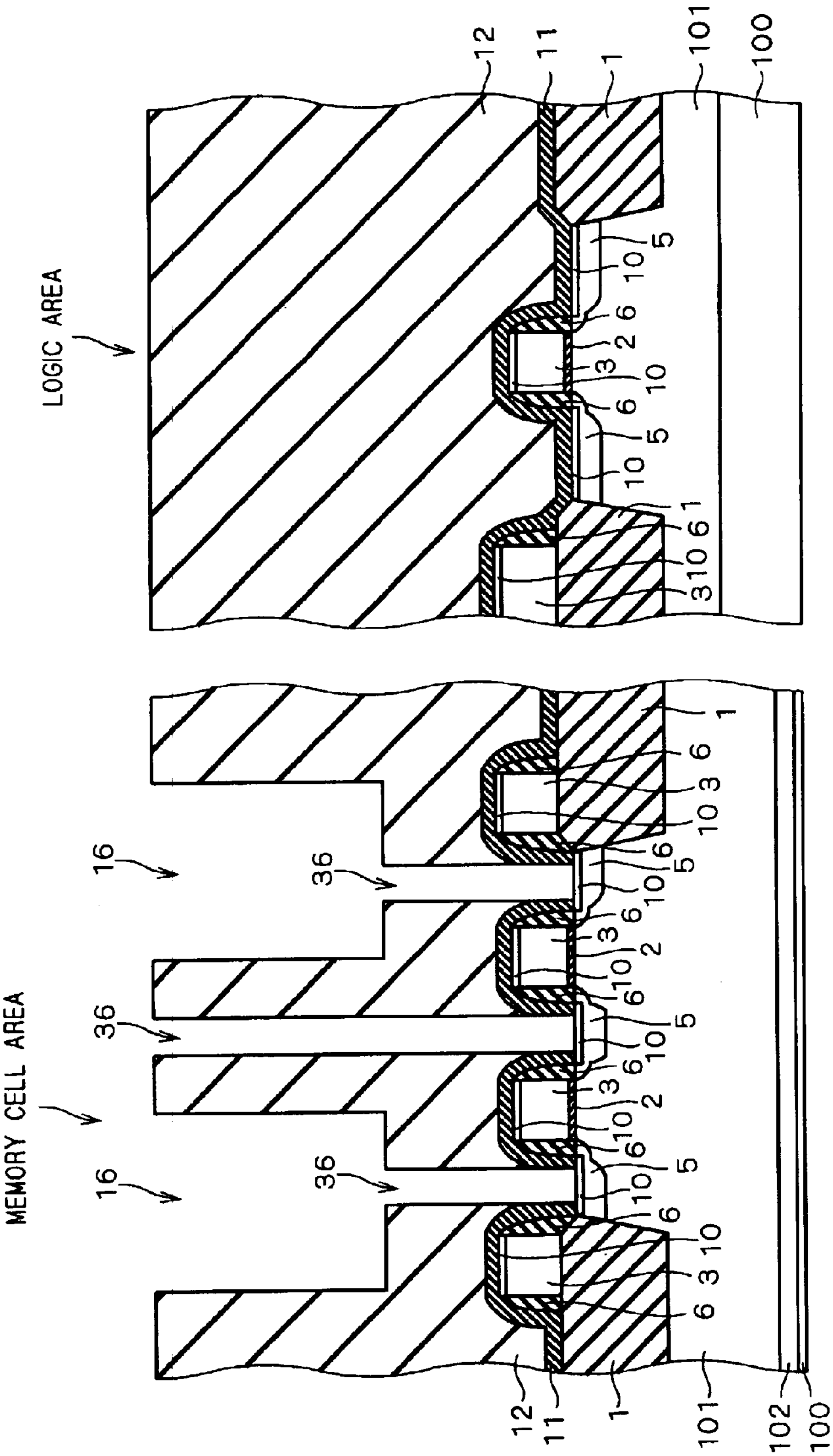

The opening 36, to hold a to-be-formed lower electrode therein, thereafter expands, which is hereinafter referred as an opening 16. In FIG. 64, among three openings 36 shown in the memory cell area, two except the one in the middle expand as the openings 16. The opening 16 holds the opening 36 therein, extending more widely than the opening 36. The bottoms of the openings 16 are created in the interlayer insulating film 12, never reaching the silicon nitride film 11. The openings 16 are created by controlling the duration of anisotropic etching. The openings 16 and 36 may be created in a reverse order.

Figure 65:
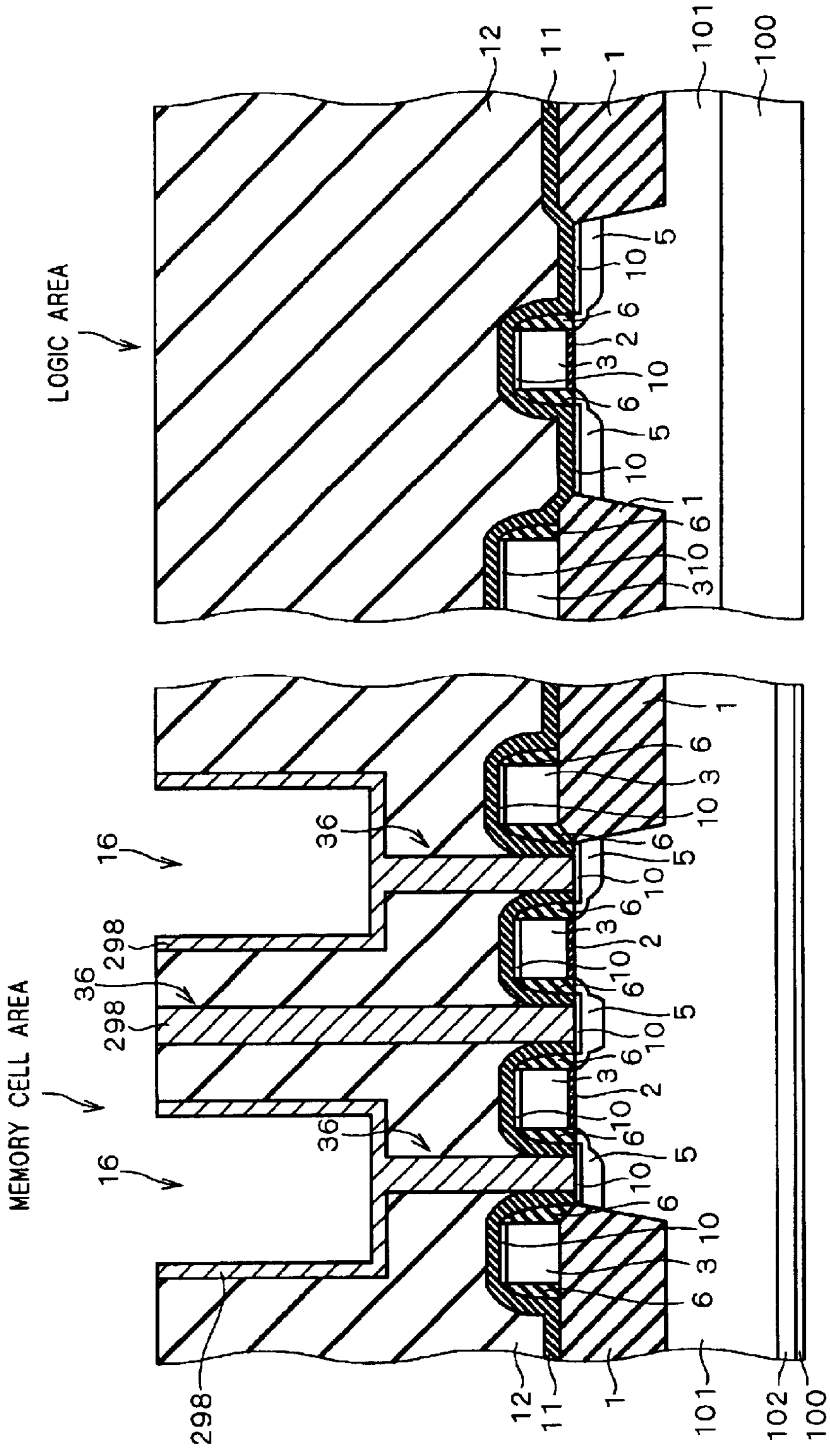

Next, a metal film 298 including high melting point metal (such as ruthenium) is entirely deposited, which is then subjected to anisotropic etching with a photoresist covering the openings 16 and 36. The resultant structure is as shown in FIG. 65, where the metal film 298 remains in the openings 36 for filling the same, and on the sidewalls and the bottoms of the openings 16. As an alternative to anisotropic etching, polishing may be performed using CMP.

Further deposited are a dielectric film (including tantalum penoxide, for example) and high melting point metal (such as ruthenium), which are shaped by patterning into capacitor dielectric films 33*j* and upper electrodes 30*j*, respectively. The metal film 298 remaining in the opening 16 is operative to serve as a lower electrode, which forms a capacitor Cj together with the upper electrode 30*j* and the capacitor dielectric film 33*j* (FIG. 66). The upper electrode 30*j*, the metal film 298 serving as a lower electrode, and the capacitor dielectric film 33*j* are not formed in the logic area, nor over the middle one among the three silicide films 10 in the upper surfaces of the source/drain regions 5 in the memory cell area. In the opening 16, the capacitor dielectric film 33*j* and the upper electrode 30*j* are provided in this order on the metal film 298.

The metal film 298 is provided on the bottom and the side surface of the opening 16. Therefore, the extensive surface area of the capacitor dielectric film 33*j* is provided, leading to the increase in electrostatic capacity of the capacitor Cj. Further, the deposition of the metal film 298 results in the formation of a contact plug for making contact with the silicide film 10 (the metal film 298 remaining in the opening 36) and the formation of a lower electrode (the metal film 298 remaining in the opening 16) by the same process, contributing to a cutback in the number of manufacturing steps.

The opening 36 is not necessarily required to be filled with the metal film 298. The metal film 298 may alternatively be provided to the bottom and the side surface of the opening 36, causing the capacitor dielectric film 33*j* and the upper electrode 30*j* to extend further into the opening 36. In this alternative structure, the capacitor Cj grows further in electrostatic capacity.

Figure 67:
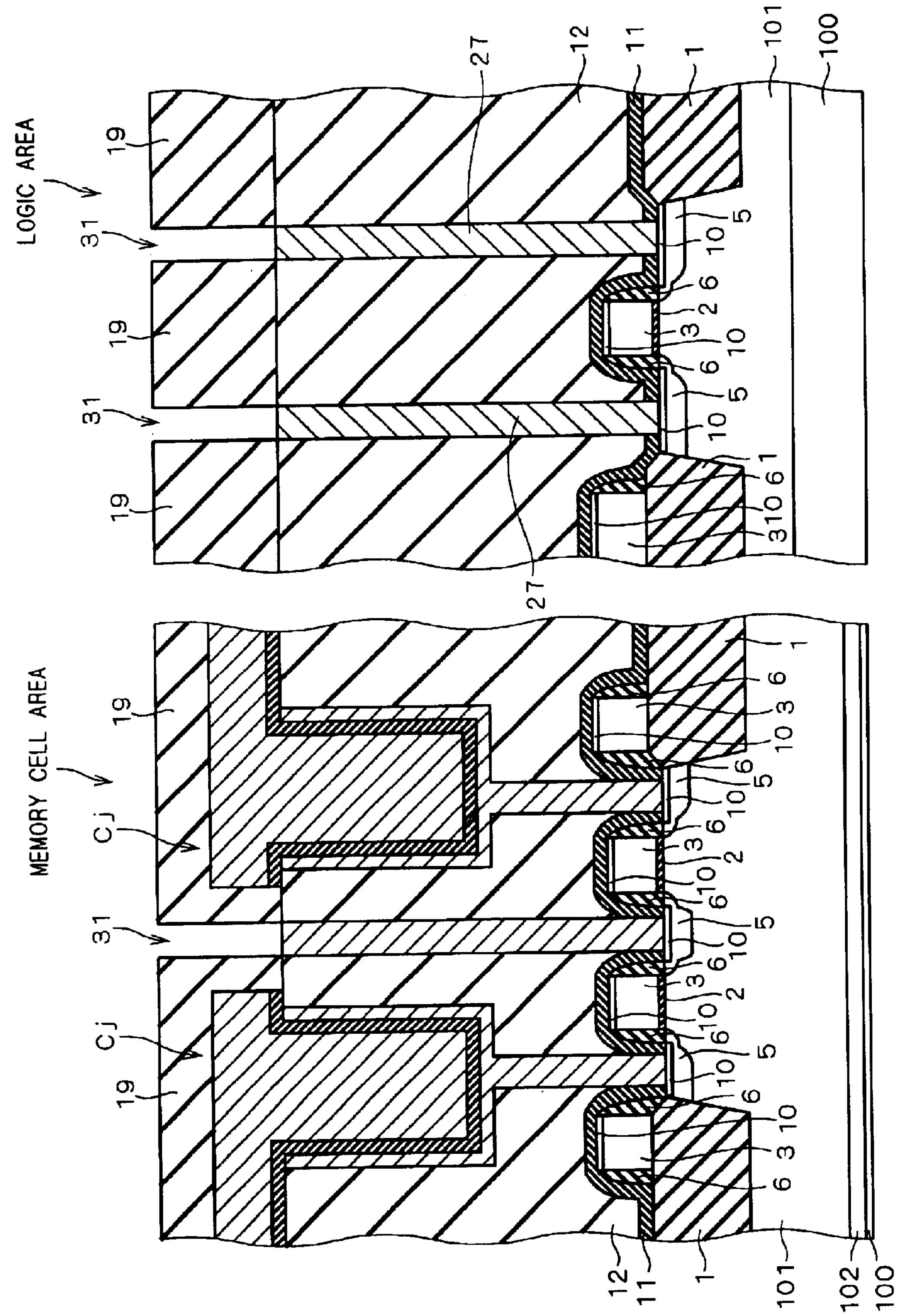
Figure 68:
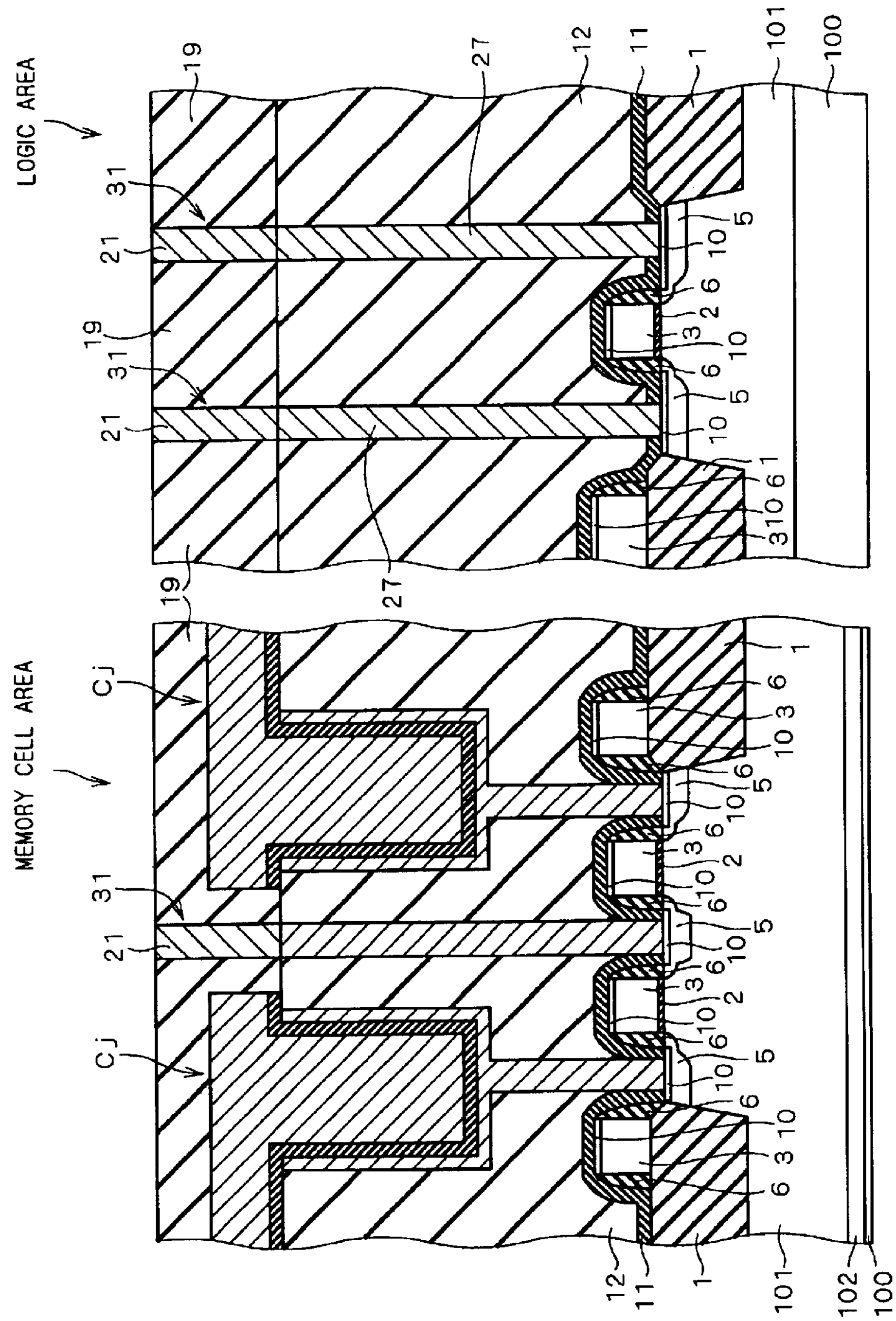
Figure 69:
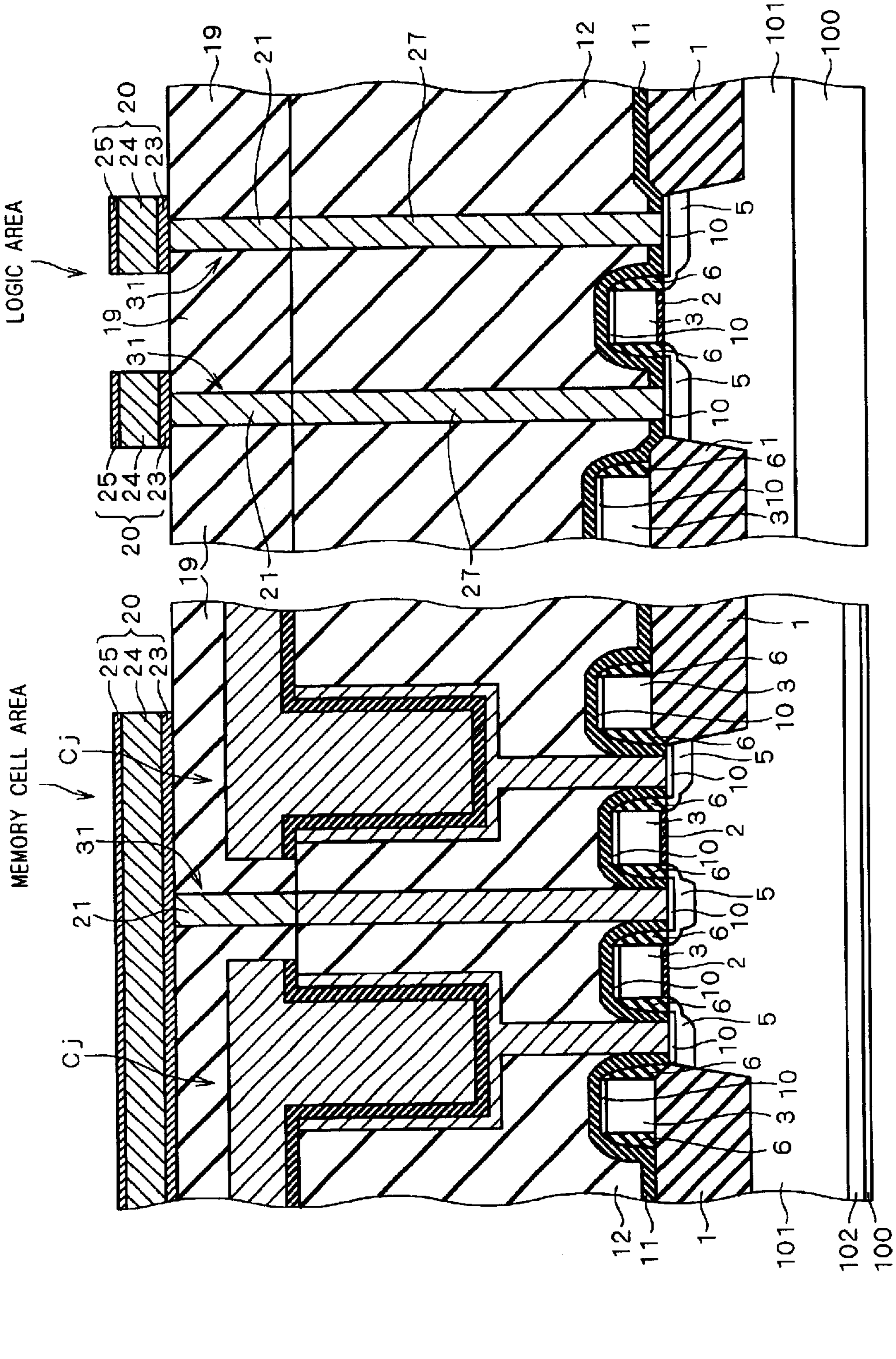

Next, the interlayer insulating film 19 is entirely deposited from the upper side of the structure of FIG. 66, followed by CMP to planarize the surface of the interlayer insulating film 19. The openings 31 are thereafter created to expose the silicide films 10 in the upper surfaces of the source/drain regions 5 in the logic area, and to expose the metal film 298 filling the opening 36 that is created over the middle one among the three silicide films 10 in the upper surfaces of the source/drain regions 5 in the memory cell area (FIG. 67). With regard to the formation of the opening 31, anisotropic etching is performed on the interlayer insulating film 19 using the metal film 298 as a stopper. Overetching of the interlayer insulating film 19 is avoided accordingly in the formation of the opening 31. Although not shown, the opening 31 may be so created to expose the upper electrode 30*j*. Thereafter, the openings 31 are filled with the contact metals 21 (FIG. 68). The next step is formation of the interconnect lines 20 on the interlayer insulating film 19 to be connected to the contact metals 21, as shown in FIG. 69.

The tenth preferred embodiment allows the increase in electrostatic capacity of the capacitor, and the simplification of the manufacturing steps.

Eleventh Preferred Embodiment

FIGS. 70 through 77 are sectional views illustrating a method of manufacturing a semiconductor device according to the eleventh preferred embodiment of the present invention, following the order of manufacturing steps. First, following the same steps as those of the first preferred embodiment, the structure shown in FIG. 7 is obtained. Next, the interlayer insulating film 15 and a nitride film, which may be a silicon nitride film 37, are deposited in this order from the upper side of the structure of FIG. 7. Thereafter, openings 32*k*1 penetrating the silicon nitride films 37, 28 and the interlayer insulating film 15 are created, whereby the contact metals 27 are exposed in the memory cell area. Following the description described so far, the structure shown in FIG. 70 is obtained. As an exemplary way to create the opening 32*k*1, the silicon nitride film 37 may be selectively removed, and thereafter, using the remaining silicon nitride film 37 as a mask and the silicon nitride film 28 as a stopper, anisotropic etching may be performed on the interlayer insulating film 15. The silicon nitride film 28 thereby exposed is then subjected to further etching.

Figure 71:
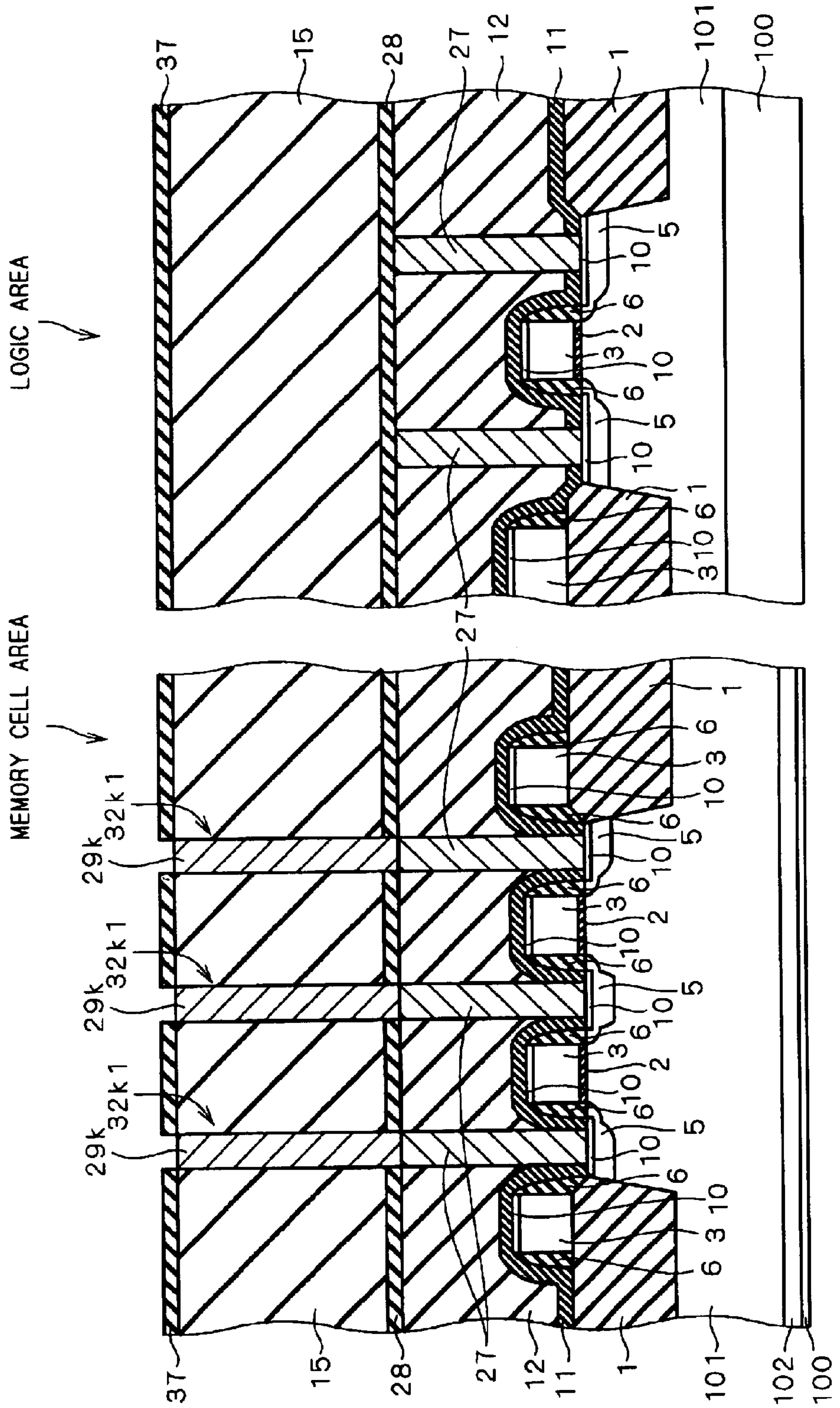

Next, a metal film including high melting point metal such as ruthenium is entirely deposited from the upper side of the structure of FIG. 70. This metal film subsequently undergoes anisotropic etching using the silicon nitride film 37 as a stopper. The resultant structure is as shown in FIG. 71, where this metal film remains in the openings 32*k*1 as metal films 29*k*. As an alternative to anisotropic etching, polishing my be performed using CMP to form the metal films 29*k*. The surfaces of the metal films 29*k* may be lower in level than the surface of the silicon nitride film 37.

Figure 72:
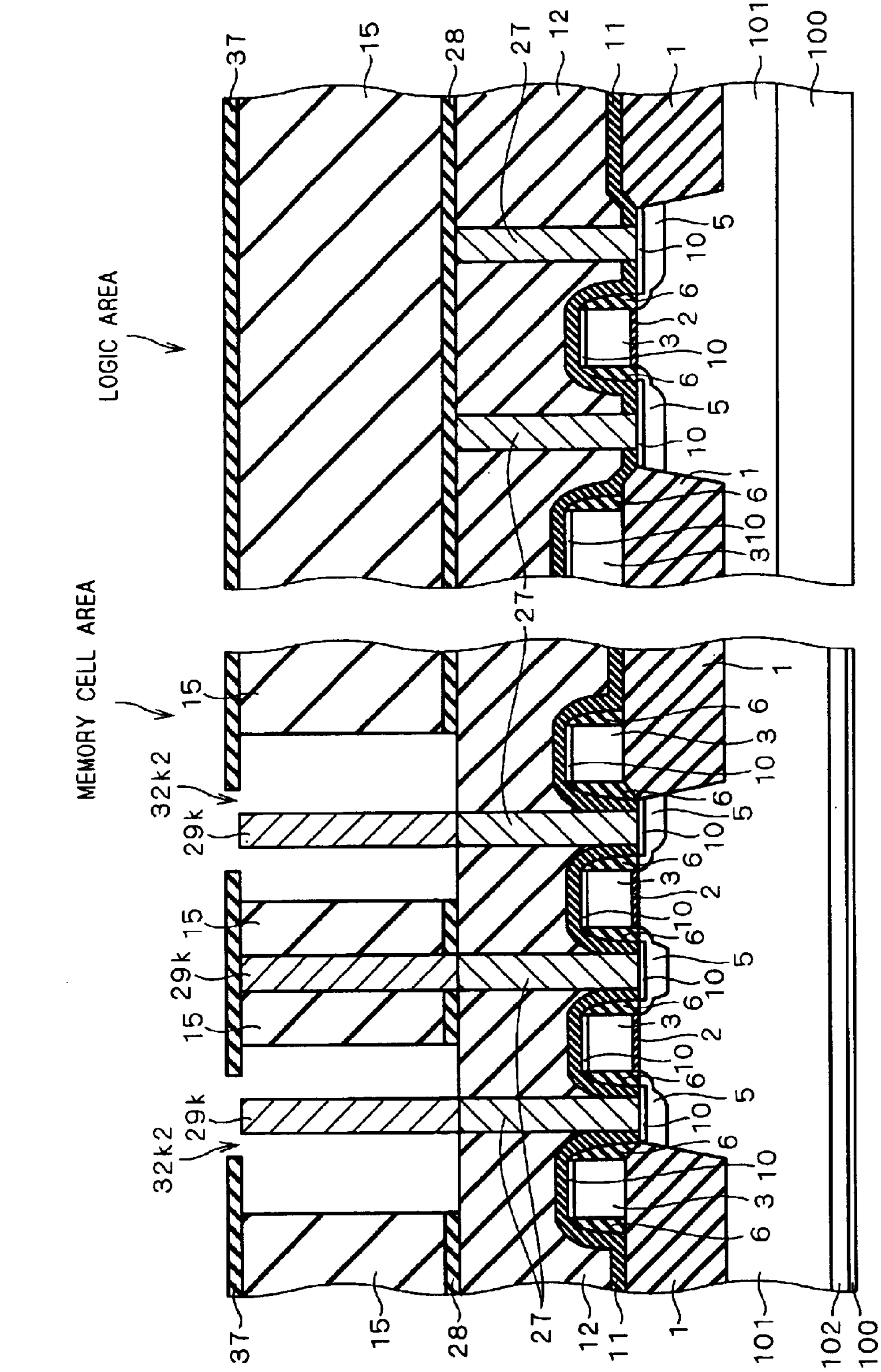

Thereafter, the side surface of the opening 32*k*1 is recessed from the metal film 29*k* by wet etching, for example. The resultant openings 32*k*2 extend farther than the openings 32*k*1 in a lateral direction, namely, in a direction perpendicular to a direction of the thickness of the semiconductor substrate 100 (FIG. 72). In FIG. 72, among three openings 32*k*1 shown in the memory cell area, two except the one in the middle expand as the openings 32*k*2. The openings 32*k*2 penetrate the silicon nitride film 28 and the interlayer insulating film 15. Thereafter the silicon nitride film 37 is removed by etching, to reach the structure of FIG. 73.

Figure 73:
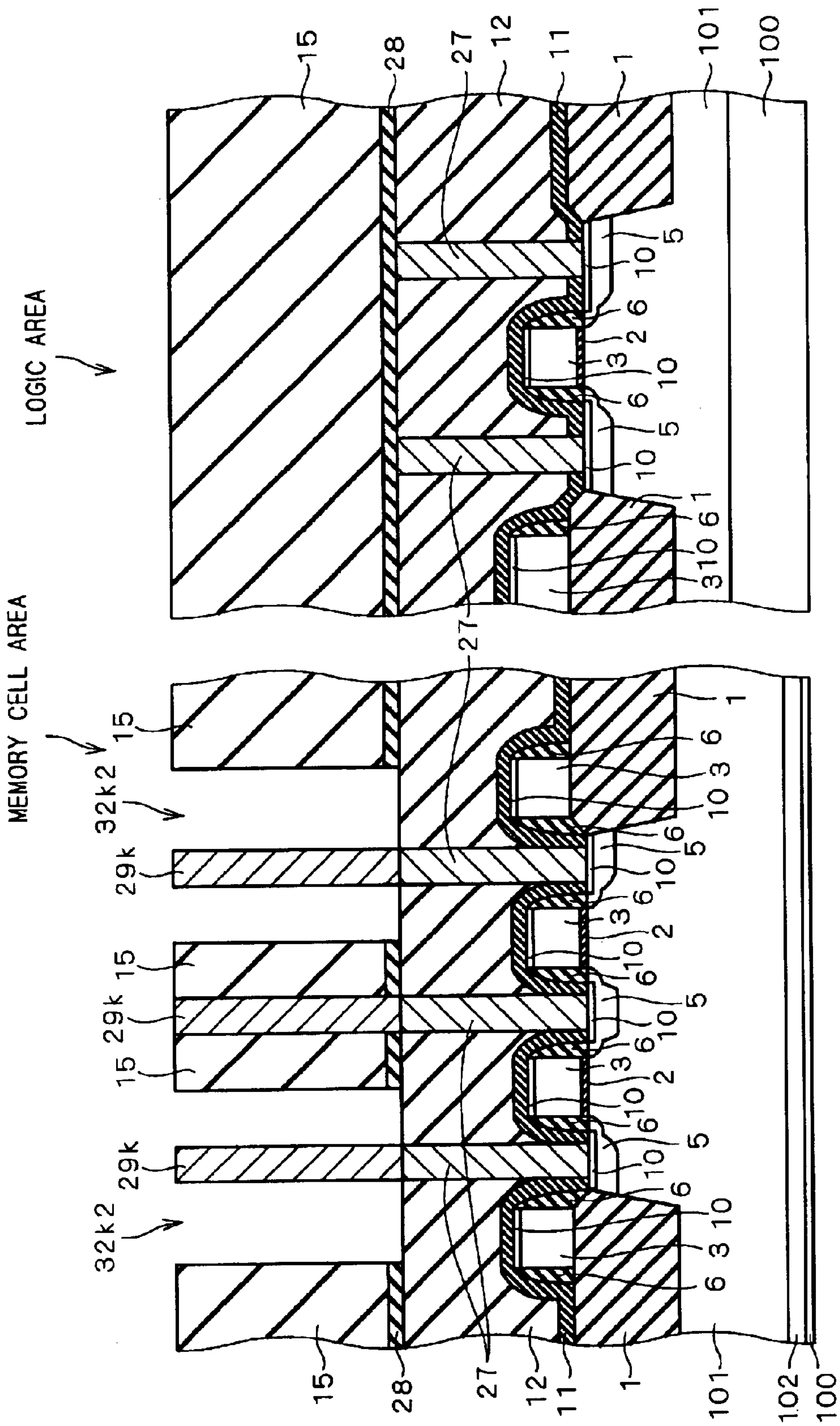

Next, a dielectric film (including tantalum penoxide, for example) is entirely deposited from the upper side of the structure shown in FIG. 73. Further deposited thereon is a metal film including high melting point metal such as ruthenium, followed by patterning to form capacitor dielectric films 33*k* and upper electrodes 30*k*. As a result, capacitors Ck each including the upper electrode 30*k*, the metal film 29*k* as a lower electrode, and the capacitor dielectric film 33*k* are obtained (FIG. 74). Both the capacitor dielectric film 33*k* and the upper electrode 30*k* are not formed in the logic area, nor over the middle one among the three contact metals 27 in the memory cell area. In the opening 32*k*2, the capacitor dielectric film 33*k* and the upper electrode 30*k* are stacked in this order, relative to the metal film 29*k*.

Next, the interlayer insulating film 19 is entirely deposited from the upper side of the structure of FIG. 74, followed by CMP to planarize the surface of the interlayer insulating film 19. The openings 31 are thereafter created to expose the contact metals 27 in the logic area, and the middle one among the three contact metals 27 in the memory cell area (FIG. 75). Although not shown, the opening 31 may be so created to expose the upper electrode 30*k*. With regard to the formation of the opening 31, anisotropic etching is performed on the interlayer insulating film 19 using the metal film 29*k* and the silicon nitride film 28 as a stopper, at a higher etching rate relative to the metal film 29*k* and the silicon nitride film 28. The silicon nitride film 28 thereby exposed is then subjected to further etching. Overetching of the interlayer insulating film 19 is avoided accordingly in the formation of the opening 31.

The openings 31 are then filed with the contact metals 21, as shown in FIG. 76. Overetching of the interlayer insulating film 19 is avoided in the formation of the openings 31. Therefore, the contact metal 21 filling the opening 31 is prevented from being short-circuited with the gate electrode 3 or the source/drain region 5.

The next step is formation of the interconnect lines 20 on the interlayer insulating film 19 to be connected to the contact metals 21, as shown in FIG. 77.

According to the eleventh preferred embodiment, while being surrounded by the upper electrode 30*k*, the metal film 29*k* protrudes toward the upper electrode 30*k*. As compared with the structure where a lower electrode surrounds an upper electrode, it is allowed accordingly to easily form the lower electrode. Further, in the formation of the metal film 29*k*, and still in the formation of the upper electrode 30*k*, the interlayer insulating film 15 remains, while removed for forming the capacitors Ck. This means that good flatness is provided, to easily perform the subsequent steps with high precision.

Twelfth Preferred Embodiment

Figure 78:
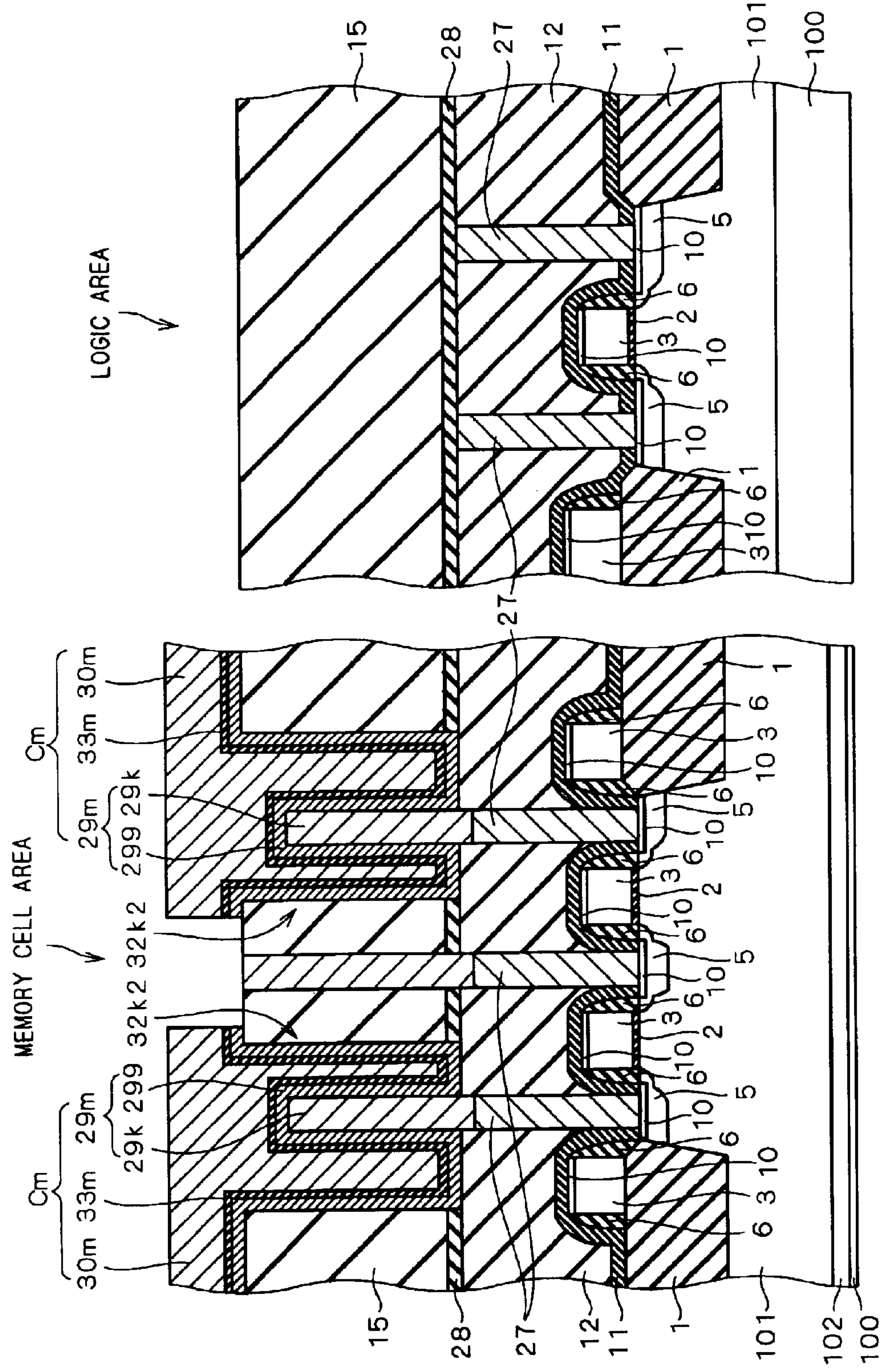
FIGS. 78 through 81 are sectional views illustrating a method of manufacturing a semiconductor device according to a twelfth preferred embodiment of the present invention, following the order of manufacturing steps.

FIGS. 78 through 81 are sectional views illustrating a method of manufacturing a semiconductor device according to the twelfth preferred embodiment of the present invention, following the order of manufacturing steps. First, following the same steps as those of the eleventh preferred embodiment, the structure shown in FIG. 73 is obtained. Next, a metal film including high melting point metal (such as ruthenium), a dielectric film (including tantalum penoxide, for example), and high melting point metal (such as ruthenium), are deposited in this order on the structure of FIG. 73, which thereafter undergo patterning to be shaped into metal films 299, capacitor dielectric films 33*m*, and upper electrodes 30*m*, respectively. The metal films 299 and 29*k* together form a lower electrode 29*m*. As a result, capacitors Cm each including the upper electrode 30*m*, the lower electrode 29*m*, and the capacitor dielectric film 33*m* are obtained (FIG. 78). The upper electrode 30*m*, the capacitor dielectric film 33*m*, and the metal film 299 are not formed in the logic area, nor over the middle one among the three contact metals 27 in the memory cell area. In the opening 32*k*2, the metal film 299, the capacitor dielectric film 33*m* and the upper electrode 30*m* are stacked in this order, relative to the metal film 29*k* and the interlayer insulating film 15.

The metal film 299 is provided, not only to the metal film 29*k*, but to the bottom and side surfaces of the opening 32*k*2. Therefore, the extensive surface area of the capacitor dielectric film 33*m* is provided, leading to the increase in electrostatic capacity of the capacitor Cm.

Figure 79:
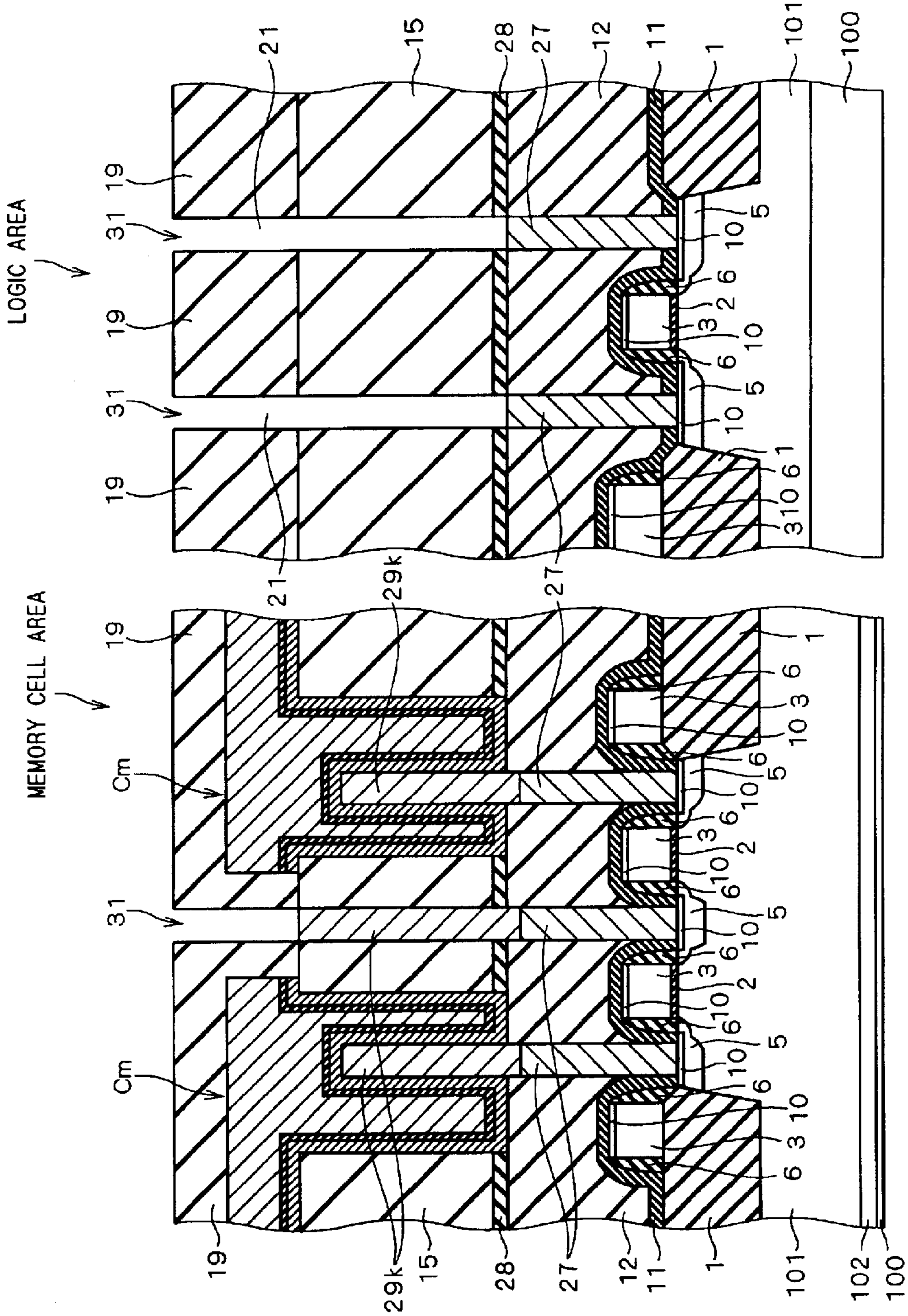
Figure 80:
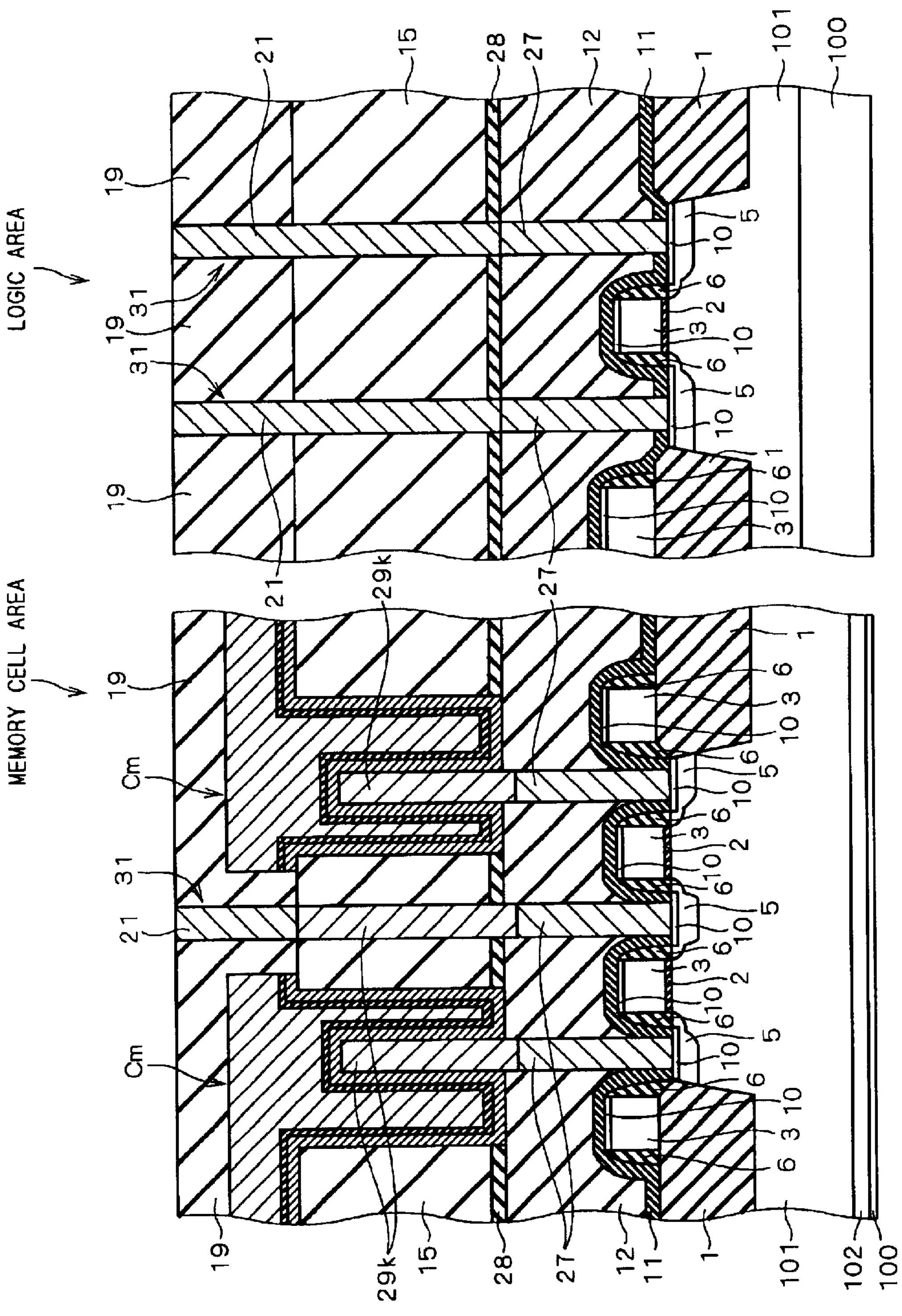

Next, the interlayer insulating film 19 is entirely deposited from the upper side of the structure of FIG. 78, followed by CMP to planarize the surface of the interlayer insulating film 19. The openings 31 are thereafter created to expose the contact metals 27 in the logic area, and the middle one among the three metal films 27 in the memory cell area (FIG. 79). Although not shown, the opening 31 may be so created to expose the upper electrode 30*m*. Thereafter the openings 31 are filled with the contact metals 21 (FIG. 80).

Figure 81:
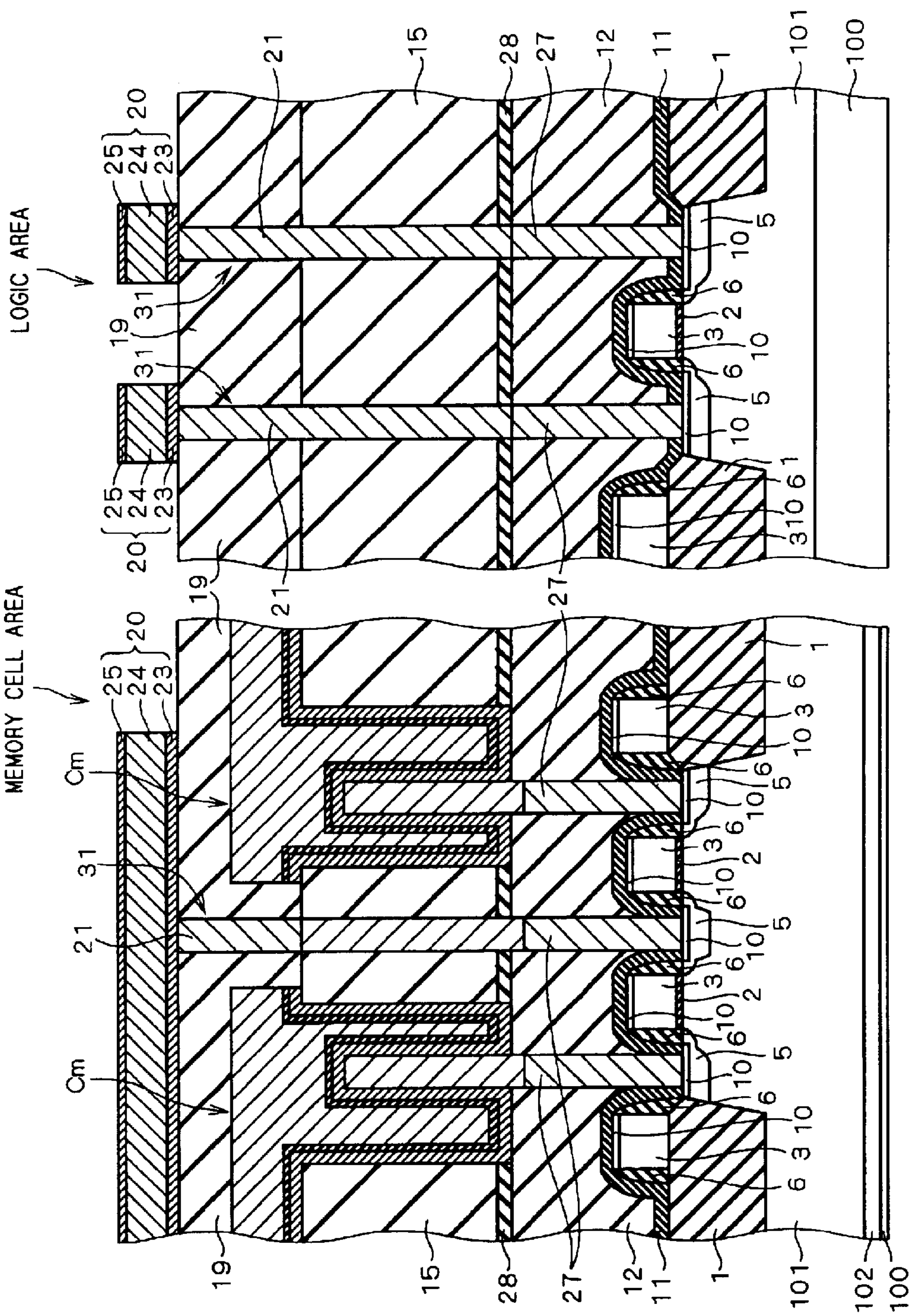

The next step is formation of the interconnect lines 20 on the interlayer insulating film 19 to be connected to the contact metals 21, as shown in FIG. 81.

The twelfth preferred embodiment realizes the same effect as obtained in the eleventh preferred embodiment. Further, the capacitor dielectric film 33*m* covers a more extensive area than the one covered by the capacitor dielectric film 33*k*, contributing to the increase in capacity of the capacitor Cm.

Thirteenth Preferred Embodiment

Figure 82:
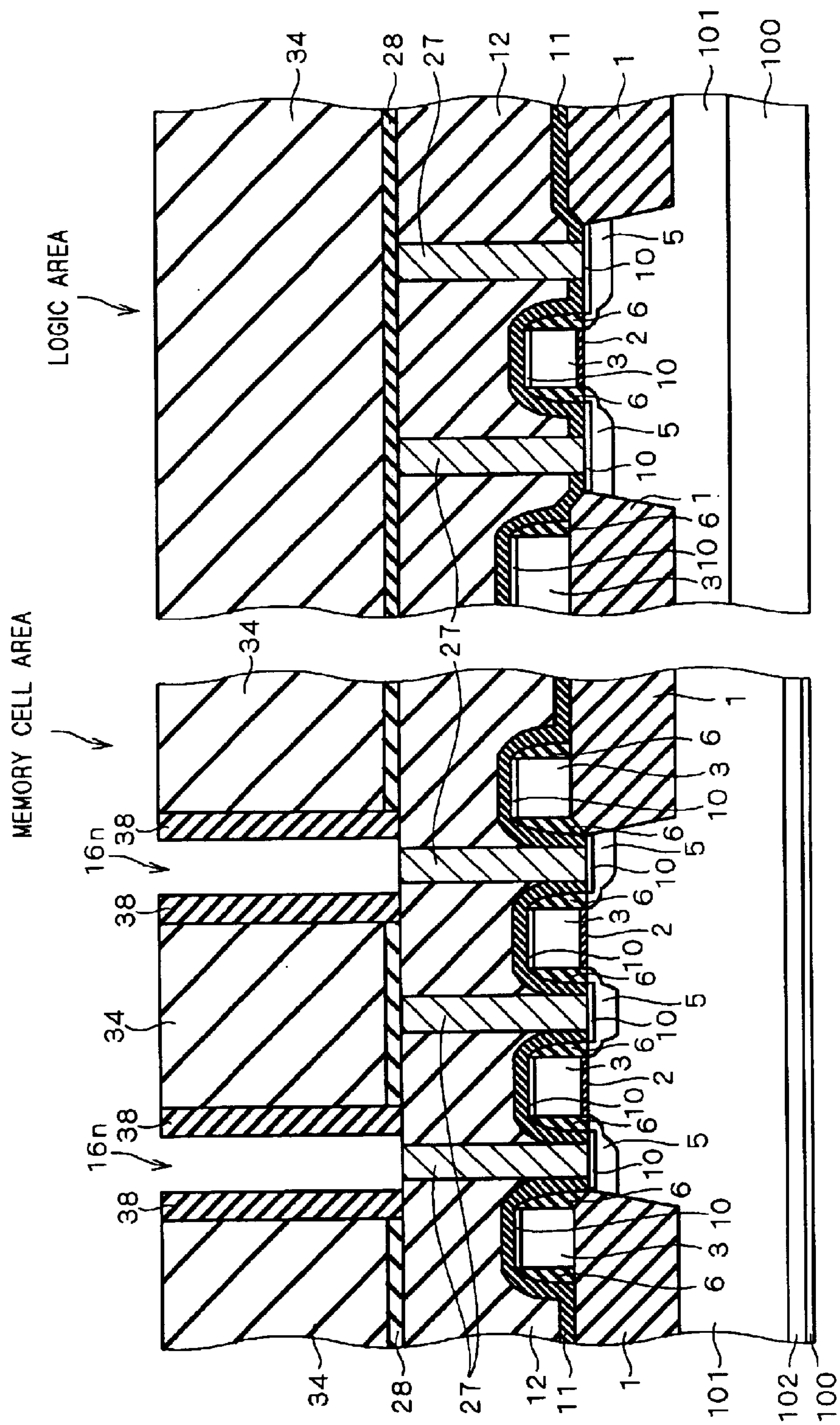

FIGS. 82 through 87 are sectional views illustrating a method of manufacturing a semiconductor device according to the thirteenth preferred embodiment of the present invention, following the order of manufacturing steps. First, following the same steps as those of the first preferred embodiment, the structure shown in FIG. 7 is obtained. Next, an interlayer insulating film 34 is entirely deposited from the upper side of the structure of FIG. 7. As an example, the interlayer insulating film 34 may be a non-doped silicon oxide film. Thereafter, openings 16*n* penetrating the interlayer insulating film 34 and the silicon nitride film 28 are created, whereby the contact metal 27, to hold a to-be-formed lower electrode thereon, is exposed. As an exemplary way to create the opening 16*n*, anisotropic etching may be performed on the interlayer insulating film 34 using the silicon nitride film 28 as a stopper. The silicon nitride film 28 thereby exposed is then subjected to further etching. Next, an insulating film 38 is entirely deposited from the upper side, followed by anisotropic etching thereof, whereby the insulating film 38 remains only on the side surfaces of the openings 16*n*. Following the steps described so far, the structure shown in FIG. 82 is obtained. The opening 16*n* is directed to the formation of a lower electrode of a capacitor, and therefore, is not created in the logic area. In the exemplary view of FIG. 82, among the three contact metals 27 shown in the memory cell area, two except the one in the middle are exposed by the openings 16*n*.

Next, a metal film including high melting point metal such as ruthenium is entirely deposited from the upper side of the structure of FIG. 82, which then undergoes anisotropic etching using a photoresist covering the regions over the openings 16*n* as a mask. As an alternative to anisotropic etching, polishing may be performed using CMP. As a result, the metal film remains only in the openings 16*n* as lower electrodes 29*n*. The insulating film 38 in the openings 16*n* is thereafter removed. The insulating film 38 may be a BPTEOS film, for example. As described in the second preferred embodiment, the insulating film 38 is thus etched at a higher etching rate relative to the interlayer insulating film 34. While keeping the amount of etching of the interlayer insulating film 34 small, the insulating film 38 in the openings 16*n* can be removed accordingly. Following the steps described so far, the structure shown in FIG. 83 is obtained, where the lower electrodes 29*n* are surrounded by the opening 16*n*.

A dielectric film (including tantalum penoxide, for example) is entirely deposited from the upper side of the structure of FIG. 83. Further deposited thereon is a metal film including high melting point metal (such as ruthenium). These films thereafter undergo patterning, whereby capacitor dielectric films 33*n* and upper electrodes 30*n* are formed. As a result, capacitors Cn each including the upper electrode 30*n*, the lower electrode 29*n*, and the capacitor dielectric film 33*n* are obtained (FIG. 84). Both the capacitor dielectric film 33*n* and the upper electrode 30*n* are not formed in the logic area, nor over the middle one among the three contact metals 27 in the memory cell area. In the opening 16*n*, the capacitor dielectric film 33*n* and the upper electrode 30*n* are stacked in this order, relative to the lower electrode 29*n*.

Figure 85:
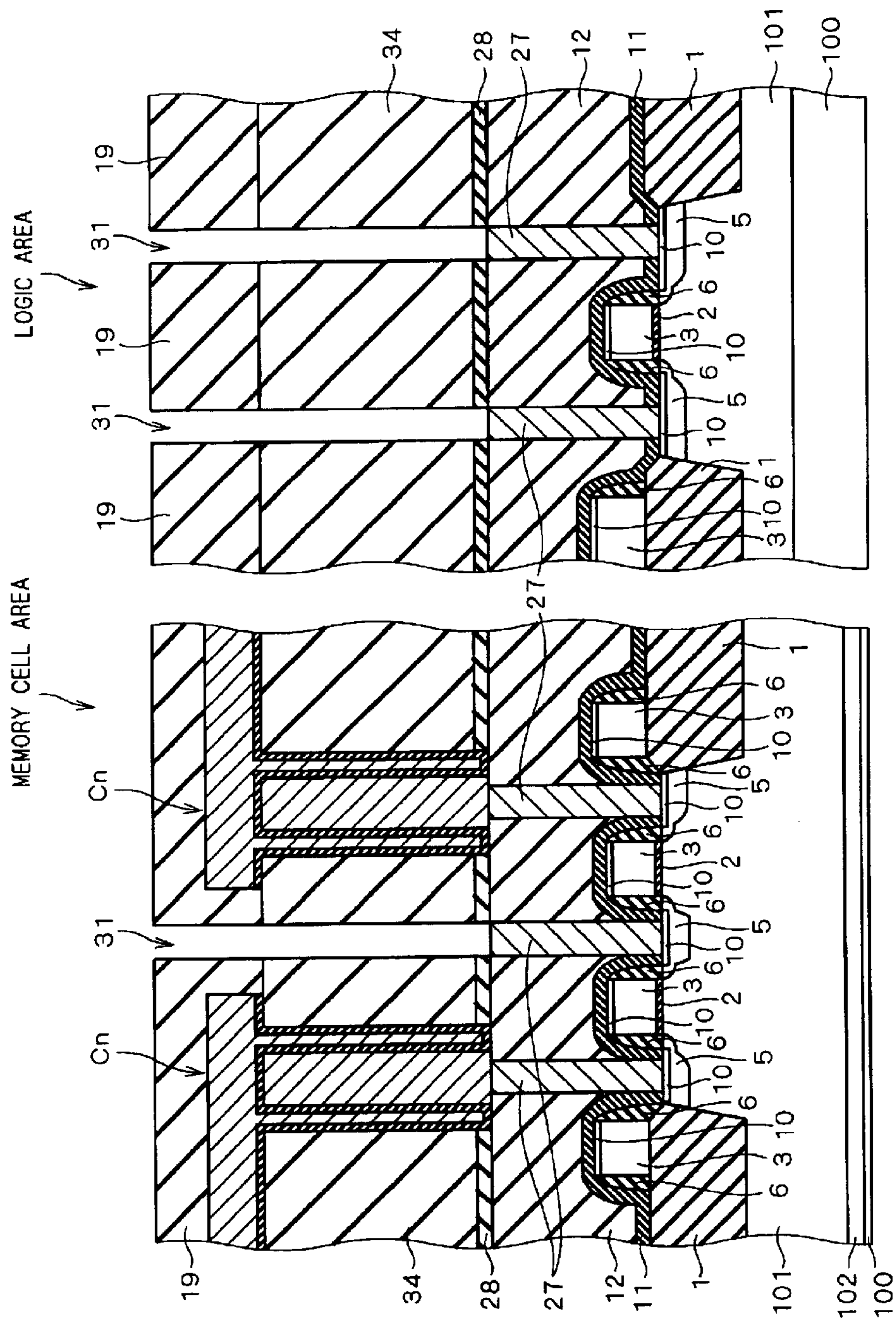
Figure 86:
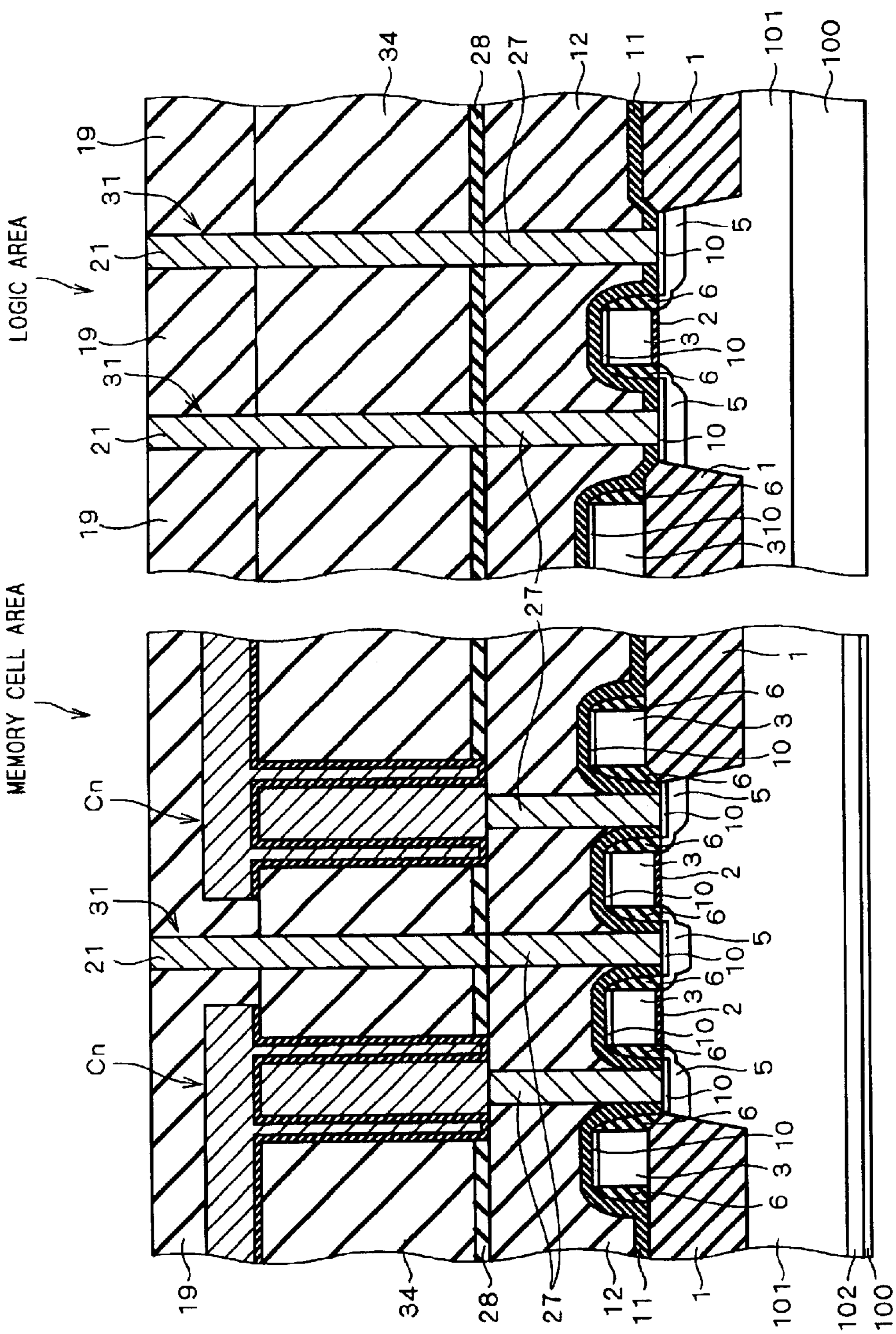

Next, the interlayer insulating film 19 is entirely deposited from the upper side of the structure of FIG. 84, followed by CMP to planarize the surface of the interlayer insulating film 19. The openings 31 are thereafter created to expose the contact metals 27 in the logic area, and the middle one among the three contact metals 27 in the memory cell area (FIG. 85). Although not shown, the opening 31 may be so created to expose the upper electrode 30*n*. Thereafter the openings 31 are filled with the contact metals 21 (FIG. 86).

In the formation of the opening 16*n*, the silicon nitride film 28 is once used as a stopper, and is then subjected to further etching. Therefore, the opening 16*n* is unlikely to expand at the bottom, avoiding short circuit of the lower electrode 29*n* with the gate electrode 3 or the source/drain region 5. Further, overetching of the interlayer insulating film 19 is avoided in the formation of the opening 31 using the silicon nitride film 28 as a stopper. Therefore, the contact metal 21 filling the opening 31 is also prevented from being short-circuited with the gate electrode 3 or the source/drain region 5.

Figure 87:
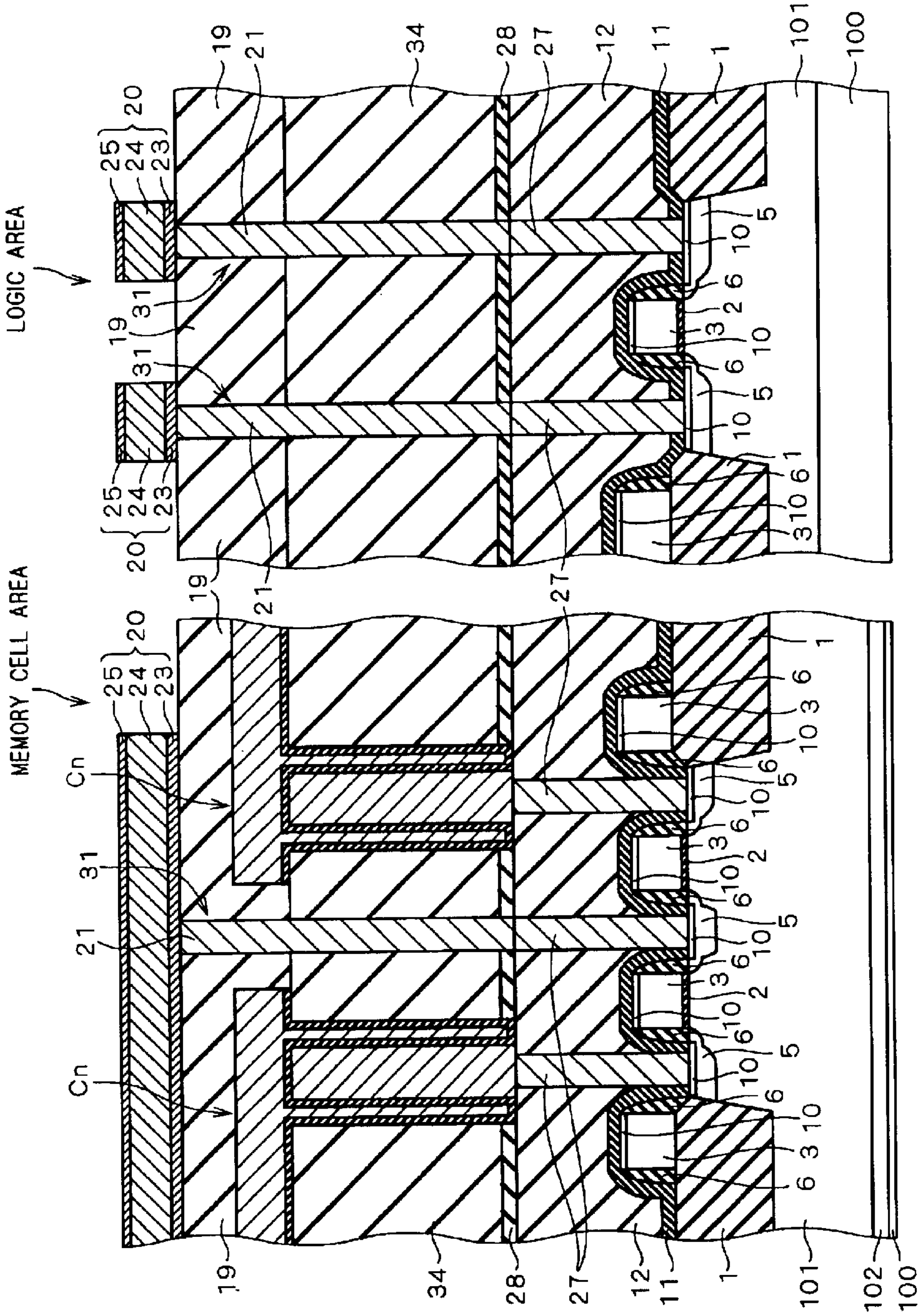

The next step is formation of the interconnect lines 20 on the interlayer insulating film 19 to be connected to the contact metals 21, as shown in FIG. 87.

According to the thirteenth preferred embodiment, while being surrounded by the upper electrode 30*n*, the lower electrode 29*n* protrudes toward the upper electrode 30*n*. As compared with the structure where a lower electrode surrounds an upper electrode, it is allowed accordingly to easily form the lower electrode. Further, in the formation of the lower electrode 29*n*, and still in the formation of the upper electrode 30*n*, the interlayer insulating film 34 remains, while removed for forming the capacitors Cn. This means that good flatness is provided, to easily perform the subsequent steps with high precision.

Fourteenth Preferred Embodiment

Figure 88:
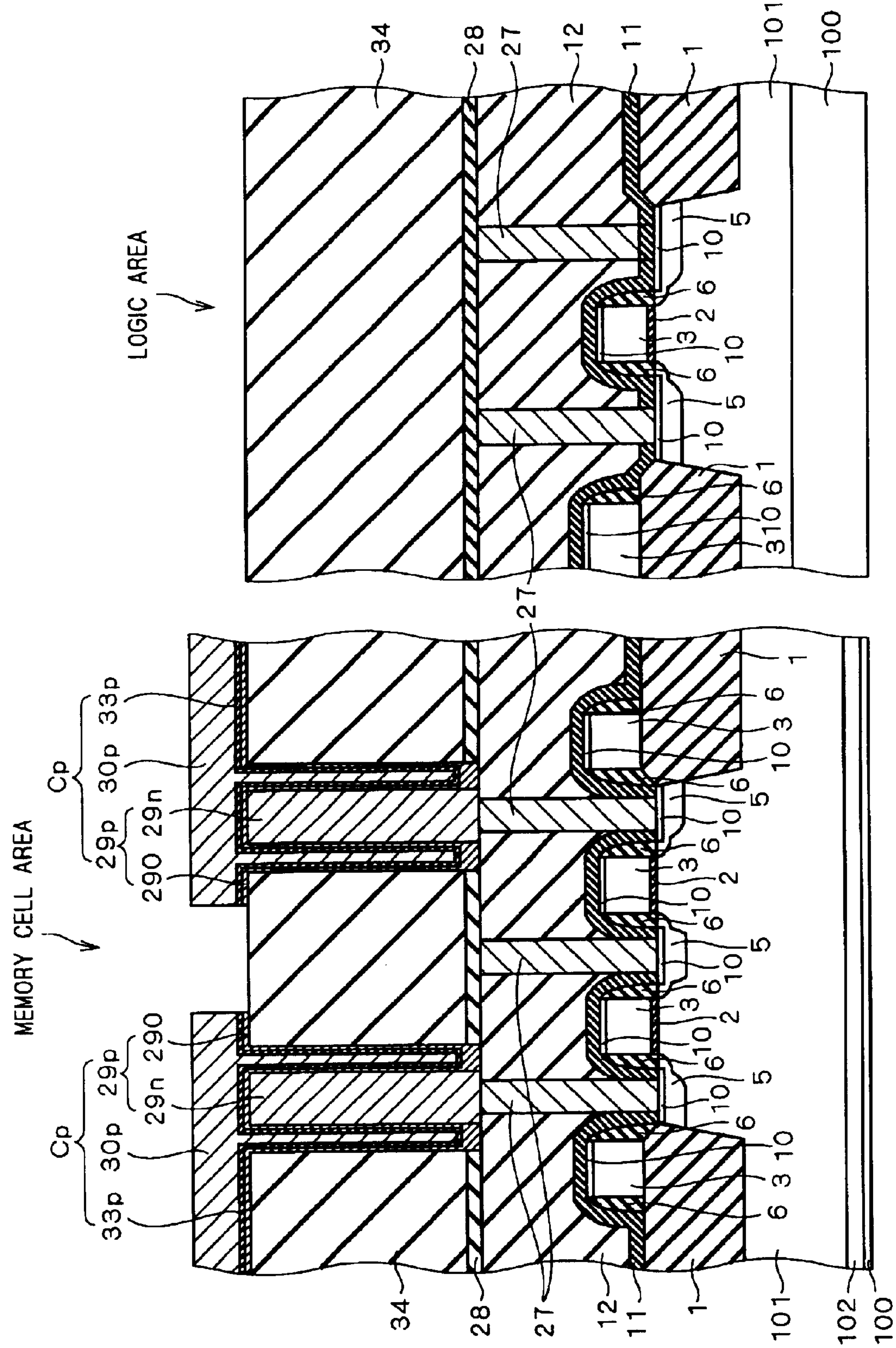

FIGS. 88 through 91 are sectional views illustrating a method of manufacturing a semiconductor device according to the fourteenth preferred embodiment of the present invention, following the order of manufacturing steps. First, following the same steps as those of the thirteenth preferred embodiment, the structure shown in FIG. 83 is obtained. Next, a metal film including high melting point metal (such as ruthenium), a dielectric film (including tantalum penoxide, for example), and high melting point metal (such as ruthenium) are deposited in this order on the structure of FIG. 83, which thereafter undergo patterning to be shaped into metal films 290, capacitor dielectric films 33*p*, and upper electrodes 30*p*, respectively. The metal film 290 and the lower electrode 29*n* together form a lower electrode 29*p*. As a result, capacitors Cp each including the upper electrode 30*p*, the lower electrode 29*p*, and the capacitor dielectric film 33*p* are obtained (FIG. 88). The upper electrode 30*p*, the capacitor dielectric film 33*p*, and the metal film 290 are not formed in the logic area, nor over the middle one among the three contact metals 27 in the memory cell area. In the opening 16*n*, the metal film 290, the capacitor dielectric film 33*p*, and the upper electrode 30*p* are stacked in this order, relative to the lower electrode 29*n* and the interlayer insulating film 34.

The metal film 290 is provided, not only to the lower electrode 29*n*, but to the bottom and side surfaces of the openings 16*n*. Therefore, the extensive surface area of the capacitor dielectric film 33*p* is provided, leading to the increase in electrostatic capacity of the capacitor Cp.

Figure 89:
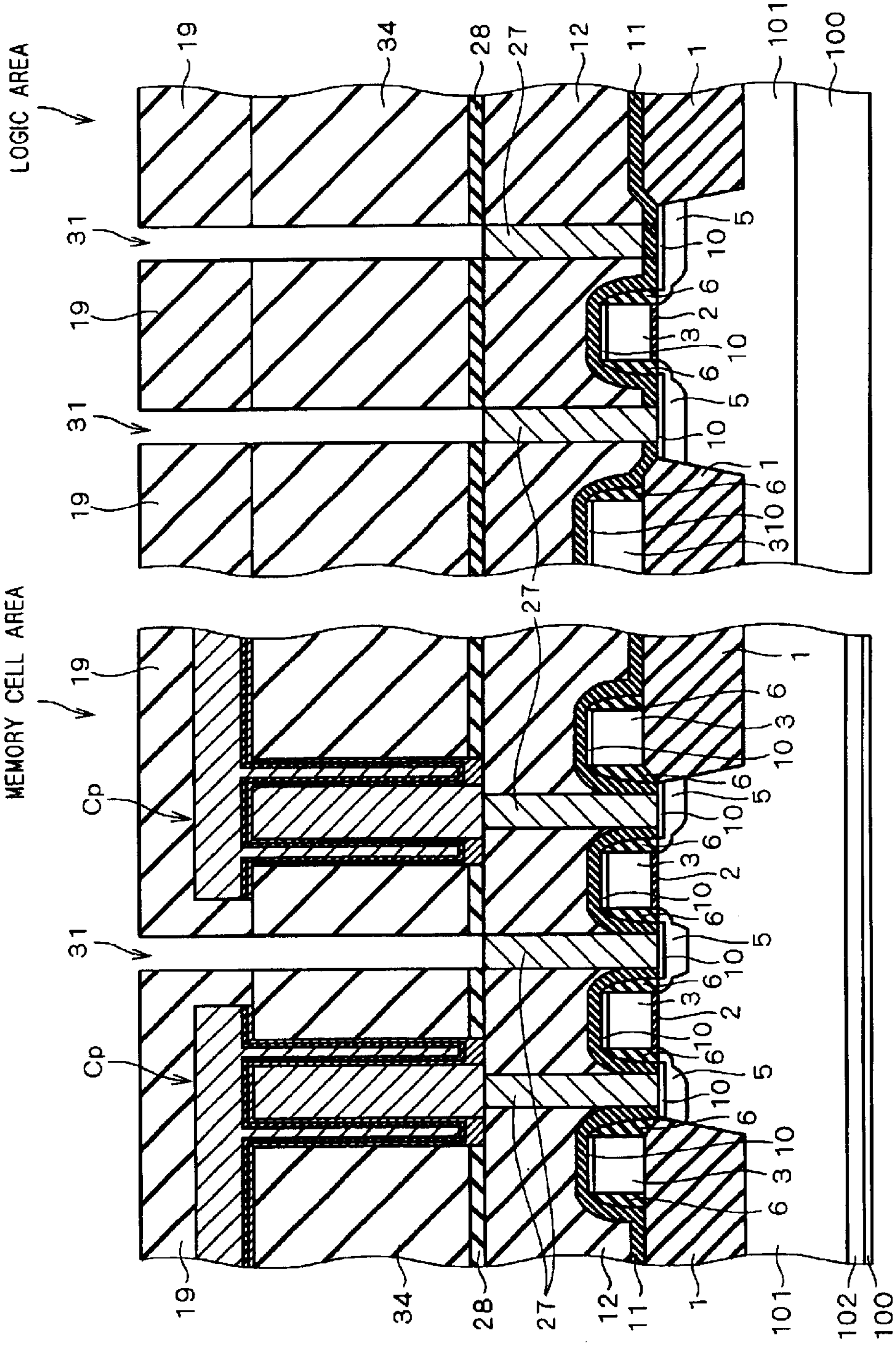
Figure 90:
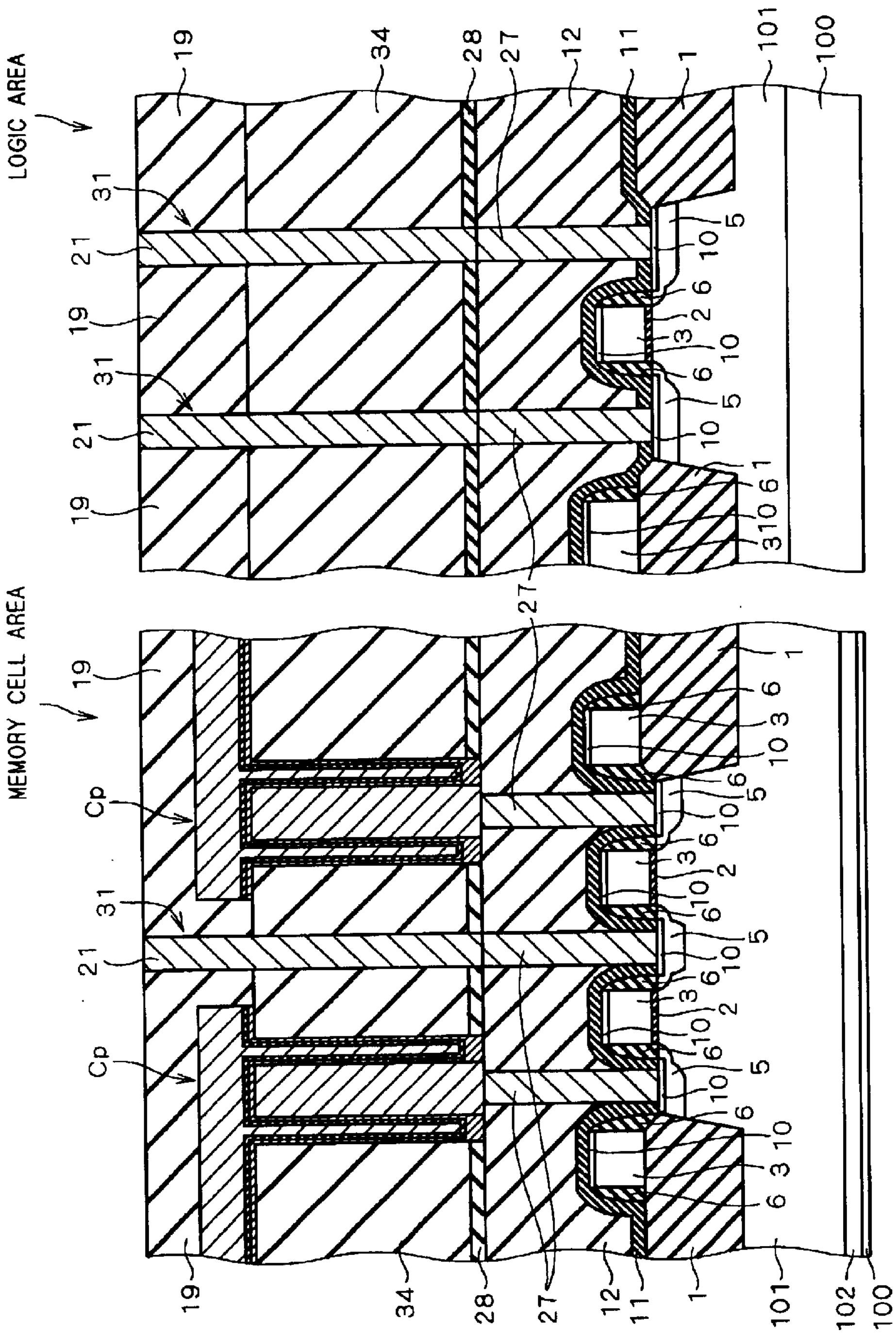

Next, the interlayer insulating film 19 is entirely deposited from the upper side of the structure of FIG. 88, followed by CMP to planarize the surface of the interlayer insulating film 19. The openings 31 are thereafter created to expose the contact metals 27 in the logic area, and the middle one among the three contact metals 27 in the memory cell area (FIG. 89). Although not shown, the opening 31 may be so created to expose the upper electrode 30*p*. Thereafter the openings 31 are filled with the contact metals 21 (FIG. 90).

The next step is formation of the interconnect lines 20 on the interlayer insulating film 19 to be connected to the contact metals 21, as shown in FIG. 91.

The fourteenth preferred embodiment realizes the same effect as obtained in the thirteenth preferred embodiment. Further, the capacitor dielectric film 33*p* covers a more extensive area than the one covered by the capacitor dielectric film 33*n*, contributing to the increase in capacity of the capacitor Cp.

Modifications

FIGS. 92 through 98 are sectional views each illustrating a modification of the present invention. The structures shown in FIGS. 92 through 98 correspond to those of the first, third, fourth, fifth, sixth, eighth and tenth preferred embodiment, respectively except that the interconnect lines 20 are replaced by interconnect lines 40. The interconnect lines 40 each have a two-layered structure including a barrier metal 41 and a copper interconnect line 42. The barrier metal 41 is operative to serve as an underlying layer of the copper interconnect line 42. The copper interconnect line 42 touches the contact metal 21.

With regard to the formation of the interconnect line 40, the structures of FIGS. 13, 27, 31, 40, 47, 57 and 68 are subjected to a damascene process, to respectively reach the structures of FIGS. 92 through 98 including the interconnect line 40.

Figure 92:
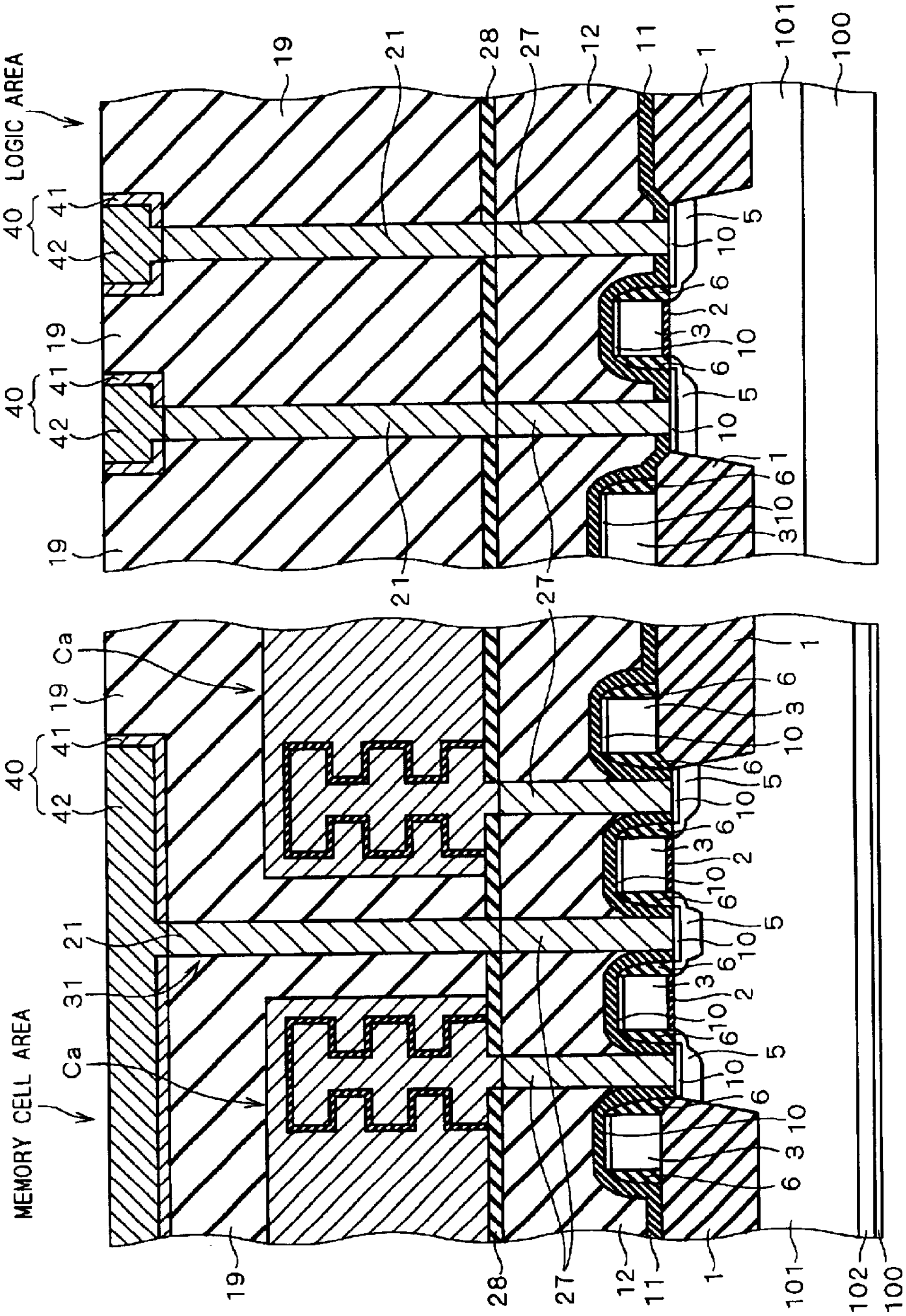
Figure 93:
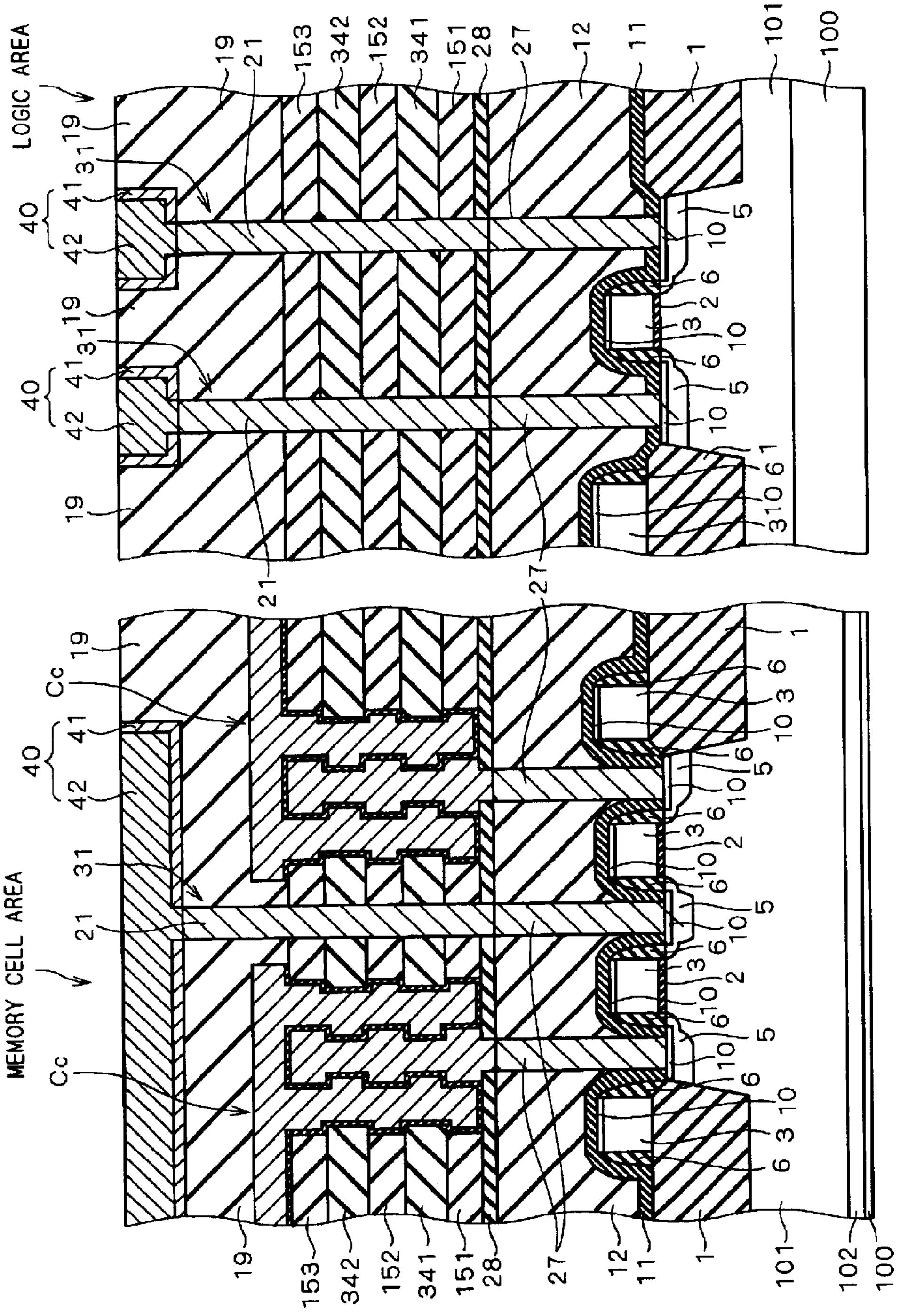
Figure 94:
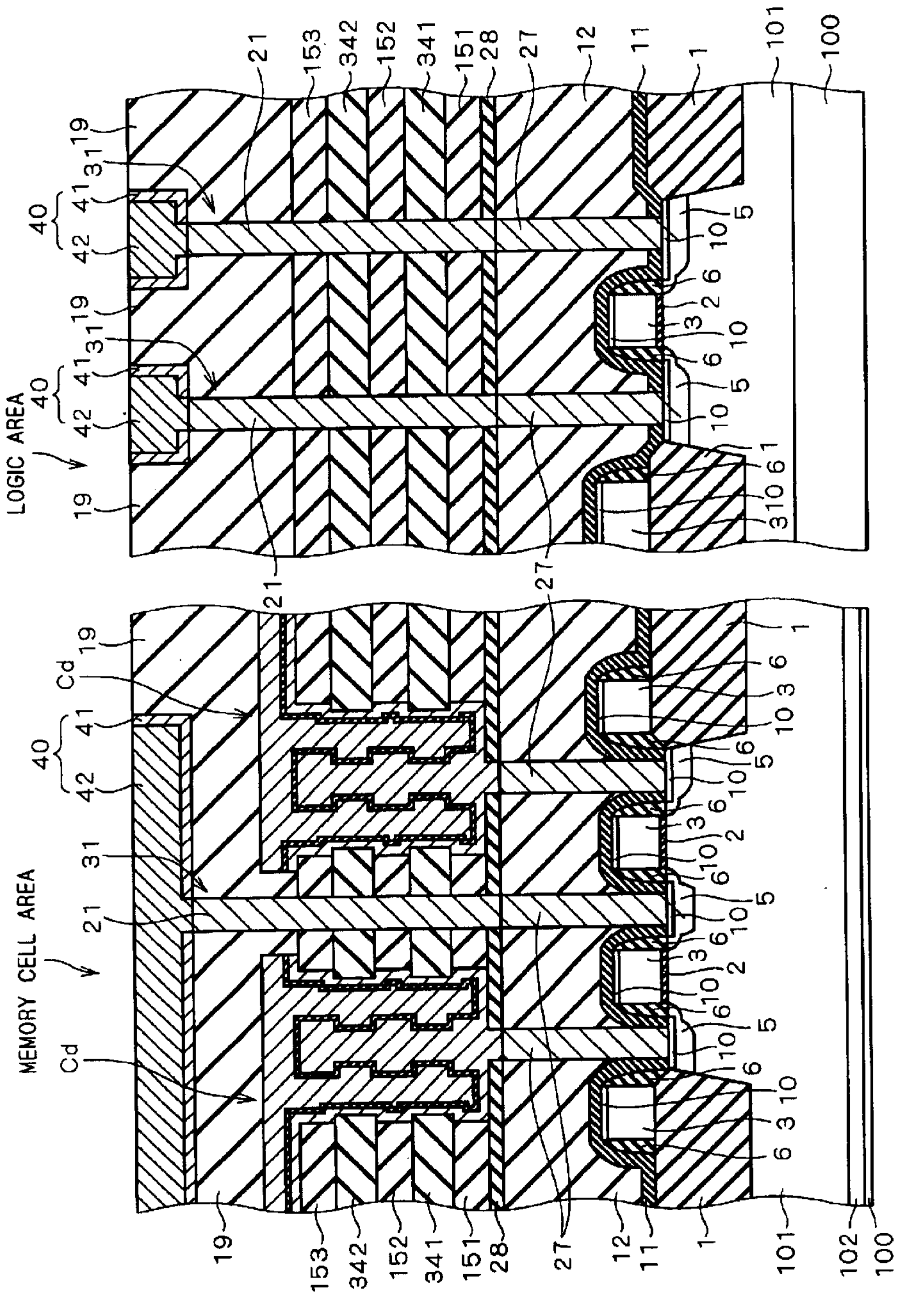
Figure 95:
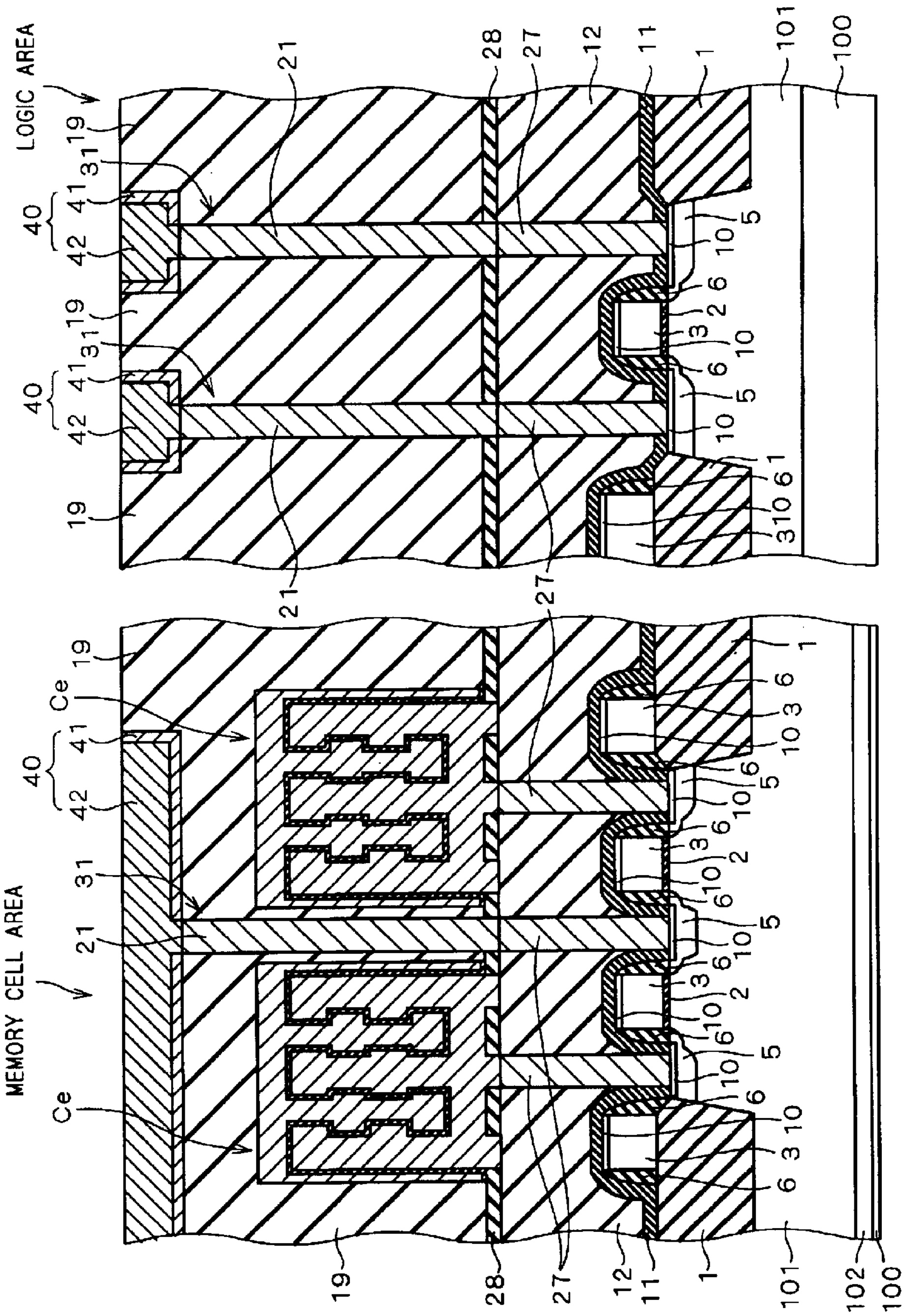
Figure 97:
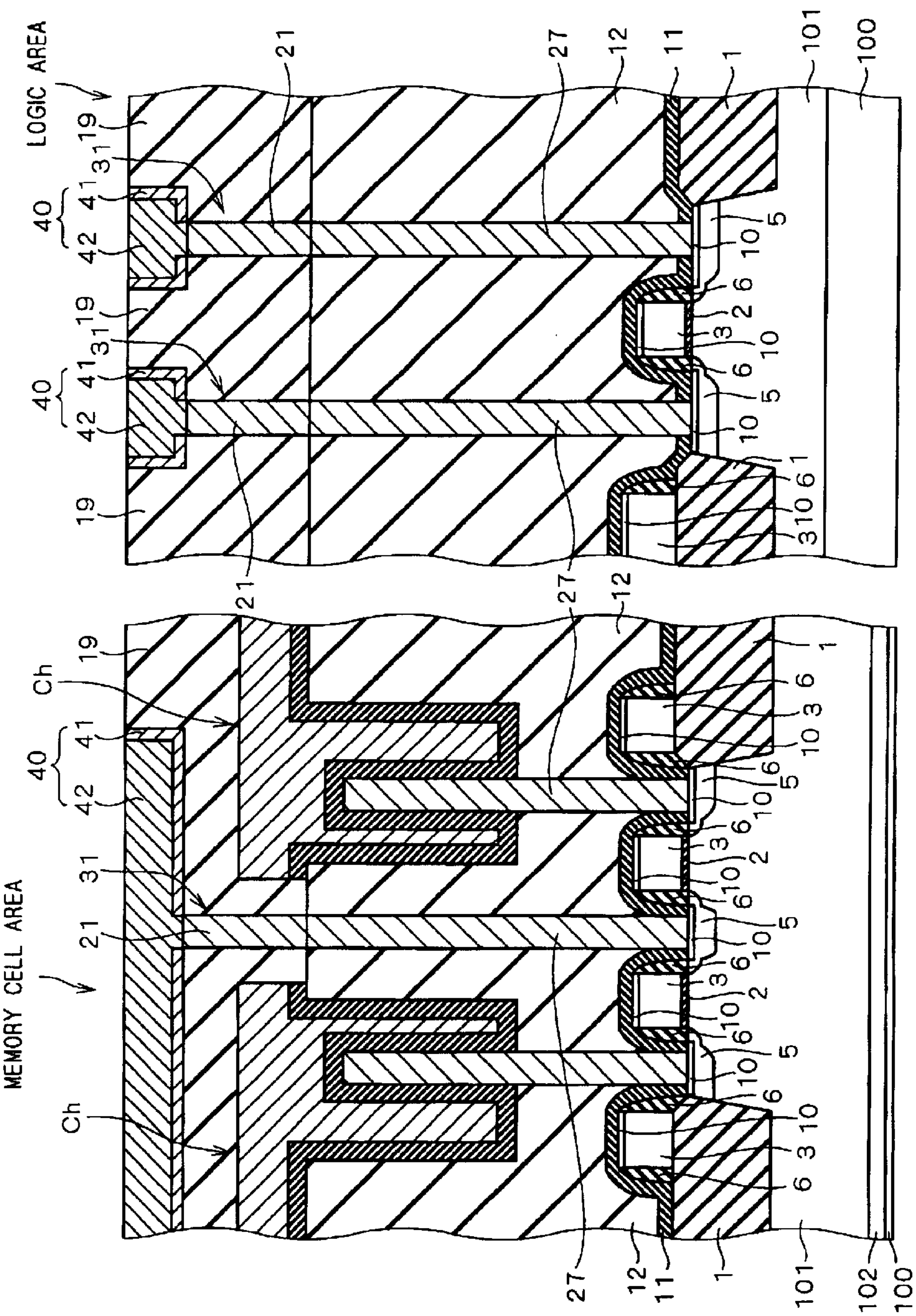

Following the same process to reach the structure of FIG. 92, the interconnect line 20 may also be replaced by the interconnect line 40 in the second preferred embodiment. With regard to the seventh, eleventh and thirteenth preferred embodiments, further, the interconnect line 20 may be replaced by the interconnect line 40 by the same process to reach the structure of FIG. 96. Still further, following the same process to reach the structure of FIG. 97, the interconnect line 40 may also be provided in the ninth, twelfth and fourteenth preferred embodiments instead of the interconnect line 20.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor device, comprising the steps of:

creating a separate first opening and a separate third opening completely through an insulating film using a same process;

creating a second opening in said insulating film communicating with said first opening but not said third opening, said second opening being wider than said first opening and having a bottom in said insulating film; and depositing a first metal film, a dielectric film, and a second metal film, to be stacked in this order above said first opening with only said first metal film being deposited so as to extend into and to fill the first and the third opening so as to form contact plugs to an area exposed by the first and third openings, wherein said second metal film is operative to serve as an upper electrode, and at least said first metal film in said second opening is operative to serve as a lower electrode.

2. A method of manufacturing a semiconductor device, comprising the steps of:

creating a separate first opening and a separate third opening completely through an insulating film using a same process;

creating a second opening in said insulating film communicating with said first opening but not said third opening, said second opening being wider than said first opening and having a bottom in said insulating film; and depositing a first metal film, a dielectric film, and a second metal film, to be stacked in this order above said first opening with said first metal film being deposited so as to extend into the first and the third opening so as to form contact plugs to an area exposed by the first and third openings, wherein said second metal film is operative to serve as an upper electrode, and at least said first metal film in said second opening is operative to serve as a lower electrode.

* * * * *